(12) United States Patent
Kimura

(10) Patent No.: US 10,938,374 B2
(45) Date of Patent: Mar. 2, 2021

(54) MULTIPLEXER, RADIO-FREQUENCY FRONT END CIRCUIT, AND COMMUNICATION DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/449,496

(22) Filed: Jun. 24, 2019

(65) Prior Publication Data
US 2019/0312564 A1    Oct. 10, 2019

Related U.S. Application Data

(63) Continuation of application No. PCT/JP2017/037210, filed on Oct. 13, 2017.

(30) Foreign Application Priority Data

Dec. 27, 2016 (JP) .............................. JP2016-253117

(51) Int. Cl.
*H03H 9/05* (2006.01)
*H03H 9/72* (2006.01)
(Continued)

(52) U.S. Cl.
CPC .......... *H03H 9/0576* (2013.01); *H03H 9/145* (2013.01); *H03H 9/25* (2013.01);
(Continued)

(58) Field of Classification Search
CPC ........ H03H 9/0576; H03H 9/145; H03H 9/25; H03H 9/6413; H03H 9/6483; H03H 9/72;
(Continued)

(56) References Cited

U.S. PATENT DOCUMENTS

2005/0077982 A1* 4/2005 Funasaka ........... H03H 9/02574
333/195
2013/0049889 A1   2/2013 Shimizu
(Continued)

FOREIGN PATENT DOCUMENTS

JP    2013-046107 A    3/2013
JP    2015-012324 A    1/2015
(Continued)

OTHER PUBLICATIONS

Official Communication issued in International Patent Application No. PCT/JP2017/037210, dated Dec. 26, 2017.
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A multiplexer includes a common terminal, a first band pass filter that is connected to the common terminal and has a first pass band, and a second band pass filter that is connected to the common terminal and has a second pass band located at higher frequencies than the first pass band. The first band pass filter includes an acoustic wave device that includes a support substrate, a piezoelectric body stacked on the support substrate, and an IDT electrode provided on the piezoelectric body. The piezoelectric body is made of lithium niobate. The acoustic wave device utilizes Rayleigh waves.

21 Claims, 63 Drawing Sheets

(51) Int. Cl.
*H03H 9/02* (2006.01)
*H03H 9/25* (2006.01)
*H03H 9/64* (2006.01)
*H03H 9/145* (2006.01)

(52) U.S. Cl.
CPC ........ *H03H 9/6413* (2013.01); *H03H 9/6483* (2013.01); *H03H 9/72* (2013.01)

(58) Field of Classification Search
CPC .............. H03H 9/725; H03H 9/02574; H03H 9/02559; H03H 3/08; H03H 9/14517
USPC .......................................... 333/133, 193–196
See application file for complete search history.

(56) References Cited

U.S. PATENT DOCUMENTS

| | | |
|---|---|---|
| 2013/0285768 A1 | 10/2013 | Watanabe et al. |
| 2015/0028720 A1 | 1/2015 | Kando |
| 2015/0028966 A1* | 1/2015 | Iwamoto ................ H03H 9/725 333/133 |
| 2017/0005638 A1 | 1/2017 | Otagawa et al. |
| 2017/0294897 A1 | 10/2017 | Kanazawa et al. |

FOREIGN PATENT DOCUMENTS

| | | |
|---|---|---|
| JP | 2015-115870 A | 6/2015 |
| WO | 2012/086639 A1 | 6/2012 |
| WO | 2013/141168 A1 | 9/2013 |
| WO | 2015/156232 A1 | 10/2015 |
| WO | 2016/111262 A1 | 7/2016 |

OTHER PUBLICATIONS

Official Communication issued in corresponding Korean Patent Application No. 10-2019-7015695, dated Aug. 27, 2020.

\* cited by examiner

MULTIPLEXER, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2016-253117 filed on Dec. 27, 2016 and is a Continuation Application of PCT Application No. PCT/JP2017/037210 filed on Oct. 13, 2017. The entire contents of each application are hereby incorporated herein by reference.

BACKGROUND OF THE INVENTION

1. Field of the Invention

The present invention relates to a multiplexer in which a plurality of band pass filters are connected to an antenna terminal, and to a radio-frequency front end circuit and a communication device that include the multiplexer.

2. Description of the Related Art

International Publication No. 2012/086639 and International Publication No. 2013/141168 disclose acoustic wave devices that are used as resonators and band pass filters.

In the acoustic wave devices disclosed in International Publication No. 2012/086639 and International Publication No. 2013/141168, a low-acoustic-velocity film, a piezoelectric film, and an IDT electrode are stacked in this order on a high-acoustic-velocity support substrate. The high-acoustic-velocity support substrate is composed of a high-acoustic-velocity material in which the acoustic velocity of a bulk wave propagating therein is higher than the acoustic velocity of an acoustic wave propagating along the piezoelectric film. The low-acoustic-velocity film is composed of a low-acoustic-velocity material in which the acoustic velocity of a bulk wave propagating therein is lower than the acoustic velocity of an acoustic wave propagating along the piezoelectric film. In the acoustic wave device disclosed in International Publication No. 2013/141168, the piezoelectric film is a lithium niobate film ($LiNbO_3$ film) and shear horizontal (SH) waves are used as a main mode.

However, in acoustic wave devices such as those disclosed in International Publication No. 2012/086639 and International Publication No. 2013/141168, large spurious responses may be generated due to a high order mode or bulk radiation at a higher frequency than the frequency of the main mode. Therefore, in the case where the acoustic wave devices disclosed in International Publication No. 2012/086639 and International Publication No. 2013/141168 are used in a multiplexer of a communication system in which a plurality of frequency bands are used, such as in carrier aggregation, the filter characteristics may be adversely affected. For example, in the case where such an acoustic wave device is used in a multiplexer in which two band pass filters are connected so as to form a common connection, spurious responses generated by one band pass filter having the lower frequency band might be located inside the pass band of the other band pass filter having the higher frequency band. In this case, the filter characteristics of the other band pass filter would be degraded.

SUMMARY OF THE INVENTION

Preferred embodiments of the present invention provide multiplexers in each of which the filter characteristics of a band pass filter having a higher frequency band are unlikely to be degraded by the effect of a band pass filter having a lower frequency band, and provide radio-frequency front end circuits and communication devices in which the multiplexer is included.

A multiplexer according to a preferred embodiment of the present invention includes a common terminal, a first band pass filter that is connected to the common terminal and has a first pass band, and a second band pass filter that is connected to the common terminal and has a second pass band located at higher frequencies than the first pass band. The first band pass filter includes an acoustic wave device that includes a support substrate, a piezoelectric body stacked on the support substrate, and an interdigital transducer (IDT) electrode provided on the piezoelectric body. The piezoelectric body is made of lithium niobate. The acoustic wave device utilizes Rayleigh waves.

In a multiplexer according to a preferred embodiment of the present invention, Euler angles ($\varphi$, $\theta$, $\psi$) of the piezoelectric body lie within a range of (0°±5°, $\theta$, 0°±10°), and the Euler angle $\theta$ lies in a range from about 30° to about 38°. In this case, spurious responses which are at a frequency lower than the resonant frequency of the main mode are able to be further reduced or prevented.

In a multiplexer according to a preferred embodiment of the present invention, a film thickness of the piezoelectric body lies within a range from about 0.1λ to about 1.0λ, where λ is a wavelength determined by an electrode finger pitch of the IDT electrode.

In a multiplexer according to a preferred embodiment of the present invention, the multiplexer further includes a low-acoustic-velocity material layer that is provided between the support substrate and the piezoelectric body and is made of a low-acoustic-velocity material in which an acoustic velocity of a bulk wave propagating therein is lower than an acoustic velocity of an acoustic wave propagating along the piezoelectric body. In this case, since leaking of energy to the support substrate is able to be reduced or prevented, an acoustic wave is able to be effectively confined inside the piezoelectric body.

In a multiplexer according to a preferred embodiment of the present invention, an acoustic velocity of a bulk wave propagating in the support substrate is higher than an acoustic velocity of an acoustic wave propagating along the piezoelectric body. In this case, since leaking of energy to the support substrate is able to be reduced or prevented, an acoustic wave is able to be effectively confined inside the piezoelectric body.

In a multiplexer according to a preferred embodiment of the present invention, the multiplexer further includes a high-acoustic-velocity material layer that is provided between the support substrate and the low-acoustic-velocity material layer and is made of a high-acoustic-velocity material in which an acoustic velocity of a bulk wave propagating therein is higher than an acoustic velocity of an acoustic wave propagating along the piezoelectric body. In this case, since leaking of energy to the support substrate is able to be reduced or prevented, an acoustic wave is able to be effectively confined inside the piezoelectric body.

In a multiplexer according to a preferred embodiment of the present invention, the IDT electrode is made of at least one selected from a group consisting of Pt, Al, Cu, Mo, and Au and alloys containing any of these metals. In this case, an increase in the resistance of the IDT electrode is able to be maximally reduced or prevented, and therefore the filter characteristics of a band pass filter having a higher frequency band are even less likely to be degraded.

In a multiplexer according to a preferred embodiment of the present invention, the support substrate is made of aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, diamond, or a material having any one of these materials as a main component.

In a multiplexer according to a preferred embodiment of the present invention, a thickness of the IDT electrode is greater than or equal to about 0.02λ, where λ is a wavelength determined by an electrode finger pitch of the IDT electrode. In this case, the effect of loss caused by the resistance of the IDT electrode is able to be reduced, and therefore, the filter characteristics of a band pass filter having a higher frequency band are even less likely to be degraded.

In a multiplexer according to a preferred embodiment of the present invention, the thickness of the IDT electrode is less than or equal to about 0.1λ, where λ is a wavelength determined by an electrode finger pitch of the IDT electrode.

The multiplexers according to preferred embodiments of the present invention may each be used in carrier aggregation.

A radio-frequency front end circuit according to a preferred embodiment of the present invention includes a multiplexer according to a preferred embodiment of the present invention and a power amplifier.

A communication device according to a preferred embodiment the present invention includes a radio-frequency front end circuit according to a preferred embodiment of the present invention and an RF signal processing circuit.

According to preferred embodiments of the present invention, multiplexer are provided in each of which the filter characteristics of a band pass filter having a higher frequency band are unlikely to be degraded due to the effect of a band pass filter having a lower frequency band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiment of the present invention will be described in detail below with reference to the drawings.

The preferred embodiments described in the present specification are illustrative examples and portions of the configurations illustrated in different preferred embodiments may be substituted for one another or combined with one another.

First Preferred Embodiment

Figure 1:
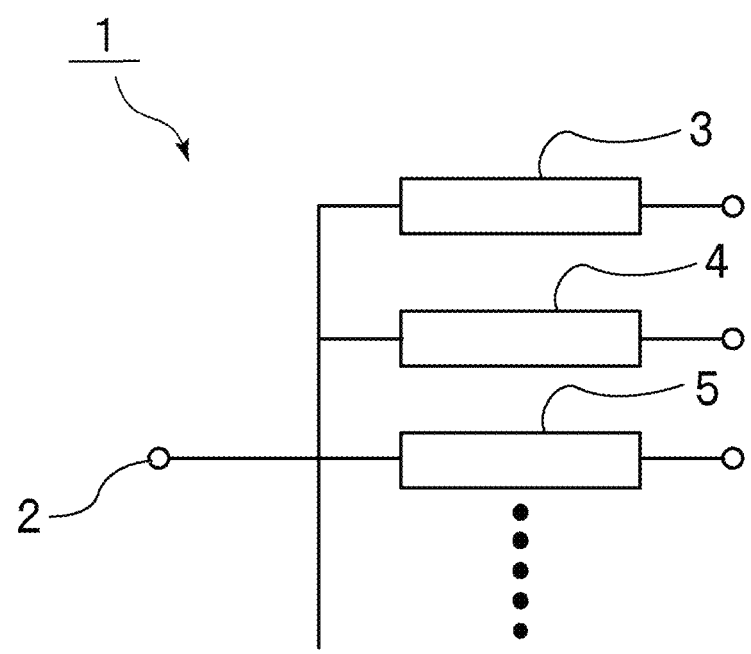
FIG. 1 is a circuit diagram that describes a multiplexer according to a first preferred embodiment of the present invention.
Figure 2A:
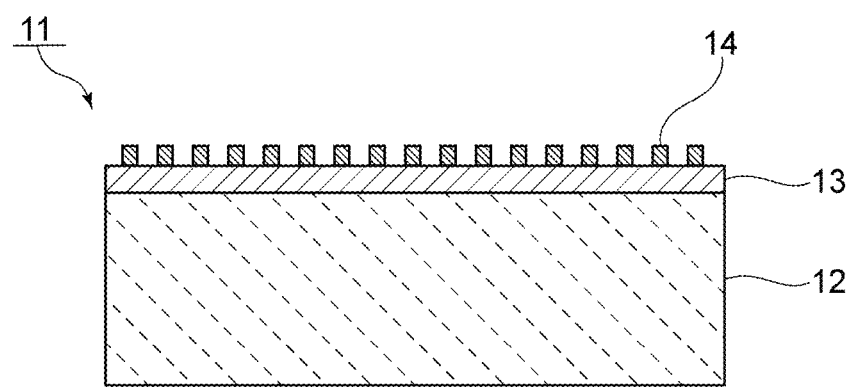
FIG. 2A is a schematic sectional view of an acoustic wave device defining a first band pass filter of the multiplexer according to the first preferred embodiment of the present invention and FIG. 2B is a schematic plan view illustrating the electrode structure thereof.
Figure 2B:
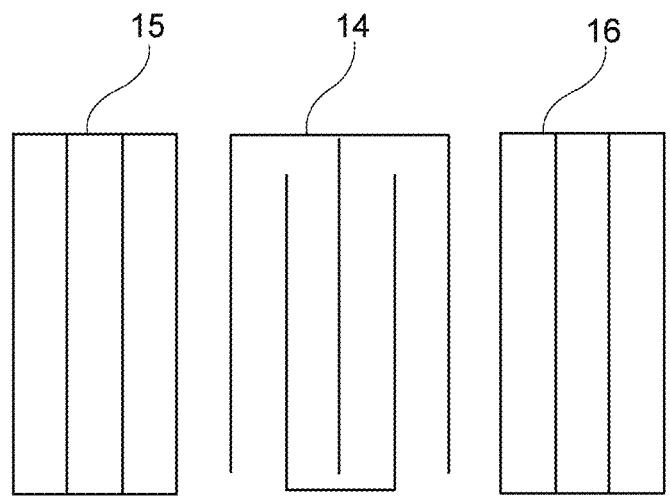

FIG. 1 is a circuit diagram that describes a multiplexer according to a first preferred embodiment of the present invention. FIG. 2A is a schematic sectional view of an acoustic wave device defining a first band pass filter of the multiplexer according to the first preferred embodiment of the present invention. In addition, FIG. 2B is a schematic plan view illustrating the electrode structure of the acoustic wave device in FIG. 2A.

A multiplexer 1 includes a common terminal 2. First ends of first to third band pass filters 3 to 5 are connected to the common terminal 2 to define a common connection. This multiplexer 1 is preferably connected in a shared manner to an antenna terminal in an RF stage or the like of a mobile phone device.

The pass band of the first band pass filter 3, the pass band of the second band pass filter 4, and the pass band of the third band pass filter 5 are different frequency bands. The pass band of the first band pass filter 3 will be referred to as a pass band A. The pass band of the second band pass filter 4 will be referred to as a pass band B. The pass band B is located in a higher frequency band than the pass band A.

In the multiplexer 1, the first band pass filter 3 is preferably defined by an acoustic wave device 11 as illustrated in FIG. 2A. The circuit configuration of the first band pass filter 3 is not particularly limited. For example, the configuration of a ladder filter, a longitudinally coupled resonator acoustic wave filter, a lattice filter, or a transversal filter including a plurality of acoustic wave devices 11 may be used. Specifically, acoustic wave devices having the structure of the acoustic wave device 11 may be used for the series arm resonators and parallel arm resonators of a ladder filter.

As illustrated in FIG. 2A, the acoustic wave device 11 preferably includes a support substrate 12, a piezoelectric body 13, and an IDT electrode 14. The piezoelectric body 13 is stacked on the support substrate 12. The IDT electrode 14 is stacked on the piezoelectric body 13. The piezoelectric body 13 is preferably made of lithium niobate, for example. Specifically, in the present preferred embodiment, the piezoelectric body 13 is preferably a LiNbO$_3$ film, for example. The thickness of the piezoelectric body 13 is not particularly limited, but preferably lies within a range from about 0.1λ to about 1.0λ, for example. λ is a wavelength determined by the electrode finger pitch of the IDT electrode 14.

The support substrate 12 may be made from an appropriate material as long as a multilayer structure including the piezoelectric body 13 and the IDT electrode 14 is able to be supported. A piezoelectric material such as, for example, aluminum nitride, aluminum oxide, silicon carbide, silicon nitride, silicon, sapphire, lithium tantalate, lithium niobate, and quartz, various ceramics such as alumina, zirconia, cordierite, mullite, steatite, and forsterite, and magnesia, diamond, or a material having any of these materials as a main component may preferably be used as the material of the support substrate 12, for example. In the present preferred embodiment, the support substrate 12 is preferably made of silicon, for example.

In the acoustic wave device 11, Rayleigh waves, which are acoustic waves that propagate along the piezoelectric body 13, are utilized as a main mode. A buffer layer may be provided between the support substrate 12 and the piezoelectric body 13. Aluminum nitride, silicon nitride, silicon oxide, titanium oxide, or aluminum oxide, for example, may preferably be used as the buffer layer.

The Euler angles (φ, θ, ψ) of the piezoelectric body 13 are not particularly limited, but the Euler angles (φ, θ, ψ) preferably lie within a range of (0°±5°, θ, 0°±10°), for example. Furthermore, the Euler angle θ preferably lies within a range from about 30° to about 38°, for example. In this case, spurious responses at a lower frequency than the resonant frequency of the main mode are able to be further reduced or prevented in the acoustic wave device 11.

The material of the IDT electrode 14 is not particularly limited and may preferably be Pt, Al, Cu, Mo, Au, Ag, Ta, W, Ni, Ru, Pd, Cr, Zn, or Ti, or an alloy of any of these metals, for example. Among these materials, the material of the IDT electrode 14 is more preferably at least one material selected from a group consisting of Pt, Al, Cu, Mo, and Au and alloys containing these metals, for example. In this case, an increase in the resistance of the IDT electrode 14 is able to be maximally reduced or prevented, and therefore the filter characteristics of the band pass filter having the higher frequency band as described above are even less likely to be degraded.

The IDT electrode 14 may be a single layer metal film or may be a multilayer metal film including two or more metal films that are stacked on top of one another. Examples of such a multilayer metal film include a multilayer metal film in which a Pt film is stacked on Al film and a multilayer metal film in which an Al film is stacked on a Pt film. In addition, Ti, NiCr, Ag, Cr or the like may be used as a buffer layer between the individual electrode materials and as a buffer layer between the individual electrode materials and the piezoelectric body 13.

The thickness of the IDT electrode 14 is not particularly limited, but is preferably greater than or equal to about 0.02λ, for example. When the thickness of the IDT electrode 14 lies within that range, the effect of loss caused by the resistance of the IDT electrode 14 is able to be reduced, and therefore, the filter characteristics of the band pass filter having the higher frequency band as described above are even less likely to be degraded. The upper limit of the thickness of the IDT electrode 14 is not particularly limited and may preferably be about 0.1λ, for example. λ is a wavelength determined by the electrode finger pitch of the IDT electrode 14.

Although depicted in a schematic manner in FIG. 2A, more specifically, the electrode structure illustrated in FIG. 2B is defined on the piezoelectric body 13. In other words, the IDT electrode 14 and reflectors 15 and 16, which are arranged at both sides of the IDT electrode 14 in an acoustic wave propagation direction of the IDT electrode 14, are provided. Thus, a one-port surface acoustic wave resonator is defined. Additionally, the reflectors 15 and 16 do not have to be used.

As illustrated in FIG. 2B, the IDT electrode 14 preferably includes first and second busbars and a plurality of first electrode fingers and a plurality of second electrode fingers. The plurality of first electrode fingers and the plurality of second electrode fingers are interdigitated with each other. Furthermore, the plurality of first electrode fingers are connected to the first busbar and the plurality of second electrode fingers are connected to the second busbar.

In addition, although not illustrated in FIG. 2A, a dielectric film, such as an oxide film or a nitride film, for example, may be provided so as to cover a portion of or the entirety of the IDT electrode 14. The frequency-temperature characteristics and moisture resistance are able to be improved and the IDT electrode 14 is able to be protected by providing such a dielectric film. For example, the frequency-temperature characteristics are able to be improved by using a SiO$_2$ film as the dielectric film.

As a result of the acoustic wave device 11 having the above-described configuration, spurious responses generated at a higher frequency than the frequency of the main mode as described above are able to be reduced or prevented.

In the multiplexer 1, the first band pass filter 3 is defined using the acoustic wave device 11. Therefore, the characteristics of the second band pass filter 4 having the pass band B that is located in a higher frequency band than the pass band A of the first band pass filter 3 are unlikely to be degraded. This point will be described in more detail while referring to FIGS. 3 and 4.

Figure 3:
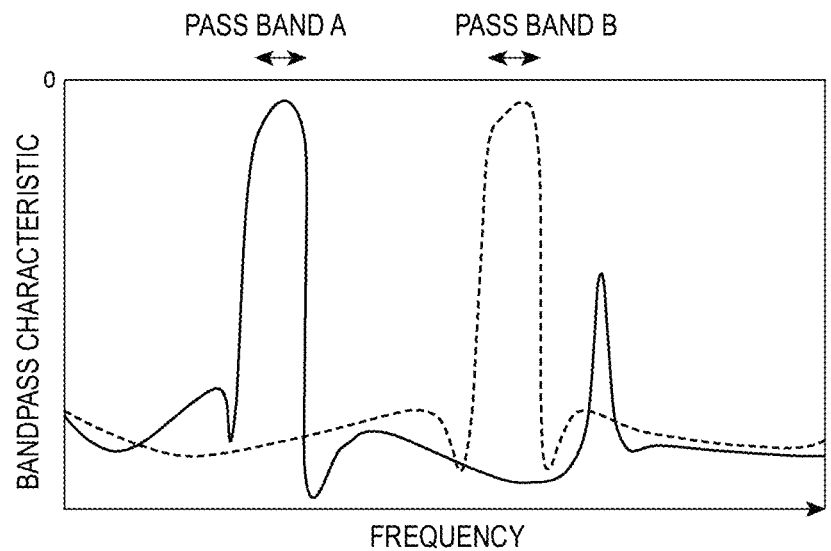
FIG. 3 is a diagram illustrating the bandpass characteristics of the first band pass filter and the bandpass characteristics of a second band pass filter.
Figure 4:
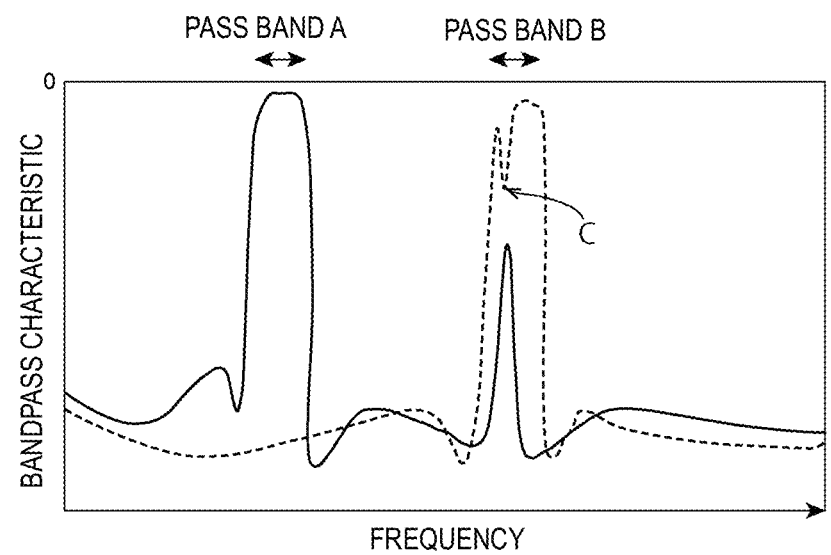
FIG. 4 is a diagram illustrating the bandpass characteristics of a first band pass filter and the bandpass characteristics of a second band pass filter in a comparative example.

FIG. 3 is a diagram illustrating the bandpass characteristics of the first band pass filter and the bandpass characteristics of the second band pass filter. In addition, FIG. 4 is a diagram illustrating the bandpass characteristics of a first band pass filter and the bandpass characteristics of a second band pass filter in a comparative example. In FIGS. 3 and 4, a solid line illustrates the bandpass characteristics of the first band pass filter and a dashed line illustrates the bandpass characteristics of the second band pass filter. In FIG. 3, the first band pass filter 3 is defined using the acoustic wave device 11. Here, the first band pass filter 3 is a ladder filter and acoustic wave devices having the same structure as the acoustic wave device 11 are preferably used as the series arm resonators and parallel arm resonators of the ladder filter. Acoustic wave devices that are the same as the acoustic wave device 11 other than the fact that SH waves rather than Rayleigh waves are used as the main mode are used in the comparative example in FIG. 4.

As is clear from FIG. 4, in the comparative example, a large spurious response indicated by an arrow C appears inside the pass band B in the bandpass characteristics of the second band pass filter. In other words, insertion loss is greatly degraded inside the pass band B. This degradation is caused by the high-frequency-side spurious response of the acoustic wave devices used in the first band pass filter.

In contrast, in the bandpass characteristics of the second band pass filter 4 in FIG. 3, the above-described spurious response inside the pass band B is reduced or prevented. This is because the high-frequency-side spurious response of the acoustic wave device 11 used in the first band pass filter 3 is reduced or prevented.

Therefore, in the multiplexer 1, the characteristics of the second band pass filter 4 having the pass band B that is located in a higher frequency band than the first band pass filter 3 are unlikely to be degraded. Therefore, the multiplexer 1 may be suitably used in an application, such as carrier aggregation.

Next, reduction or prevention of a spurious response at a higher frequency than the resonant frequency of the main mode in the acoustic wave device 11 will be described while referring to FIGS. 5A and 5B to 9A and 9B and FIGS. 11A and 11B to 15A and 15B.

First, for the structure illustrated in FIG. 2A, the following acoustic wave resonator was designed:
support substrate 12 . . . Si substrate
piezoelectric body 13 . . . LiNbO$_3$ film, Euler angles (0°, 34°, 0°)
IDT electrode 14 . . . duty ratio: about 0.50, number of electrode fingers of IDT electrode 14: 201 (100 pairs), electrode finger crossing width: about 15λ, number of electrode fingers of reflectors 15 and 16: 21 (10 pairs)
materials of IDT electrode 14 . . . Pt film (thickness: about 0.1λ), Al film (thickness: about 0.04λ), Cu film (thickness: about 0.06λ), Mo film (thickness: about 0.1λ), Au film (thickness: about 0.1λ)
utilized acoustic waves . . . Rayleigh waves
λ is a wavelength determined by the electrode finger pitch of the IDT electrode 14 and λ=about 1.0 μm.

The phase characteristics and impedance characteristics of the thus-designed acoustic wave resonator are illustrated in FIGS. 5A and 5B to 9A and 9B.

FIGS. 5A to 9A are diagrams illustrating the phase characteristics and FIGS. 5B to 9B are diagrams illustrating the impedance characteristic. In FIGS. 5A and 5B to 9A and 9B, the IDT electrode 14 is respectively made of, in this order, a Pt film (Pt film thickness: about 0.1λ, LiNbO$_3$ film thickness: about 1.0λ, main mode resonant frequency (Fr): about 2.56 GHz, band width ratio: about 5.7%), an Al film (Al film thickness: about 0.04λ, LiNbO$_3$ film thickness: about 0.6λ, main mode resonant frequency (Fr): about 3.855 GHz, band width ratio: about 3.2%), a Cu film (Cu film thickness: about 0.06λ, LiNbO$_3$ film thickness: about 0.2λ, main mode resonant frequency (Fr): about 3.5 GHz, band width ratio: about 3.6%), a Mo film (Mo film thickness: about 0.1λ, LiNbO$_3$ film thickness: about 0.2λ, main mode resonant frequency (Fr): about 3.13 GHz, band width ratio: about 4.8%), and an Au film (Au film thickness: about 0.1λ, LiNbO$_3$ film thickness: about 0.2λ, main mode resonant frequency (Fr): about 2.48 GHz, band width ratio: about 4.2%). The type of IDT electrode 14 used is indicated at the top right in FIGS. 5A and 5B to 9A and 9B. In addition, in FIGS. 5A and 5B to 9A and 9B, the dashed line indicates a frequency that is about 1.5 times Fr (1.5 Fr), the one-dot chain line indicates a frequency that is about two times Fr (2.0 Fr), and the two-dot chain line indicates a frequency that is about 2.5 times Fr (2.5 Fr).

Figure 5A:
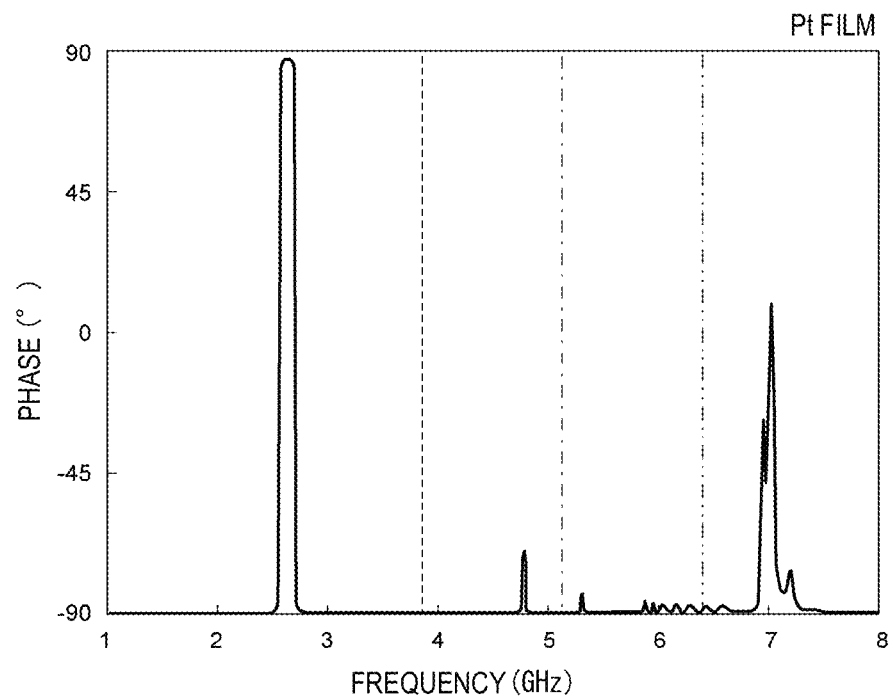
FIG. 5A is a diagram illustrating the phase characteristics when the IDT electrode is made of a Pt film and FIG. 5B is a diagram illustrating the impedance characteristics in that case.
Figure 5B:
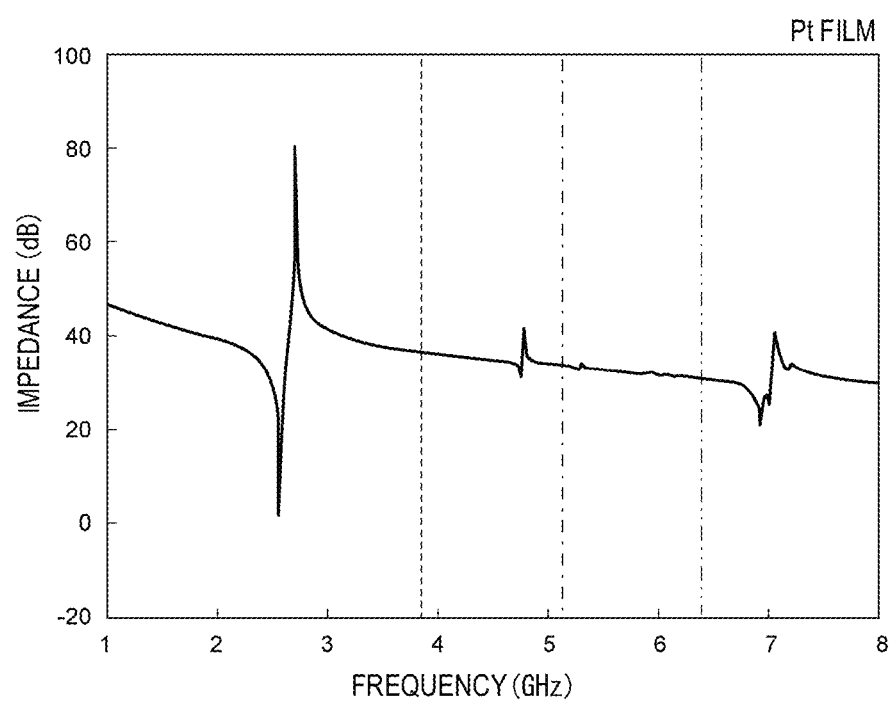
Figure 6A:
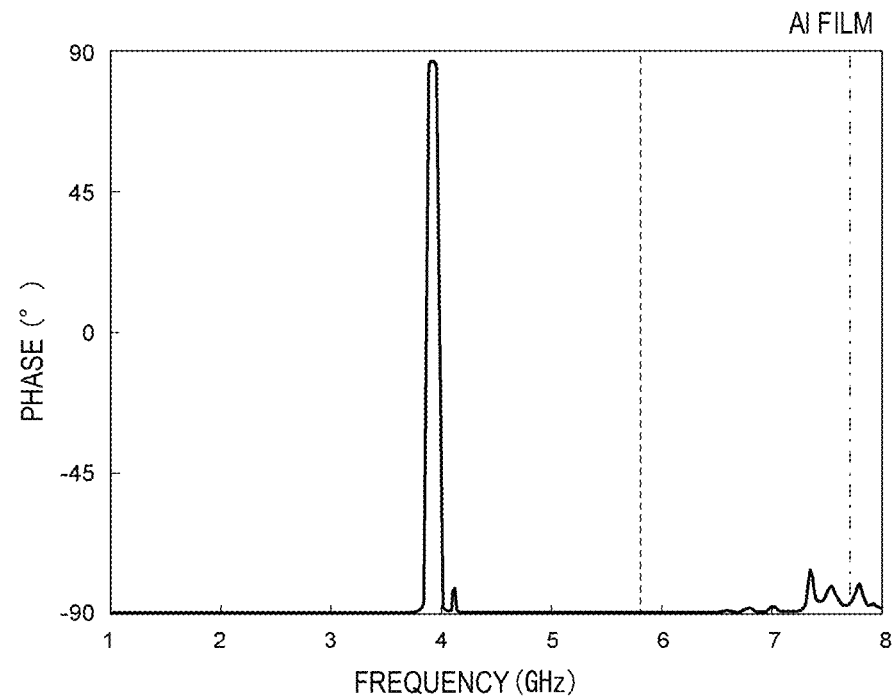
FIG. 6A is a diagram illustrating the phase characteristics when the IDT electrode is made of an Al film and FIG. 6B is a diagram illustrating the impedance characteristics in that case.
Figure 6B:
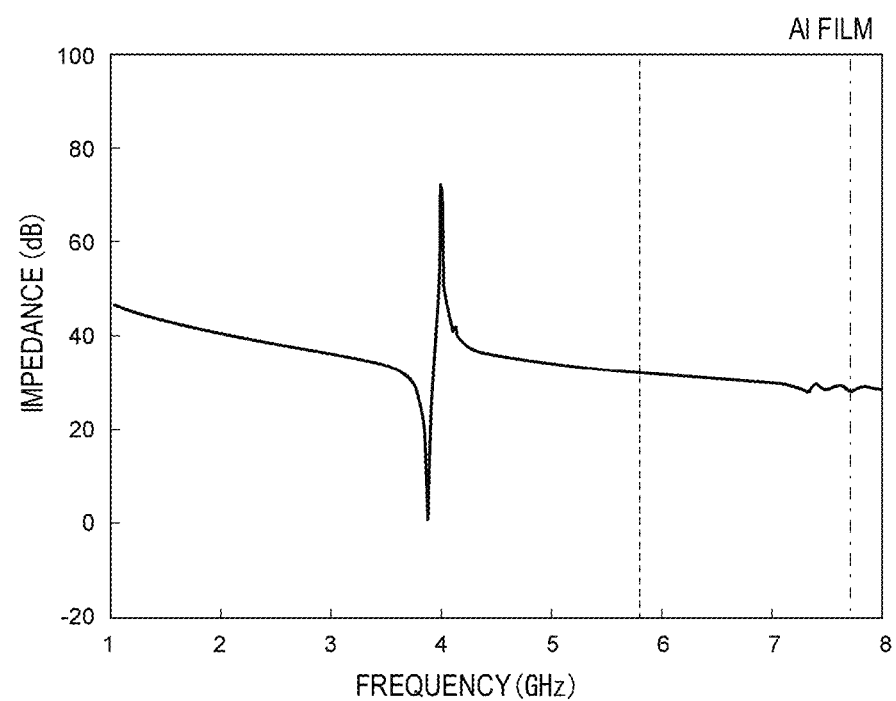
Figure 7A:
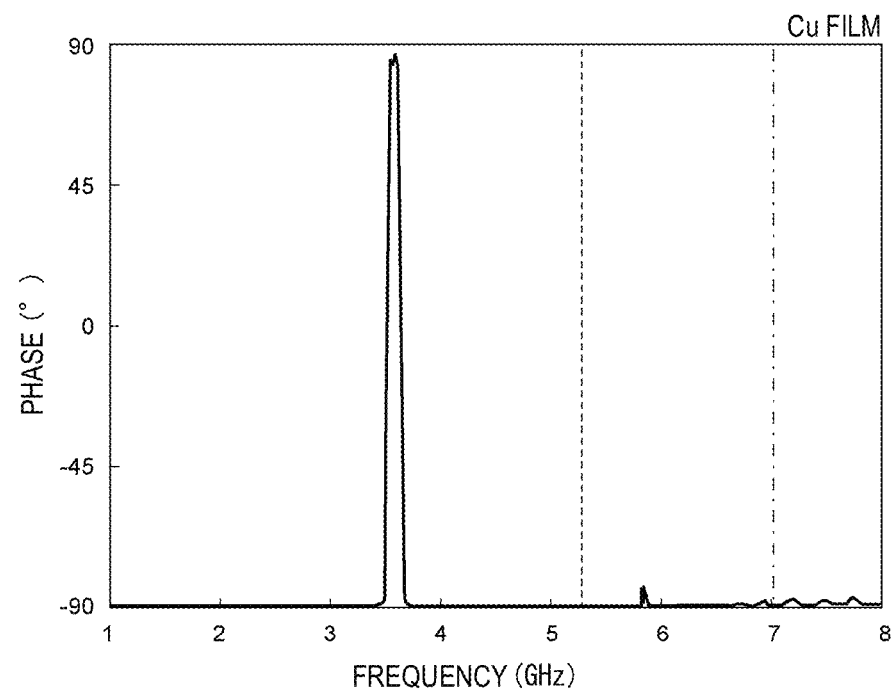
FIG. 7A is a diagram illustrating the phase characteristics when the IDT electrode is made of a Cu film and FIG. 7B is a diagram illustrating the impedance characteristics in that case.
Figure 7B:
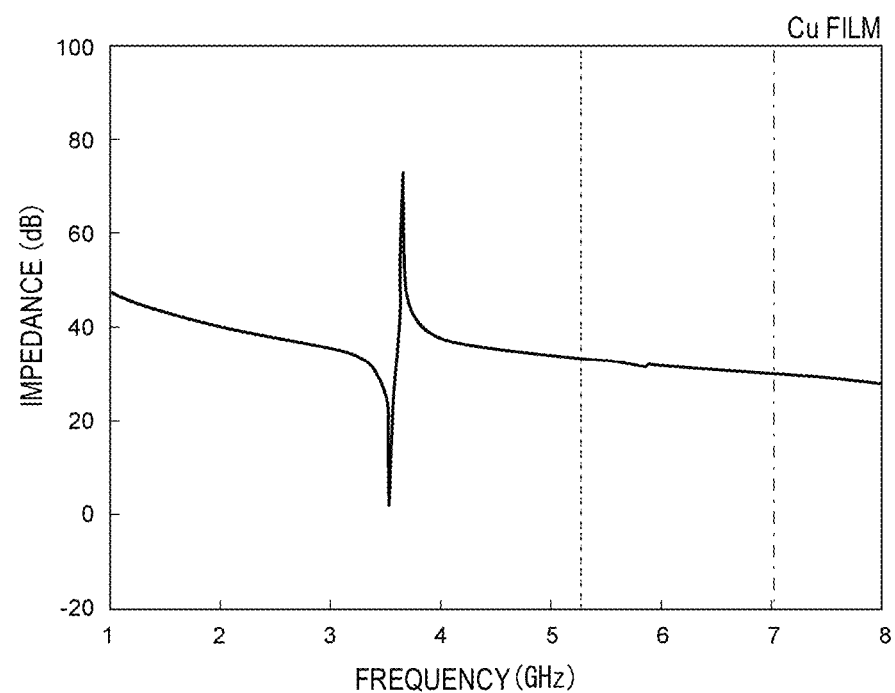
Figure 8A:
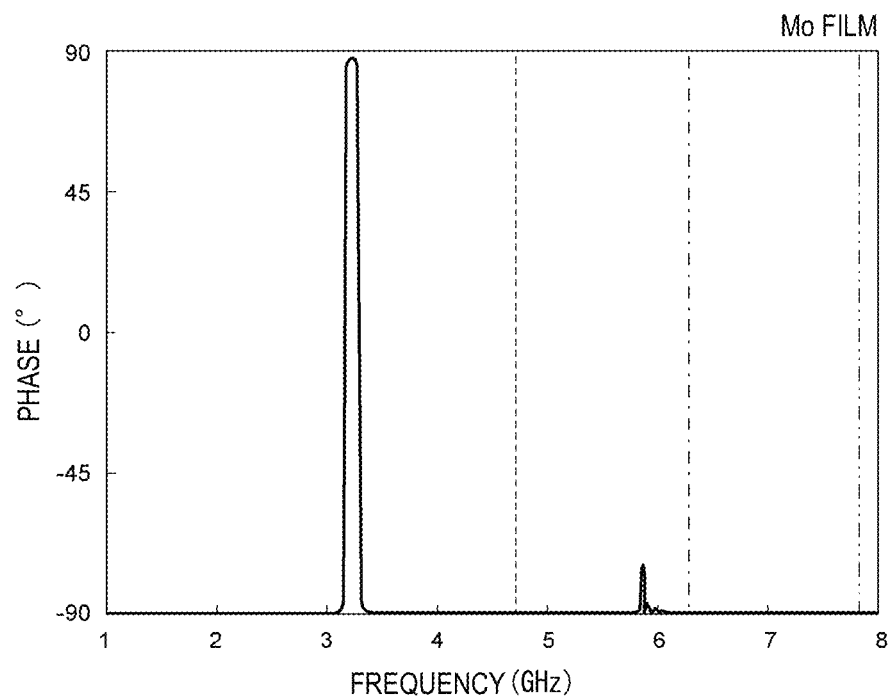
FIG. 8A is a diagram illustrating the phase characteristics when the IDT electrode is made of a Mo film and FIG. 8B is a diagram illustrating the impedance characteristics in that case.
Figure 8B:
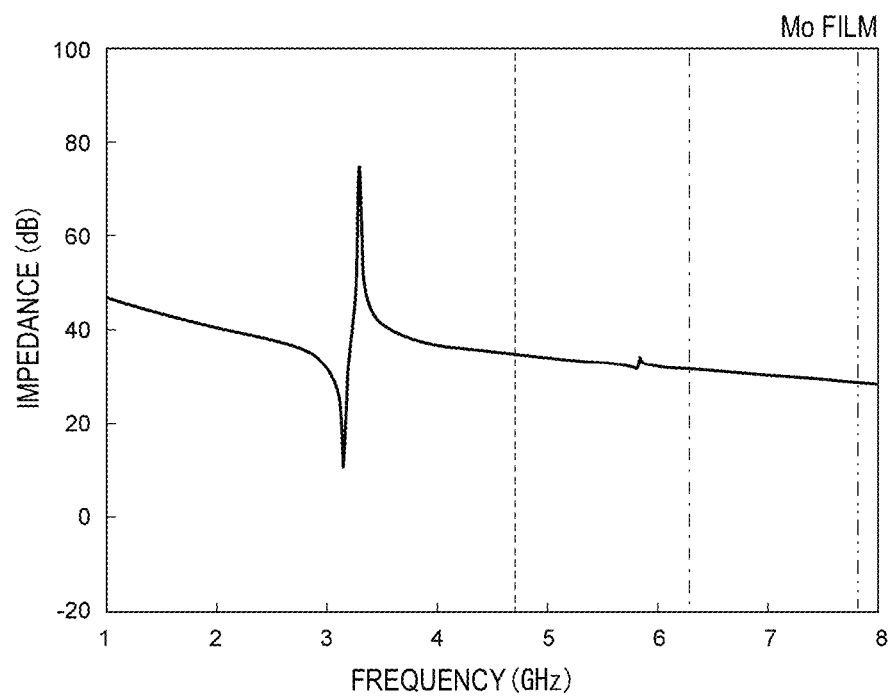
Figure 9A:
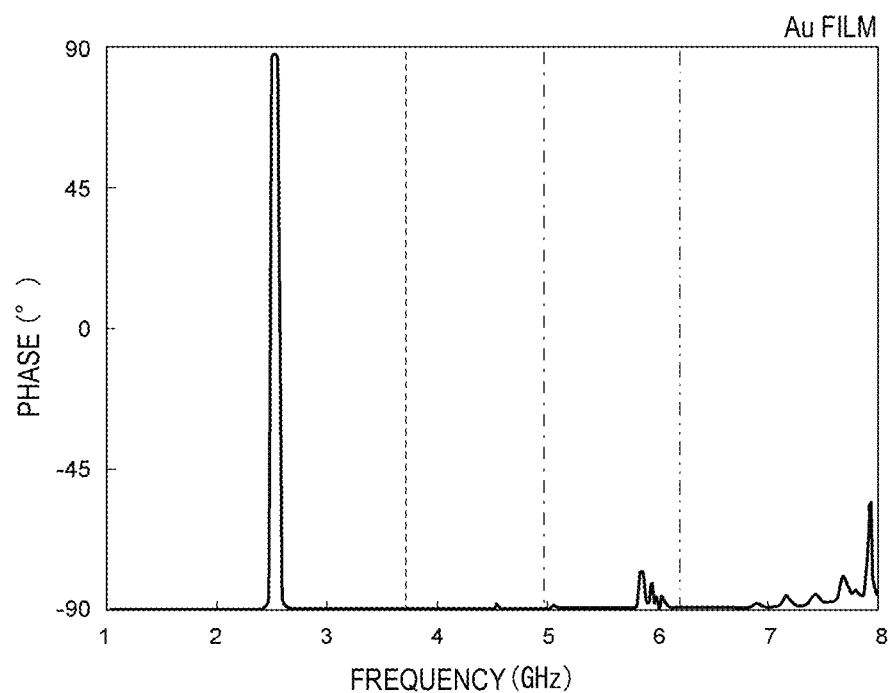
FIG. 9A characteristics is a diagram illustrating the phase characteristics when the IDT electrode is made of an Au film and FIG. 9B is a diagram illustrating the impedance characteristics in that case.
Figure 9B:
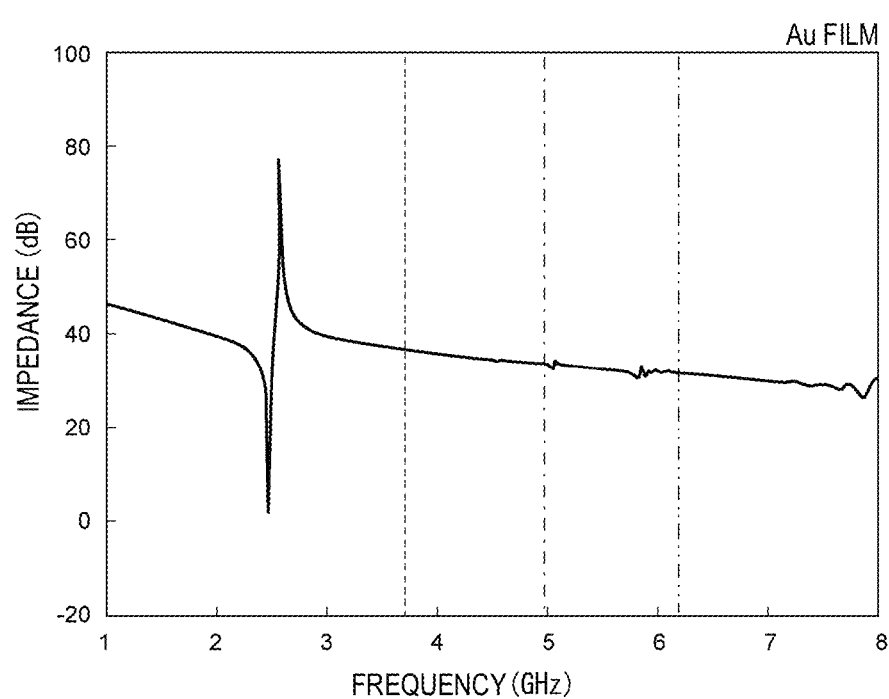

As illustrated in FIGS. 5A and 5B, in the case where the IDT electrode 14 is made of a Pt film, there is no significant spurious generated in the range from Fr to 1.5 Fr. On the other hand, spurious with a maximum phase angle of about −70° is generated in the vicinity of about 4.78 GHz (1.8 Fr) in the range from Fr to 2.0 Fr, but since this spurious is very small, the resulting effect can be ignored. Furthermore, spurious with a maximum phase angle of about 9° is generated in the vicinity of about 7.03 GHz (2.75 Fr), but since this spurious is located at a position sufficiently isolated from the response of the main mode, this spurious will not affect the other band pass filter.

Furthermore, as illustrated in FIGS. 6A and 6B to 9A and 9B, similarly, spurious is sufficiently reduced or prevented or is sufficiently isolated from the response of the main mode in the cases where the IDT electrode 14 is made of the other metal films.

As is clear from the results in FIGS. 5A and 5B to 9A and 9B, in the thus-designed acoustic wave resonator, it is clear that spurious responses generated at a higher frequency than the frequency of the main mode is reduced or prevented or is sufficiently isolated from the frequency of the main mode regardless of the material of the IDT electrode 14.

Figure 10A:
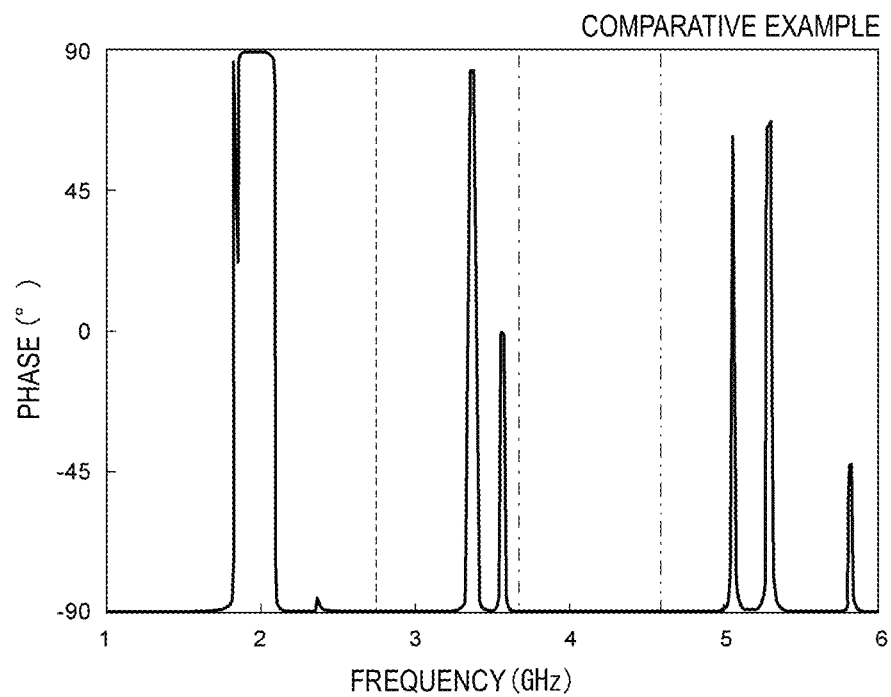
FIG. 10A is a diagram illustrating the phase characteristics in a comparative example and FIG. 10B is a diagram illustrating the impedance characteristics in that case.
Figure 10B:
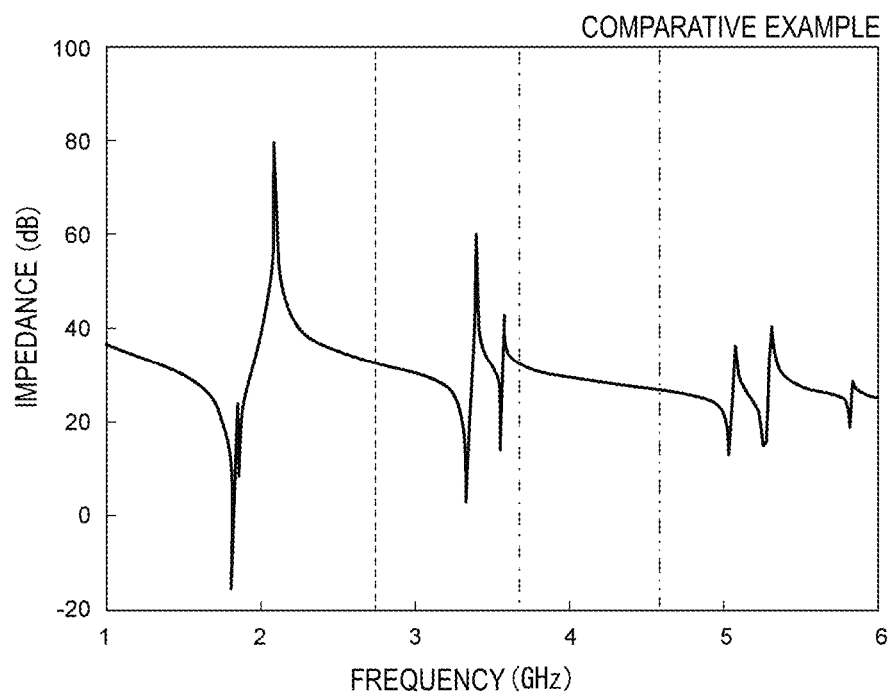
Figure 11A:
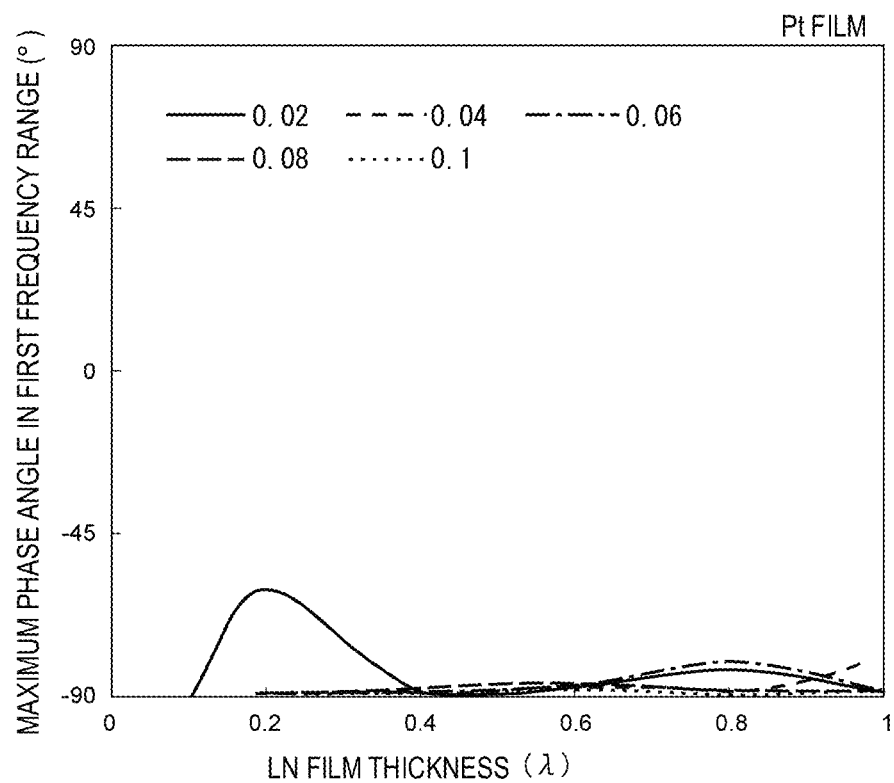
FIG. 11A is a diagram illustrating the phase characteristics in a first frequency range when the IDT electrode is made of a Pt film and FIG. 11B is a diagram illustrating the phase characteristics in a second frequency range in that case.
Figure 11B:
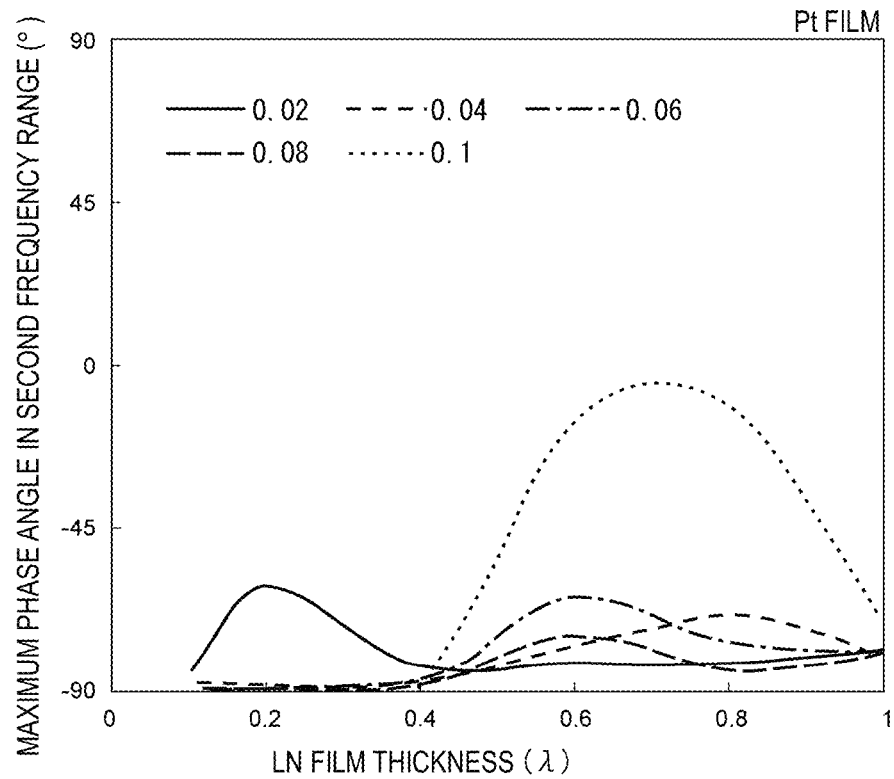
Figure 12A:
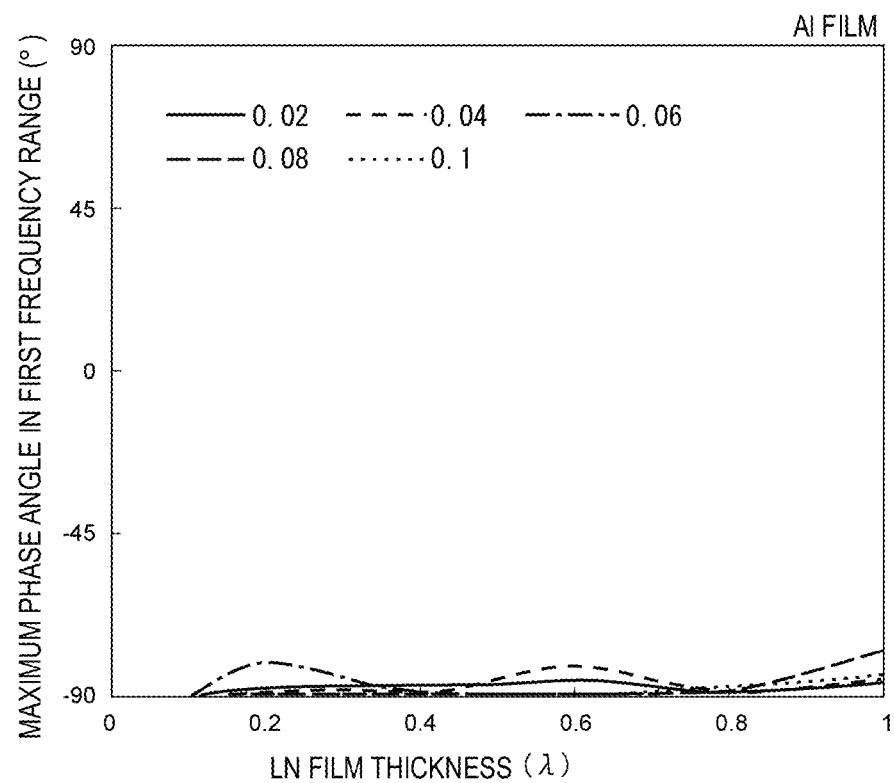
FIG. 12A is a diagram illustrating the phase characteristics in the first frequency range when the IDT electrode is made of an Al film and FIG. 12B is a diagram illustrating the phase characteristics in the second frequency range in that case.
Figure 12B:
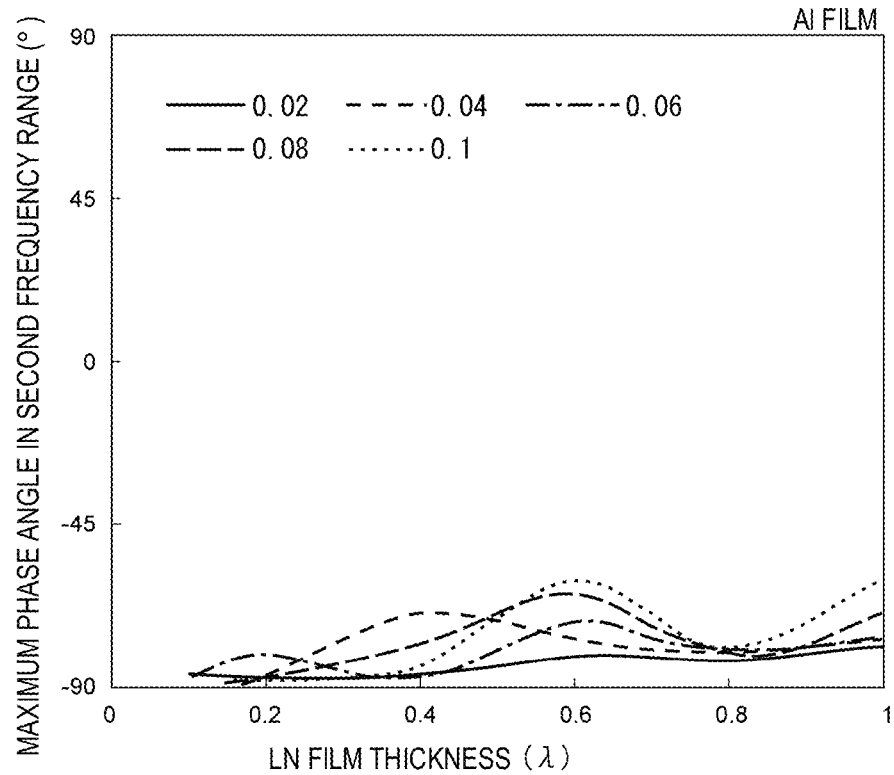
Figure 13A:
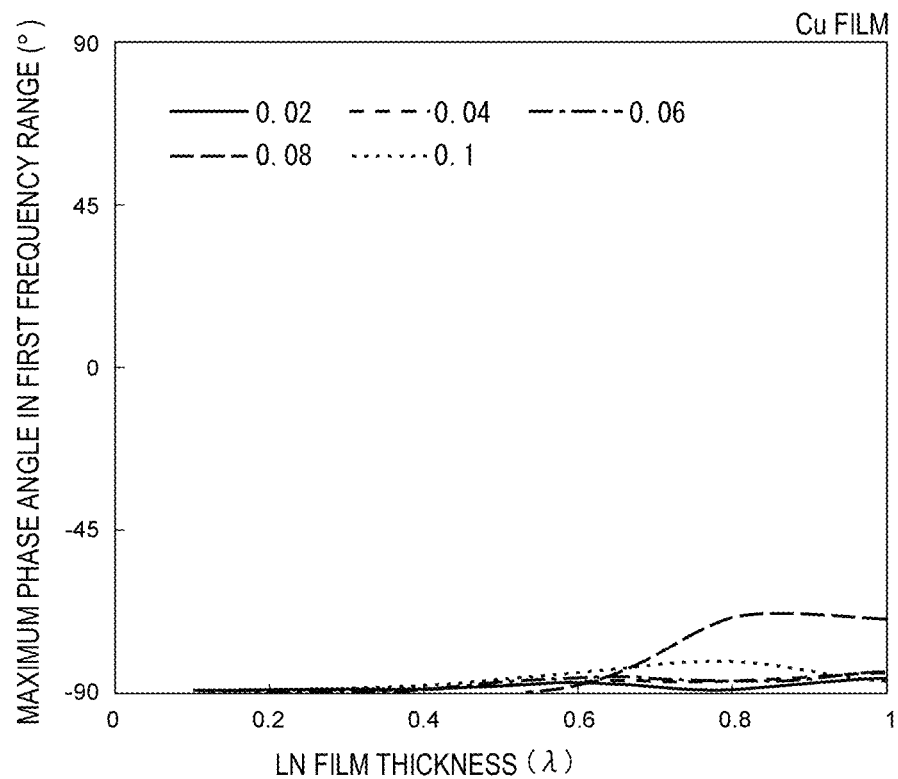
FIG. 13A is a diagram illustrating the phase characteristics in the first frequency range when the IDT electrode is made of a Cu film and FIG. 13B is a diagram illustrating the phase characteristics in the second frequency range in that case.
Figure 13B:
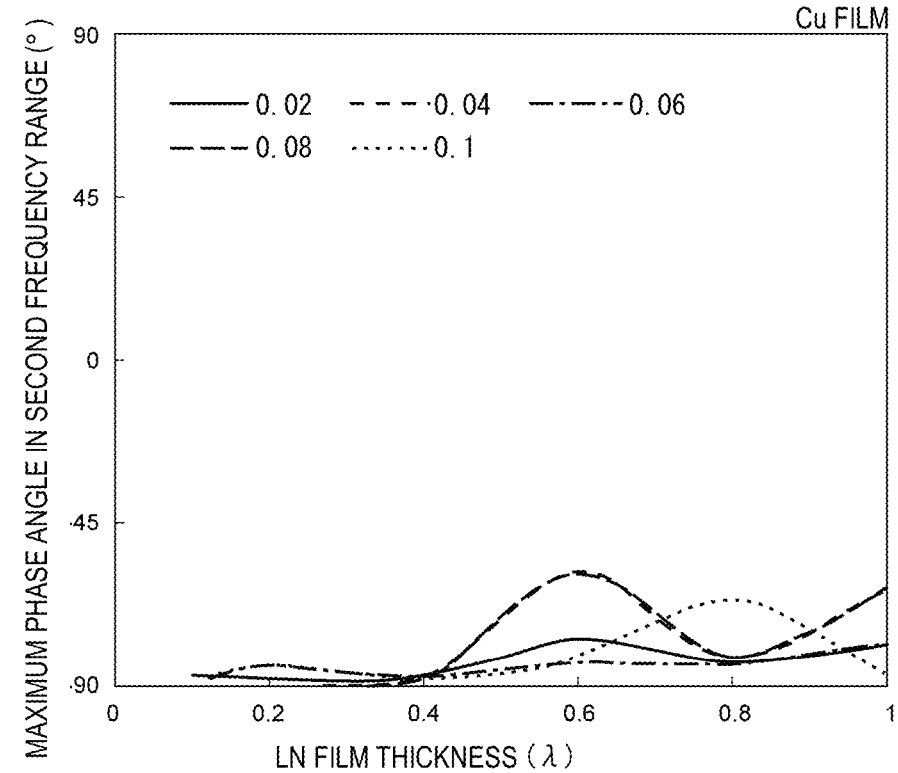
Figure 14A:
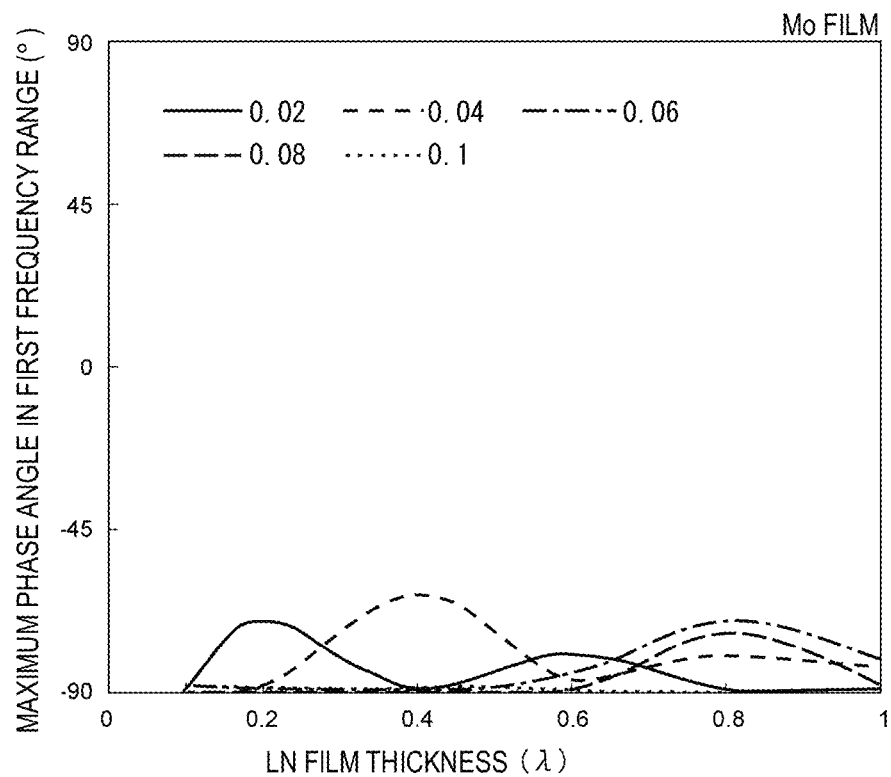
FIG. 14A is a diagram illustrating the phase characteristics in the first frequency range when the IDT electrode is made of a Mo film and FIG. 14B is a diagram illustrating the phase characteristics in the second frequency range in that case.
Figure 14B:
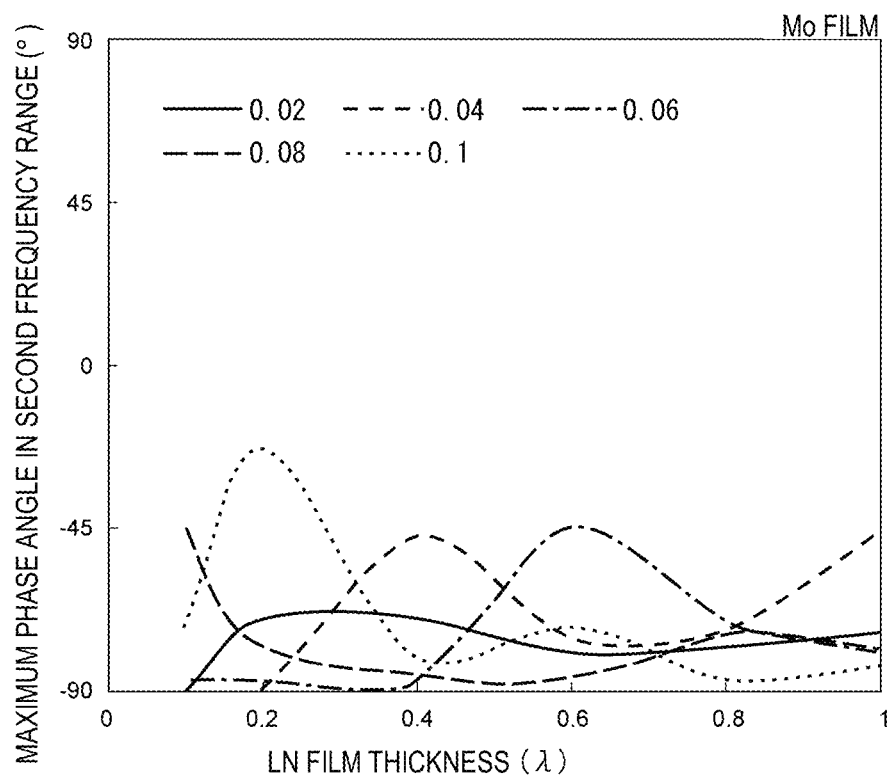
Figure 15A:
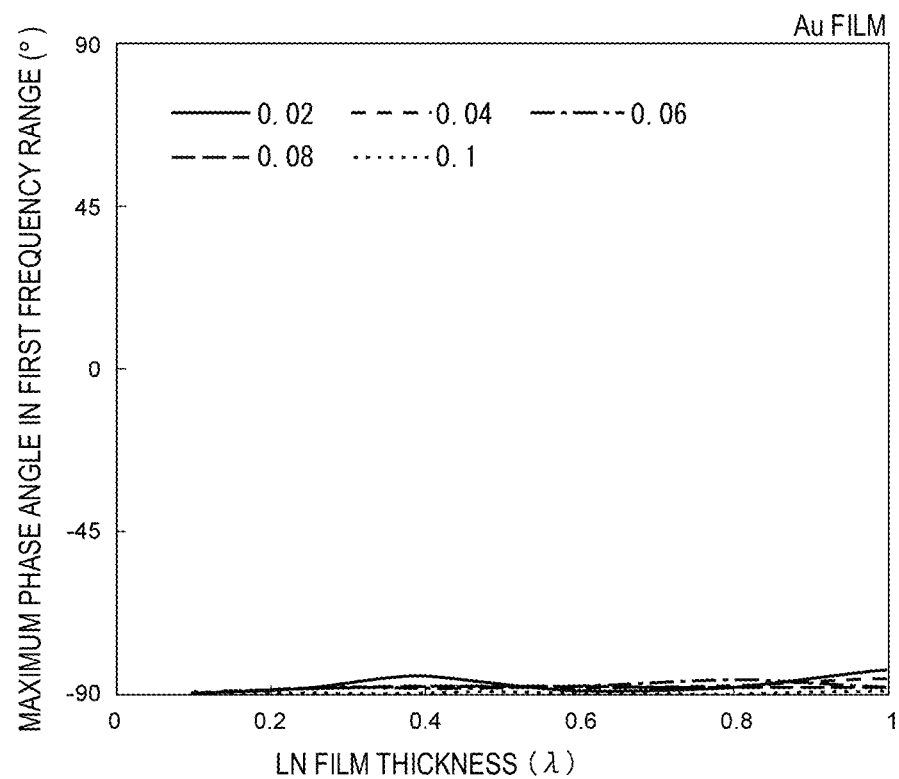
FIG. 15A is a diagram illustrating the phase characteristics in the first frequency range when the IDT electrode is made of an Au film and FIG. 15B is a diagram illustrating the phase characteristics in the second frequency range in that case.
Figure 15B:
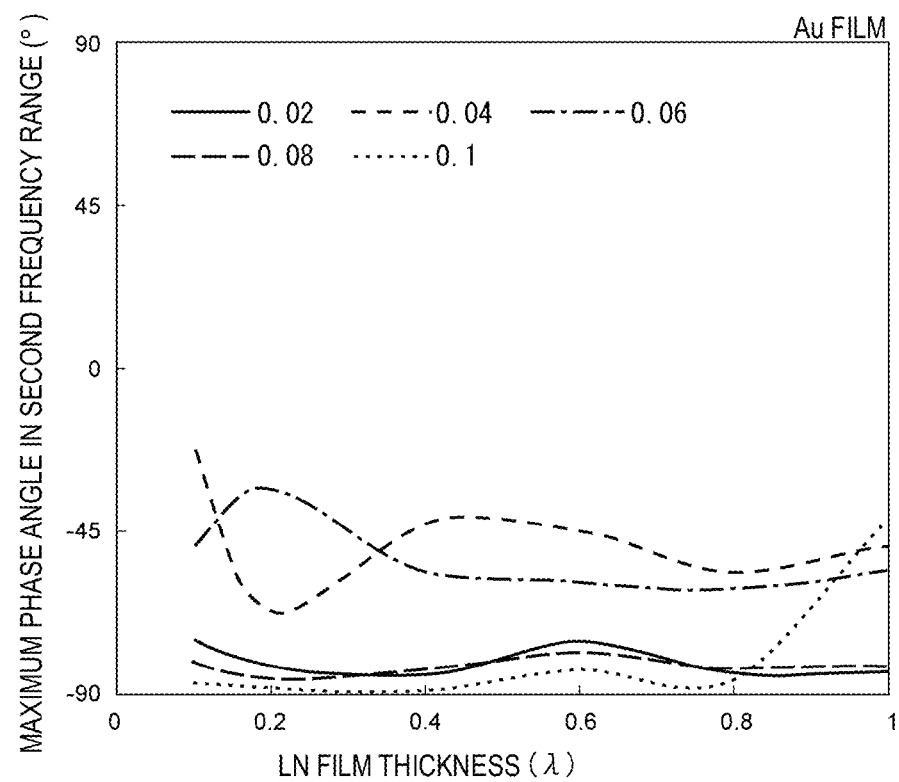

FIG. 10A is a diagram illustrating the phase characteristics in a comparative example and FIG. 10B is a diagram illustrating the impedance characteristics in that case.

In the comparative example, the following acoustic wave resonator was designed:
support substrate 12 . . . Si substrate
piezoelectric body 13 . . . LiNbO$_3$ film, Euler angles (0°, 120°, 0°)
IDT electrode 14 . . . duty ratio: about 0.50, number of electrode fingers of IDT electrode 14: 201 (100 pairs), electrode finger crossing width: 15λ, number of electrode fingers of reflectors 15 and 16: 21 (10 pairs)
materials of IDT electrode 14 . . . Al film (about 200 nm)/Ti film (about 10 nm)
utilized acoustic waves . . . SH waves
The resonant frequency of the main mode is about 1.8 GHz.

As illustrated in FIGS. 10A and 10B, in the comparative example, it is clear that although no significant spurious response is generated in the range from Fr to 1.5 Fr, spurious with a maximum phase angle of about 82° is generated in the vicinity of about 3.36 GHz (1.84 Fr) in the range from Fr to 2.0 Fr.

Next, the phase characteristics present when the thicknesses of the IDT electrode 14 and the LiNbO$_3$ film were changed in the thus-designed acoustic wave resonator were obtained.

FIGS. 11A to 15A are diagrams illustrating the phase characteristics in a first frequency range and FIG. 11B to 15B are diagrams illustrating the phase characteristics in a second frequency range.

In FIGS. 11A and 11B to 15A and 15B, the IDT electrodes 14 are respectively made of, in this order, a Pt film, an Al film, a Cu film, a Mo film, and an Au film. The type of IDT electrode 14 used is indicated at the top right in FIGS. 11A and 11B to 15A and 15B. In FIGS. 11A and 11B to 15A and 15B, the thickness of the LiNbO$_3$ film is changed within a range from about 0.1λ to about 1.0λ (1.0 is written as 1 in the figures) for cases where the thickness of the IDT electrode 14 is about 0.02λ, about 0.04λ, about 0.06λ, about 0.08λ, and about 0.10λ (0.10 is written as 0.1 in the figures). Furthermore, the first frequency range is a range from Fr to 1.5 Fr. The second frequency range is a range from Fr to 2.0 Fr.

As illustrated in FIGS. 11A and 11B to 15A and 15B, it is clear that the maximum phase angle is less than or equal to 0° when the thickness of the LiNbO$_3$ film lies within a range from about 0.1λ to about 1.0λ in the case where the thickness of the IDT electrode 14 is in a range from about 0.02λ to about 0.1λ. As is clear from FIGS. 11A and 11B to 15A and 15B, this result was independent of the material of the IDT electrode 14.

Next, the phase characteristics present when the Euler angle θ of the Euler angles (0°, θ, 0°) was changed were obtained. Specifically, for the structure illustrated in FIG. 2A, the following acoustic wave resonator was designed and the phase characteristics thereof were obtained:
   support substrate 12 . . . Si substrate
   piezoelectric body 13 . . . LiNbO$_3$ film, Euler angles (0°, θ, 0°), thickness: about 0.1λ-1.0λ
   IDT electrode 14 . . . duty ratio: about 0.50, number of electrode fingers of IDT electrode 14: 201 (100 pairs), electrode finger crossing width: 15λ, number of electrode fingers of reflectors 15 and 16: 21 (10 pairs)
   material of IDT electrode 14 . . . Pt film (thickness: about 0.1λ)
   utilized acoustic waves . . . Rayleigh waves
   λ is a wavelength determined by the electrode finger pitch of the IDT electrode 14 and λ=about 1.0 μm.

The phase characteristics were obtained while changing the Euler angle θ in the thus-designed acoustic wave resonator.

FIGS. 50 to 67 are diagrams illustrating phase characteristics obtained when the Euler angle θ and the thickness of the LiNbO$_3$ film are changed in each figure. In FIGS. 50 to 55, the Euler angle θ is about 30° and the thickness of the LiNbO$_3$ film is about 0.1λ, about 0.2λ, about 0.4λ, about 0.6λ, about 0.8λ, and about 1.0λ in this order. In FIGS. 56 to 61, the Euler angle θ is about 34° and the thickness of the LiNbO$_3$ film is about 0.1λ, about 0.2λ, about 0.4λ, about 0.6λ, about 0.8λ, and about 1.0λ in this order. In FIGS. 62 to 67, the Euler angle θ is about 38° and the thickness of the LiNbO$_3$ film is about 0.1λ, about 0.2λ, about 0.4λ, about 0.6λ, about 0.8λ, and about 1.0λ in this order. The thickness of the LiNbO$_3$ film (LN) is indicated at the top right of FIGS. 50 to 67.

As illustrated in FIGS. 50 to 67, it is clear that the maximum phase angle of spurious responses caused by SH waves (spurious at lower frequency than resonant frequency of main mode) is able to be reduced so as to be less than or equal to 0° when the Euler angle θ lies within a range from about 30° to about 38° and the thickness of the LiNbO$_3$ film lies within a range from about 0.1λ to about 1.0λ.

In addition, although results for Euler angles (0°, θ, 0°) are illustrated in FIGS. 50 to 67, it may be confirmed that similar results are obtained in a range of Euler angles of (0°±5°, θ, 0°±10°).

Second Preferred Embodiment

Figure 16:
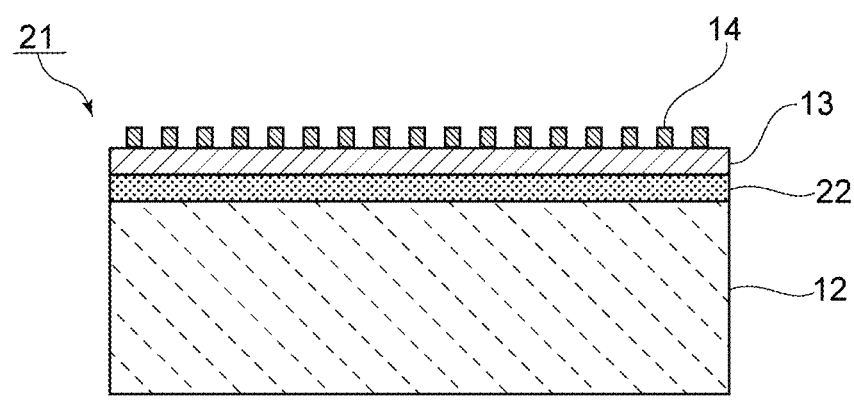
FIG. 16 is a schematic sectional view of an acoustic wave device defining a first band pass filter of a multiplexer according to a second preferred embodiment of the present invention.

FIG. 16 is a schematic sectional view of an acoustic wave device defining a first band pass filter of a multiplexer according to a second preferred embodiment of the present invention. In the multiplexer according to the second preferred embodiment, an acoustic wave device 21 illustrated in FIG. 16 is used as the acoustic wave devices forming the first band pass filter.

As illustrated in FIG. 16, in the acoustic wave device 21, a low-acoustic-velocity material layer 22 is provided between the support substrate 12 and the piezoelectric body 13.

The low-acoustic-velocity material layer 22 is made of a low-acoustic-velocity material in which the acoustic velocity of a bulk wave propagating therein is lower than the acoustic velocity of an acoustic wave propagating along the piezoelectric body 13.

A suitable material having a bulk wave acoustic velocity that is lower than the acoustic velocity of an acoustic wave propagating along the piezoelectric body 13 may be used as the low-acoustic-velocity material. For example, silicon oxide, glass, silicon oxynitride, tantalum oxide, or a compound obtained by adding fluorine, carbon, or boron to silicon oxide, or a material having any of the above materials as a main constituent may preferably be used as this material. In the present preferred embodiment, silicon oxide, for example, is preferably used. In addition, a buffer layer may be provided between the support substrate 12 and the low-acoustic-velocity material layer 22. Aluminum nitride, silicon nitride, silicon oxide, titanium oxide, or aluminum oxide, for example, may preferably be used as the buffer layer. The rest of the configuration is the same or substantially the same as in the first preferred embodiment.

In the second preferred embodiment, since the acoustic wave device 21 defining the first band pass filter has the above-described configuration, spurious responses generated at a higher frequency than the frequency of the main mode are able to be reduced or prevented. Therefore, the characteristics of a second band pass filter having a pass band that is located in a higher frequency band than the first band pass filter are unlikely to be degraded.

In addition, in the second preferred embodiment, the acoustic wave device 21 includes the low-acoustic-velocity material layer 22 and leaking of energy into the support substrate 12 is able to be reduced or prevented, and therefore acoustic waves are able to be effectively confined to inside piezoelectric body 13.

Next, reduction or prevention of spurious responses at a higher frequency than the frequency of the main mode in the acoustic wave device 21 will be described with reference to FIGS. 17A and 17B to 41A and 41B.

First, for the structure illustrated in FIG. 16, the following acoustic wave resonator was designed:
   support substrate 12 . . . Si substrate
   low-acoustic-velocity material layer 22: SiO$_2$ film
   piezoelectric body 13 . . . LiNbO$_3$ film, Euler angles (0°, 34°, 0°)
   IDT electrode 14 . . . duty ratio: about 0.50, number of electrode fingers of IDT electrode 14: 201 (100 pairs), electrode finger crossing width: 15λ, number of electrode fingers of reflectors 15 and 16: 21 (10 pairs)
   materials of IDT electrode 14 . . . Pt film (thickness: about 0.1λ), Al film (thickness: about 0.1λ), Cu film (thickness: about 0.1λ), Mo film (thickness: about 0.08λ), Au film (thickness: about 0.1λ)
   utilized acoustic waves . . . Rayleigh waves
   λ is a wavelength determined by the electrode finger pitch of the IDT electrode 14 and λ=about 1.0 μm.

The phase characteristics and impedance characteristics of the thus-designed acoustic wave resonator are illustrated in FIGS. 17A and 17B to 21A and 21B.

FIGS. 17A to 21A are diagrams illustrating the phase characteristics and FIGS. 17B to 21B are diagrams illustrating the impedance characteristics. In FIGS. 17A and 17B to 21A and 21B, the IDT electrodes 14 is respectively made of, in this order, a Pt film (Pt film thickness: about 0.1λ, LiNbO₃ film thickness: about 0.8λ, SiO₂ film thickness: about 0.4λ, main mode resonant frequency (Fr): about 2.55 GHz, band width ratio: about 5.7%), an Al film (Al film thickness: about 0.1λ, LiNbO₃ film thickness: about 0.4λ, SiO₂ film thickness: about 0.2λ, main mode resonant frequency (Fr), about 3.53 GHz, band width ratio: about 3.8%), a Cu film (Cu film thickness: about 0.1λ, LiNbO₃ film thickness: about 0.2λ, SiO₂ film thickness: about 0.4λ, main mode resonant frequency (Fr): about 2.95 GHz, band width ratio: about 5.1%), a Mo film (Mo film thickness: about 0.08λ, LiNbO₃ film thickness: about 0.4λ, SiO₂ film thickness: about 0.2λ, main mode resonant frequency (Fr): about 3.1 GHz, band width ratio: about 5.6%), and an Au film (Au film thickness: about 0.1λ, LiNbO₃ film thickness: about 0.8λ, SiO₂ film thickness: about 0.4λ, main mode resonant frequency (Fr): about 2.57 GHz, band width ratio: about 5.2%). The type of IDT electrode 14 used is indicated at the top right in FIGS. 17A and 17B to 21A and 21B. In addition, in FIGS. 17A and 17B to 21A and 21B, the dashed line indicates a frequency that is about 1.5 times Fr (1.5 Fr), the one-dot chain line indicates a frequency that is about two times Fr (2.0 Fr), and the two-dot chain line indicates a frequency that is about 2.5 times Fr (2.5 Fr).

Figure 17A:
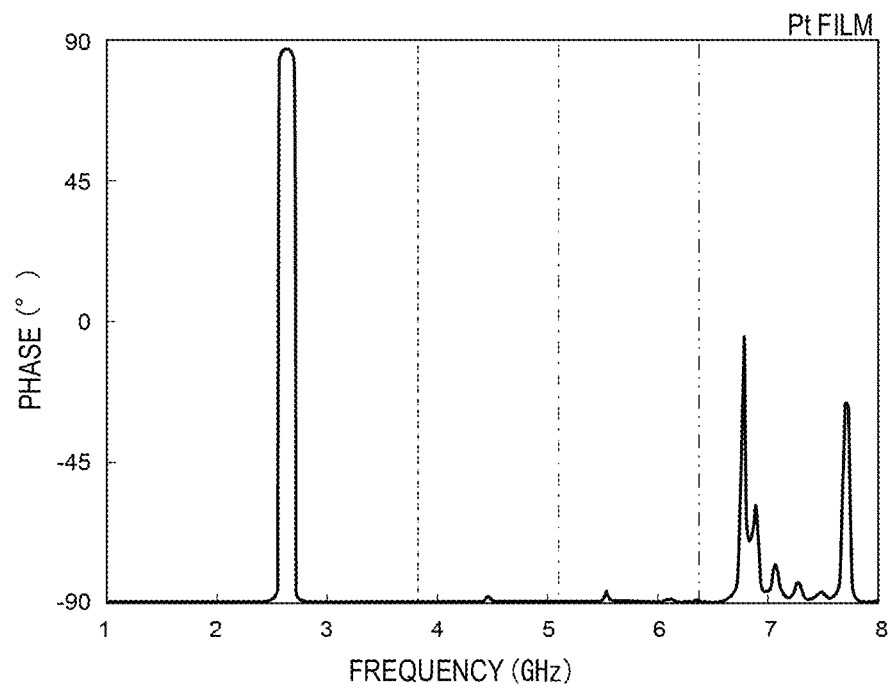
FIG. 17A is a diagram illustrating the phase characteristics when the IDT electrode is made of a Pt film and FIG. 17B is a diagram illustrating the impedance characteristics in that case.
Figure 17B:
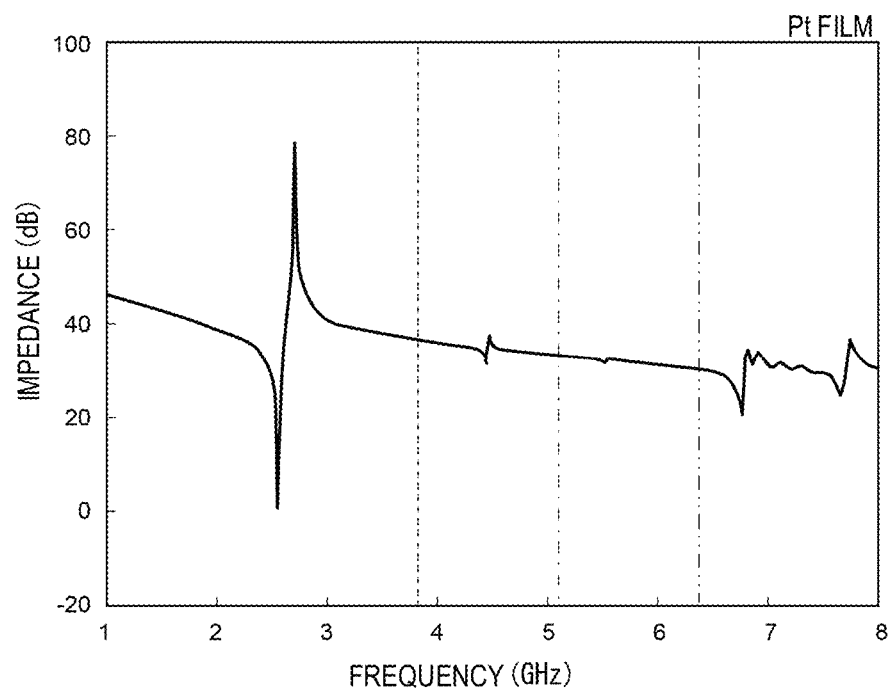
Figure 18A:
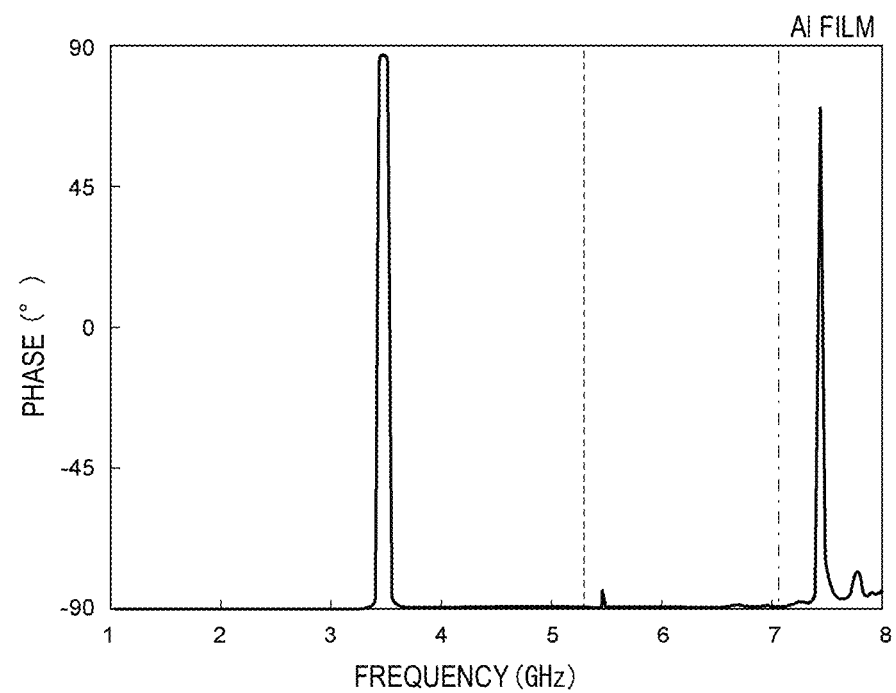
FIG. 18A is a diagram illustrating the phase characteristics when the IDT electrode is made of an Al film and FIG. 18B is a diagram illustrating the impedance characteristics in that case.
Figure 18B:
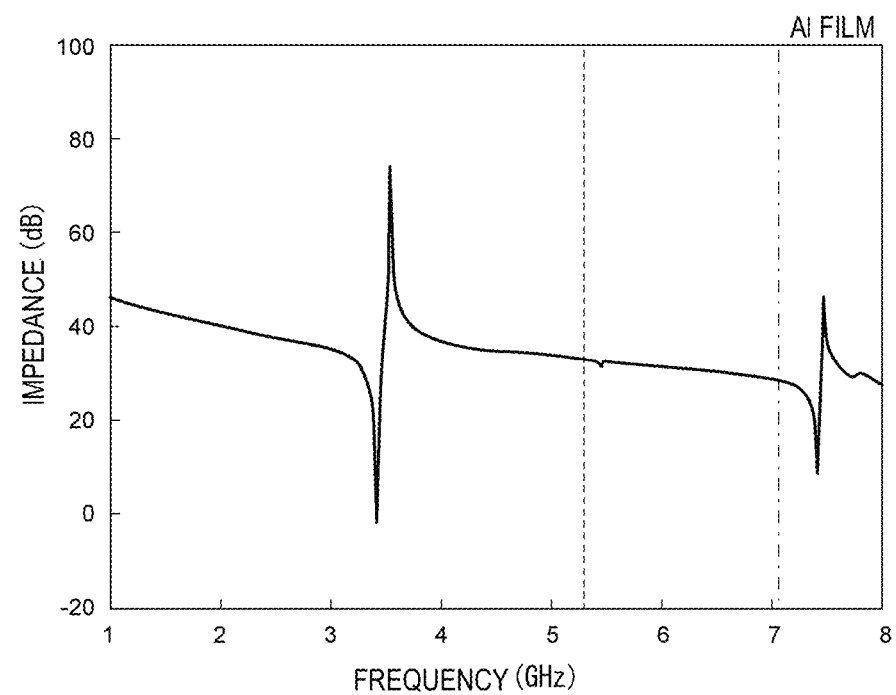
Figure 19A:
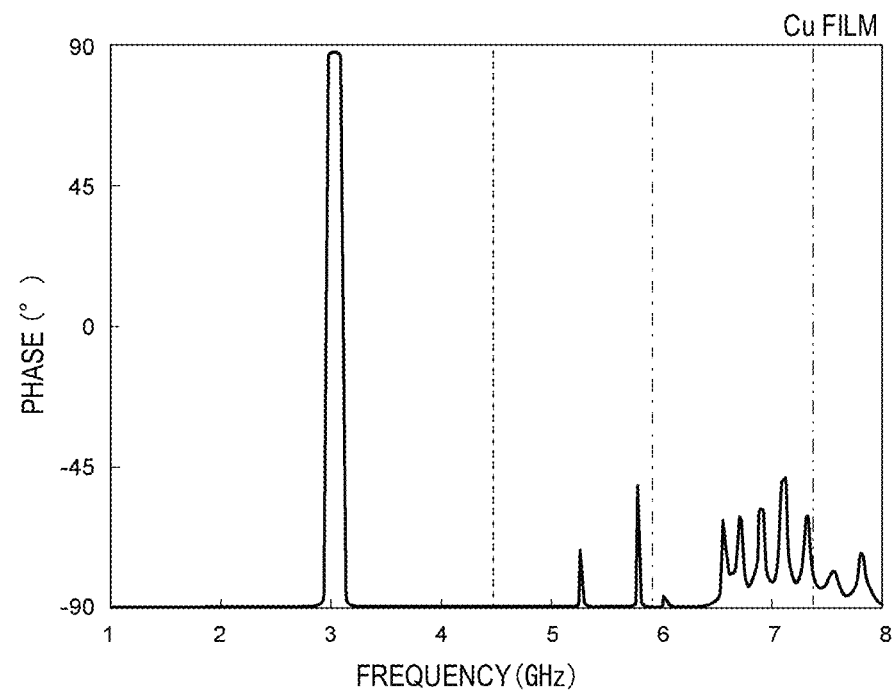
FIG. 19A is a diagram illustrating the phase characteristics when the IDT electrode is made of a Cu film and FIG. 19B is a diagram illustrating the impedance characteristics in that case.
Figure 19B:
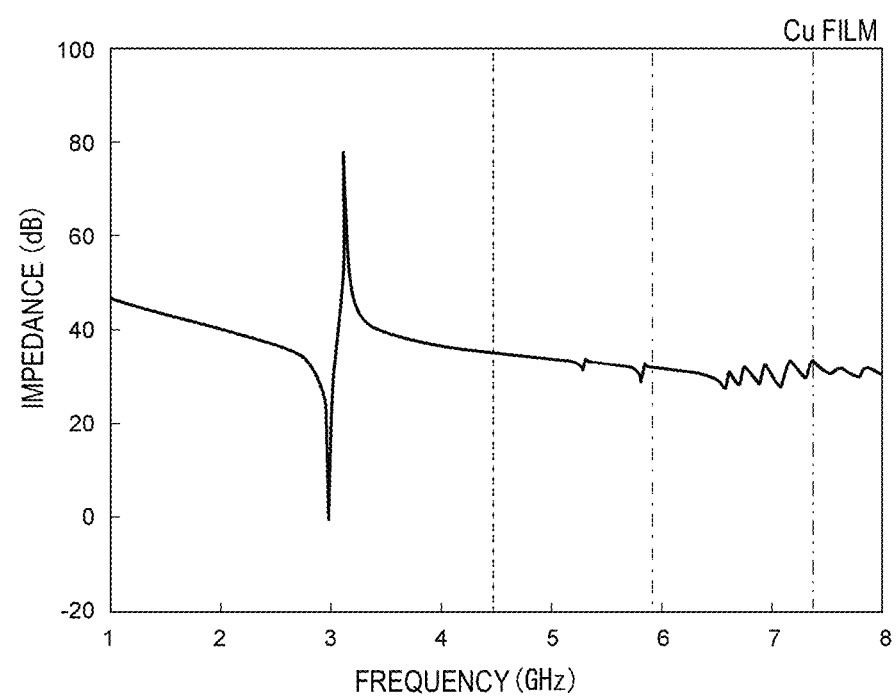
Figure 20A:
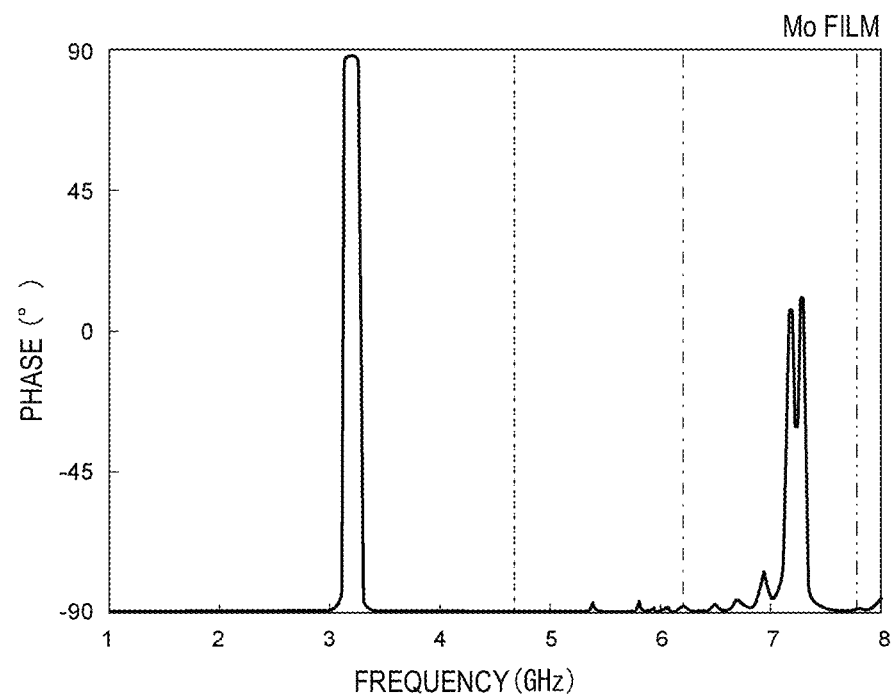
FIG. 20A is a diagram illustrating the phase characteristics when the IDT electrode is made of a Mo film and FIG. 20B is a diagram illustrating the impedance characteristics in that case.
Figure 20B:
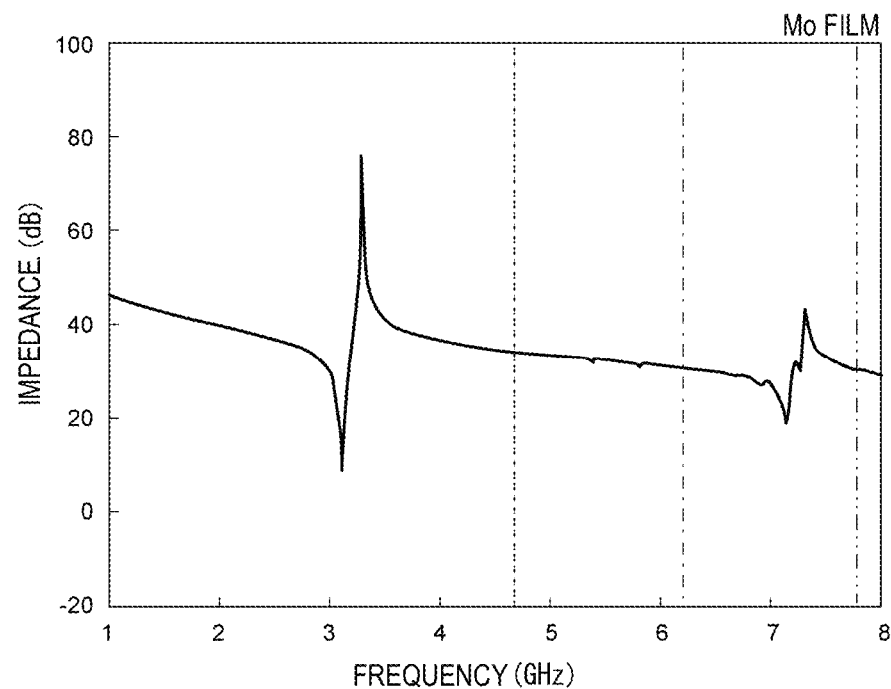
Figure 21A:
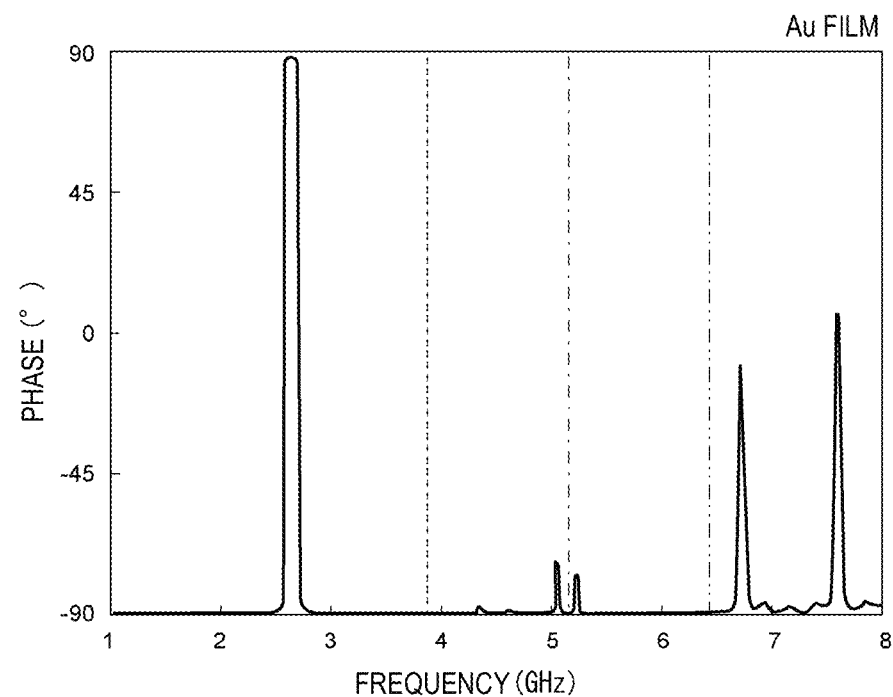
FIG. 21A is a diagram illustrating the phase characteristics when the IDT electrode is made of an Au film and FIG. 21B is a diagram illustrating the impedance characteristics in that case.
Figure 21B:
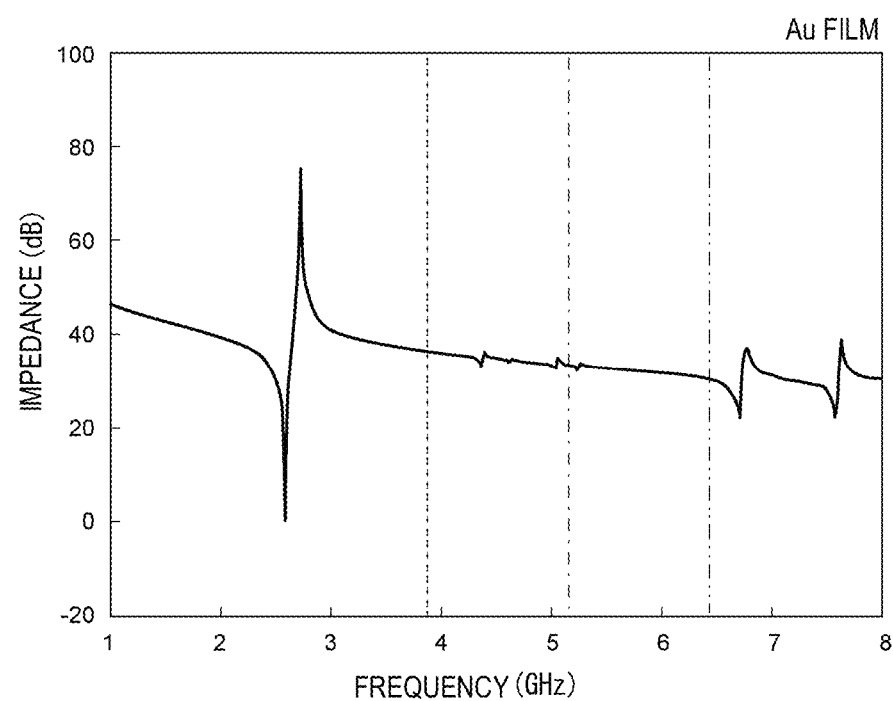
Figure 22A:
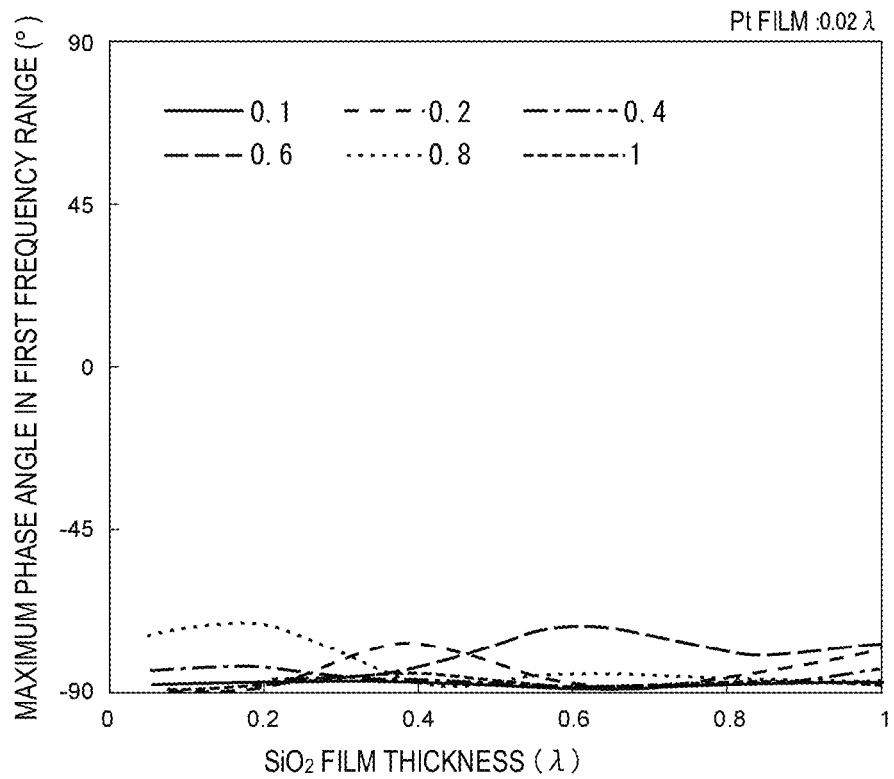
FIG. 22A is a diagram illustrating the phase characteristics in the first frequency range when the IDT electrode is made of a Pt film having a thickness of 0.02λ
Figure 22B:
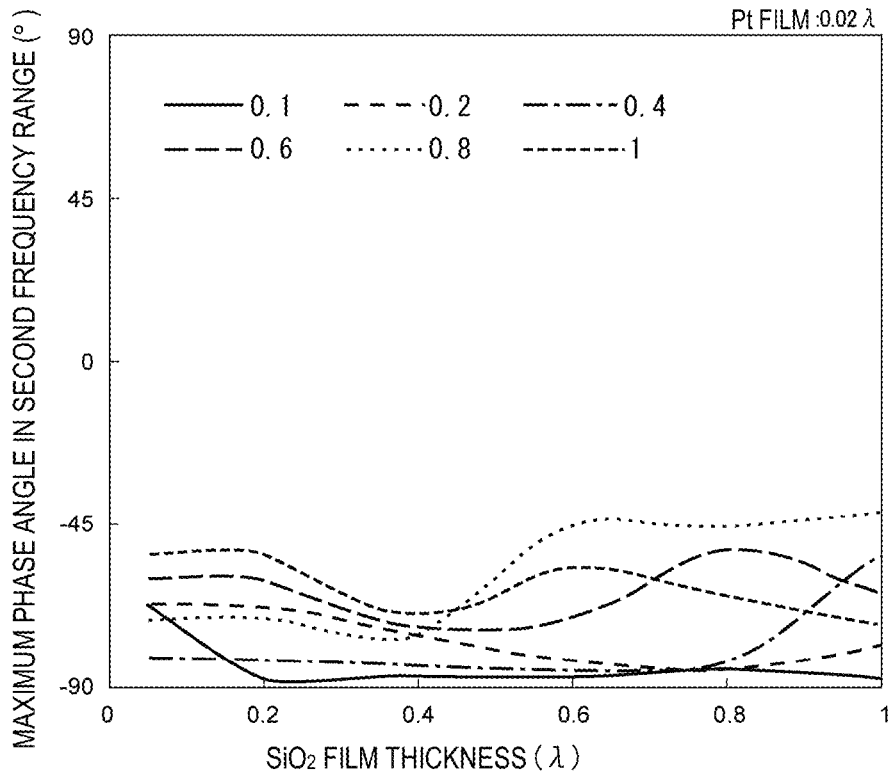
FIG. 22B is a diagram illustrating the phase characteristics in the second frequency range in that case.
Figure 23A:
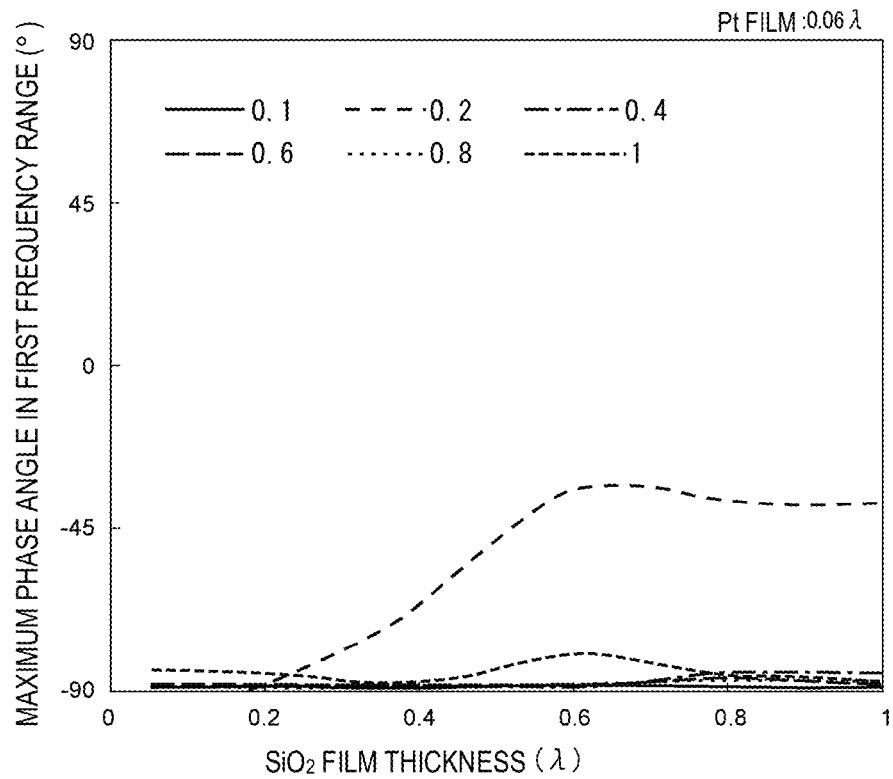
FIG. 23A is a diagram illustrating the phase characteristics in the first frequency range when the IDT electrode is made of a Pt film having a thickness of 0.06λ
Figure 23B:
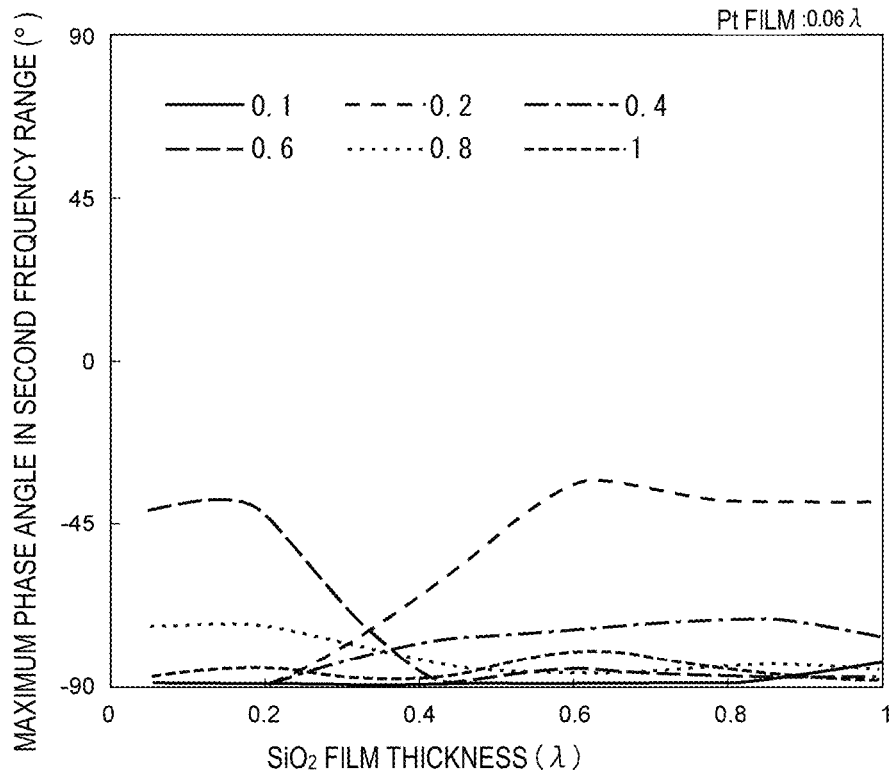
FIG. 23B is a diagram illustrating the phase characteristics in the second frequency range in that case.
Figure 24A:
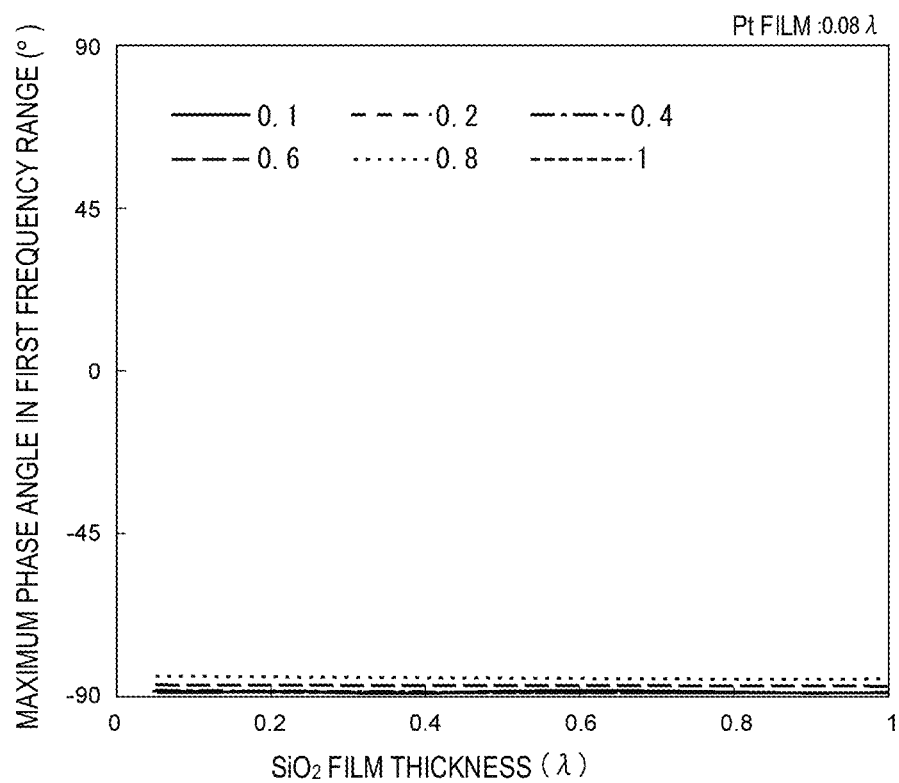
FIG. 24A is a diagram illustrating the phase characteristics in the first frequency range when the IDT electrode is made of a Pt film having a thickness of 0.08λ
Figure 24B:
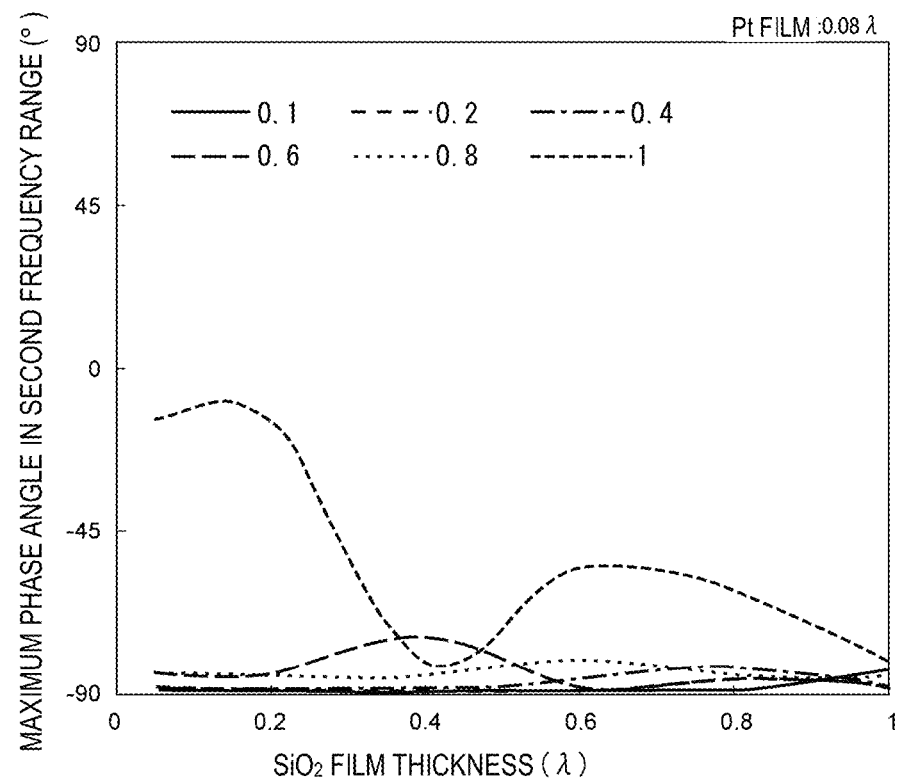
FIG. 24B is a diagram illustrating the phase characteristics in the second frequency range in that case.
Figure 25A:
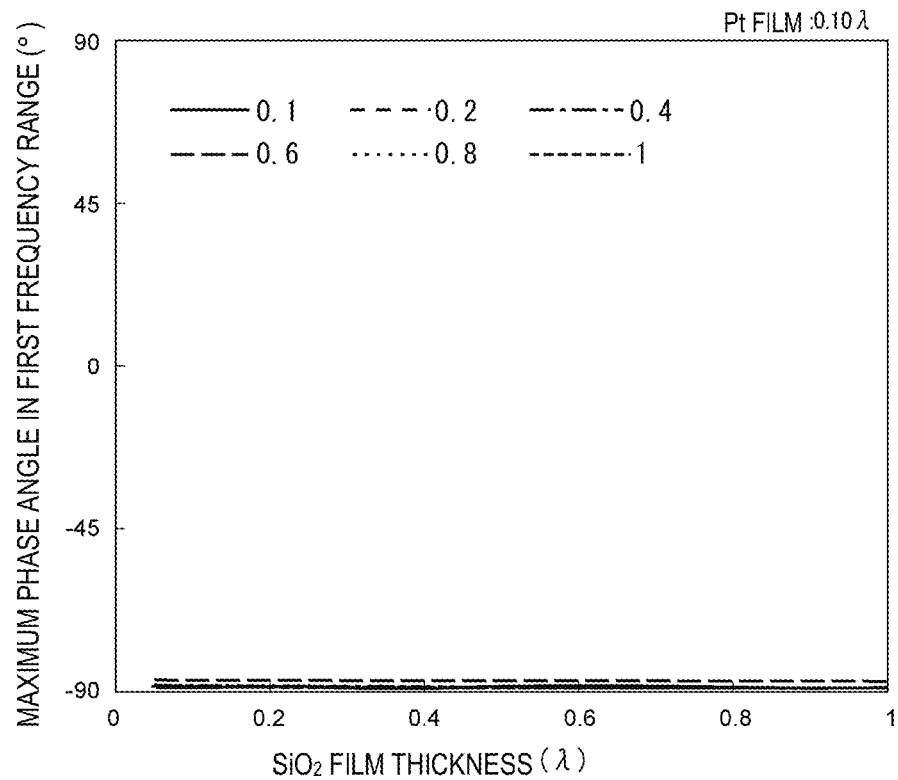
FIG. 25A is a diagram illustrating the phase characteristics in the first frequency range when the IDT electrode is made of a Pt film having a thickness of 0.10λ
Figure 25B:
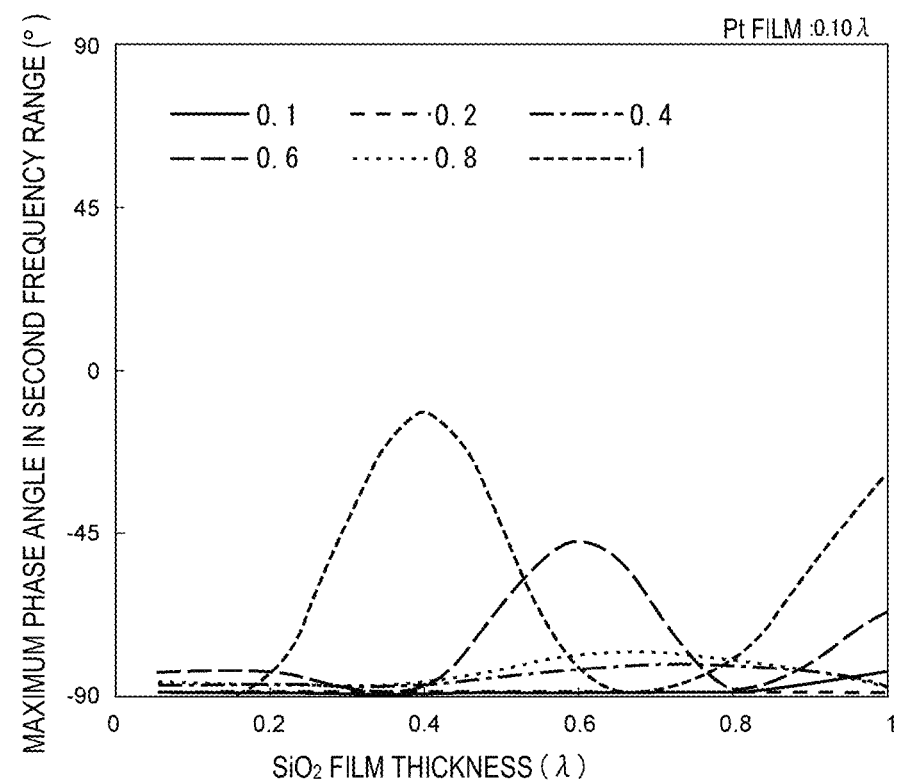
FIG. 25B is a diagram illustrating the phase characteristics in the second frequency range in that case.
Figure 26A:
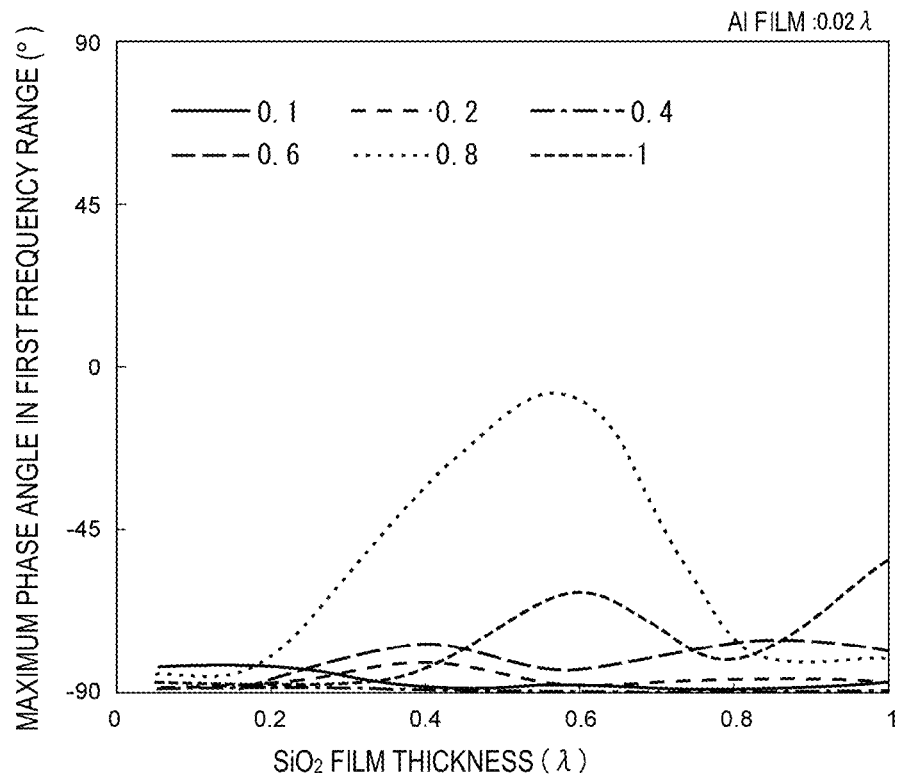
FIG. 26A is a diagram illustrating the phase characteristics in a first frequency range when the IDT electrode is made of an Al film having a thickness of 0.02λ
Figure 26B:
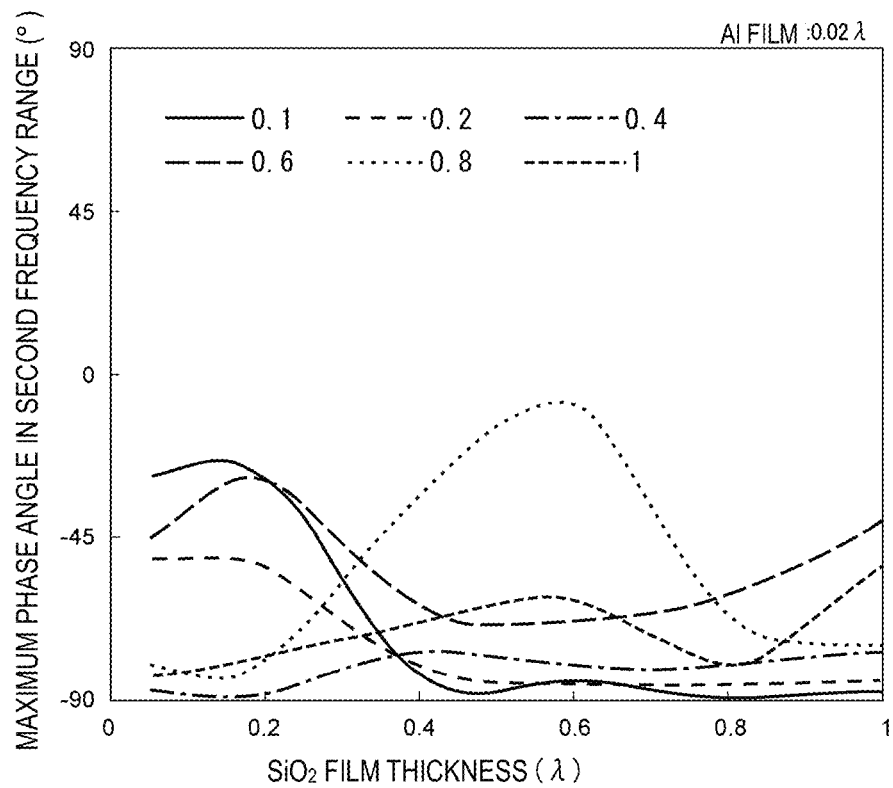
FIG. 26B is a diagram illustrating the phase characteristics in the second frequency range in that case.
Figure 27A:
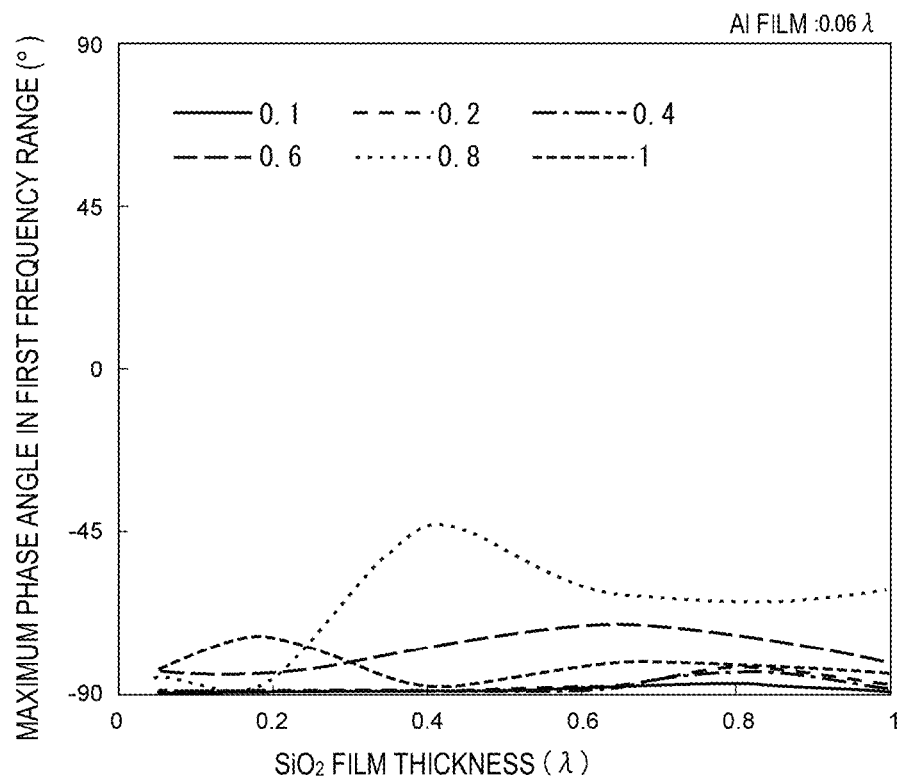
FIG. 27A is a diagram illustrating the phase characteristics in the first frequency range when the IDT electrode is made of an Al film having a thickness of 0.06λ
Figure 27B:
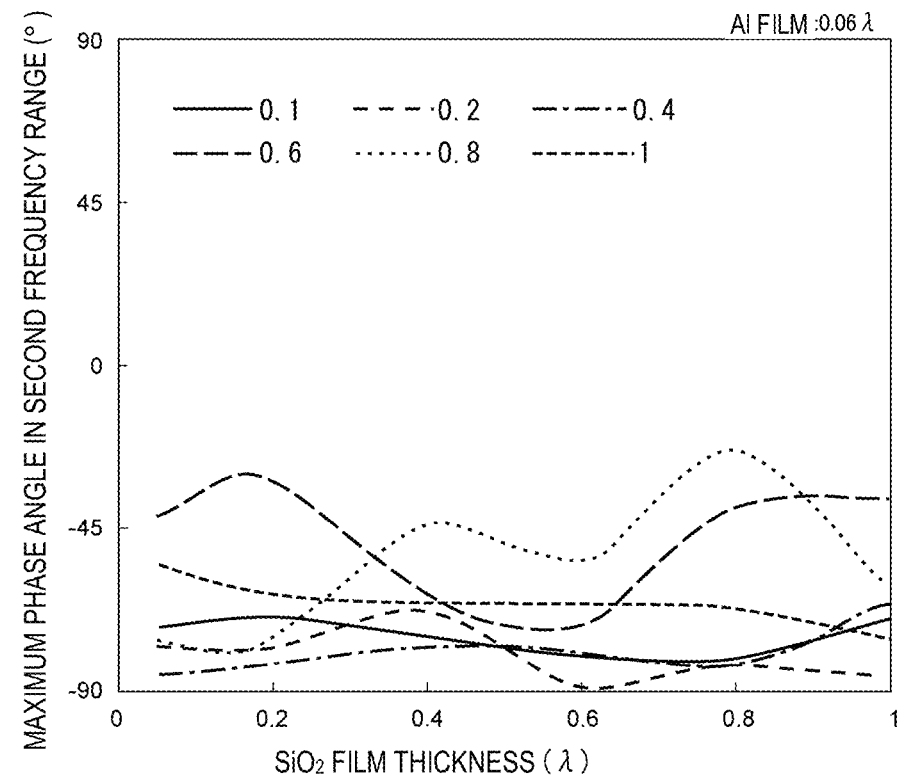
FIG. 27B is a diagram illustrating the phase characteristics in the second frequency range in that case.
Figure 28A:
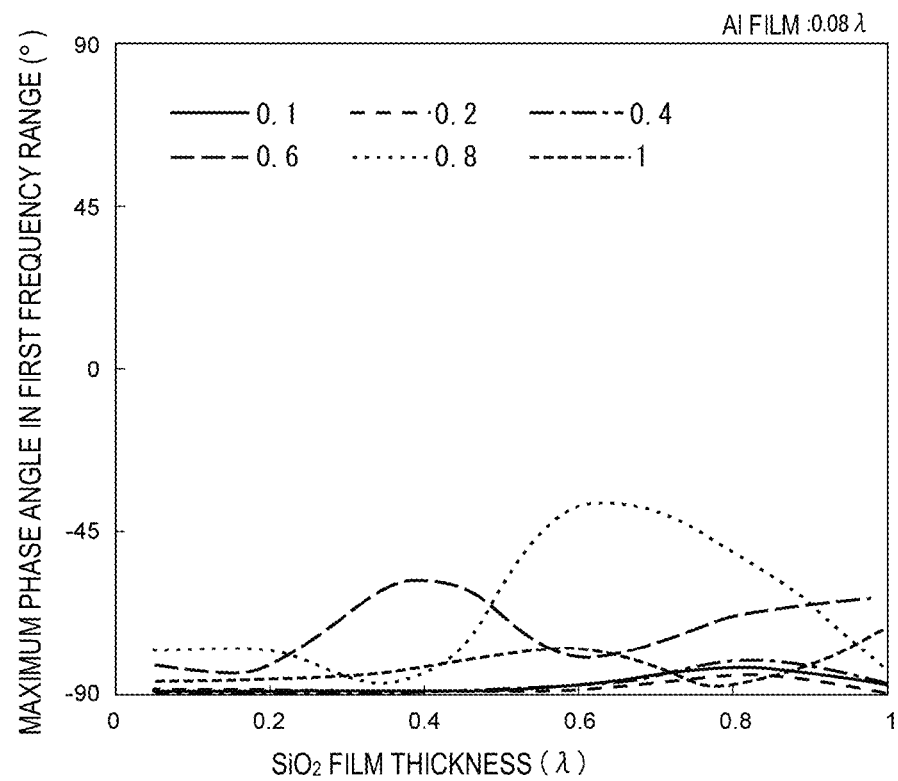
FIG. 28A is a diagram illustrating the phase characteristics in the first frequency range when the IDT electrode is made of an Al film having a thickness of 0.08λ
Figure 28B:
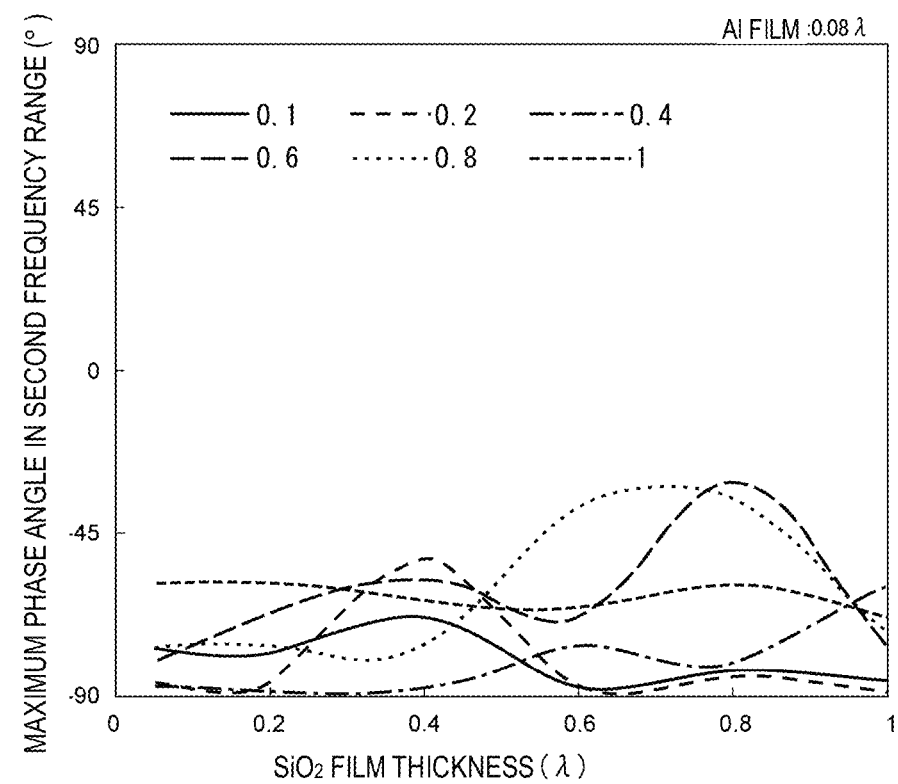
FIG. 28B is a diagram illustrating the phase characteristics in the second frequency range in that case.
Figure 29A:
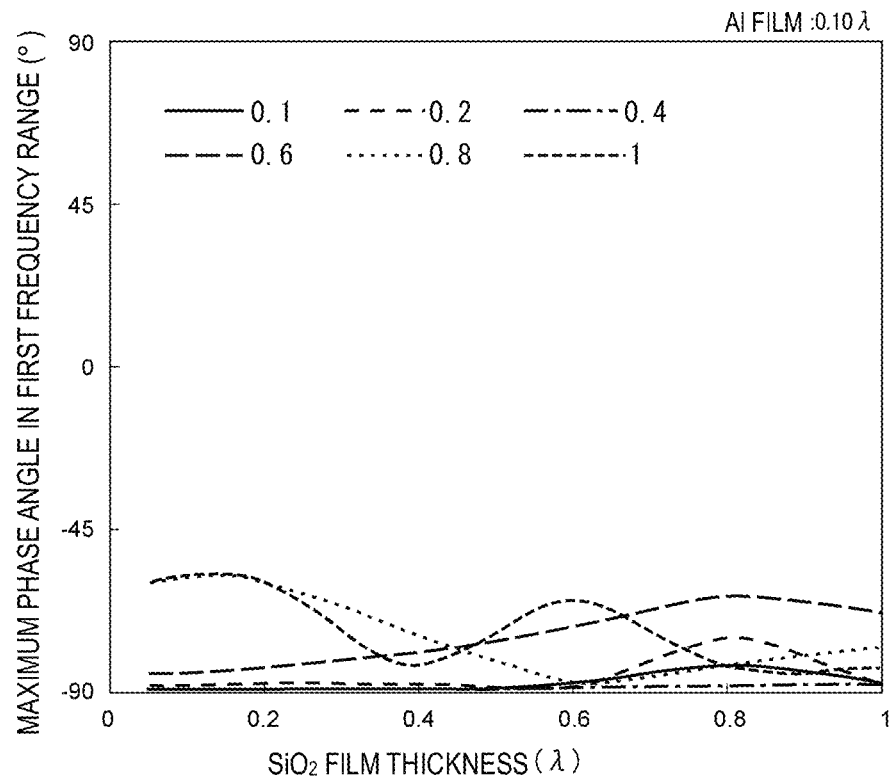
FIG. 29A is a diagram illustrating the phase characteristics in the first frequency range when the IDT electrode is made of an Al film having a thickness of 0.10λ
Figure 29B:
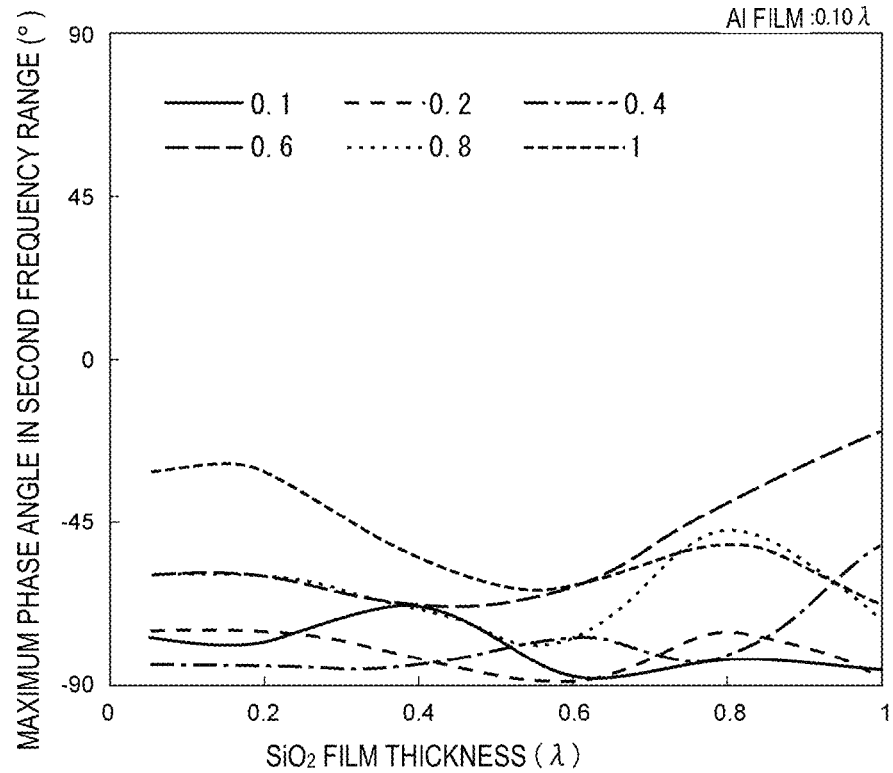
FIG. 29B is a diagram illustrating the phase characteristics in the second frequency range in that case.
Figure 30A:
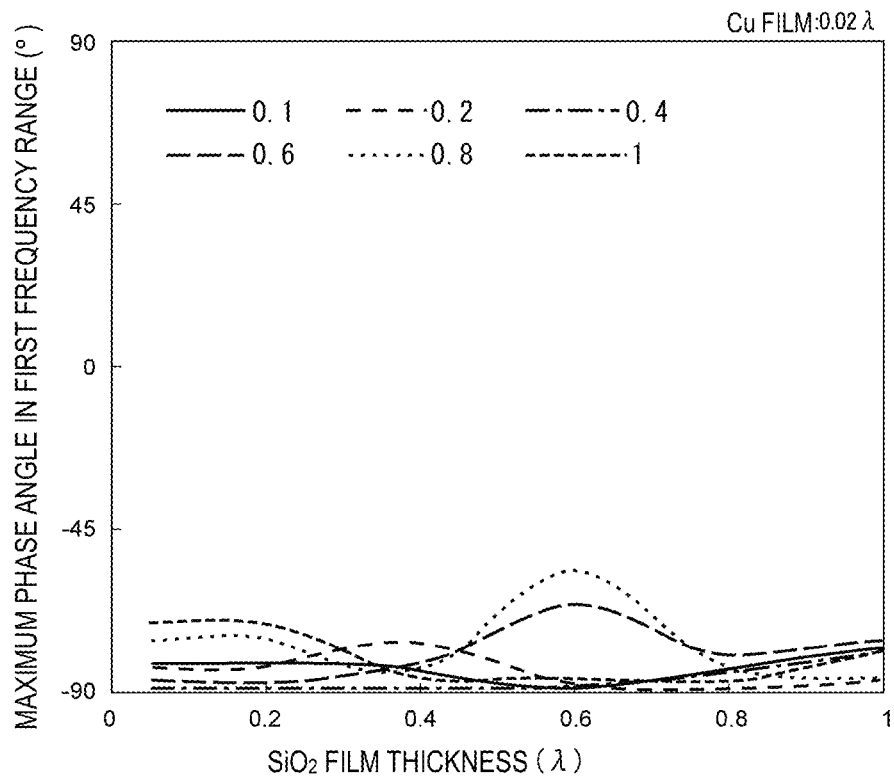
FIG. 30A is a diagram illustrating the phase characteristics in the first frequency range when the IDT electrode is made of a Cu film having a thickness of 0.02λ
Figure 30B:
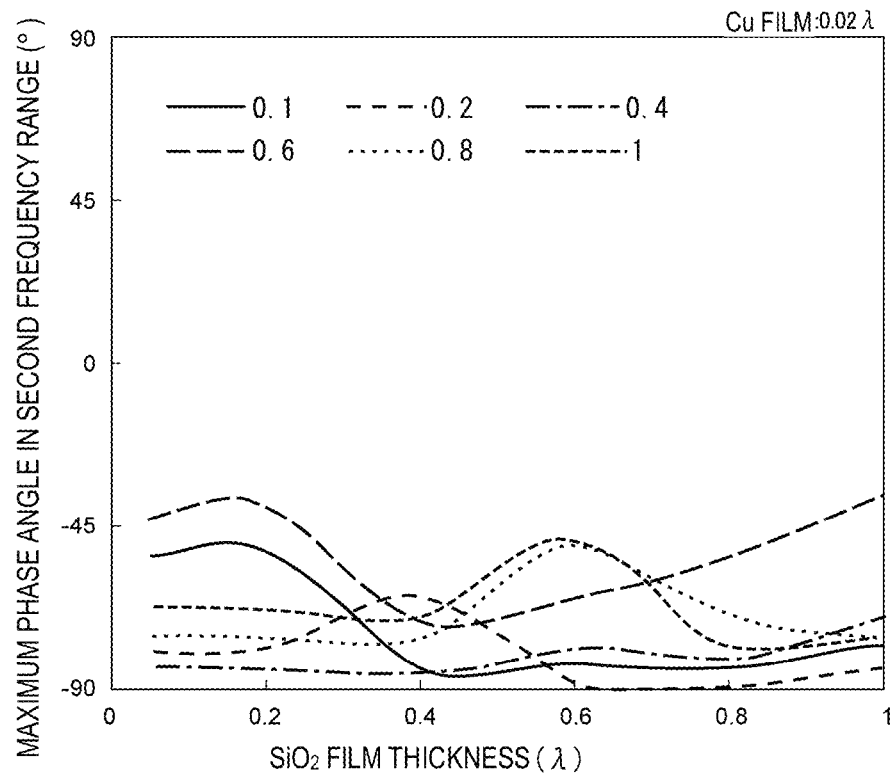
FIG. 30B is a diagram illustrating the phase characteristics in the second frequency range in that case.
Figure 31A:
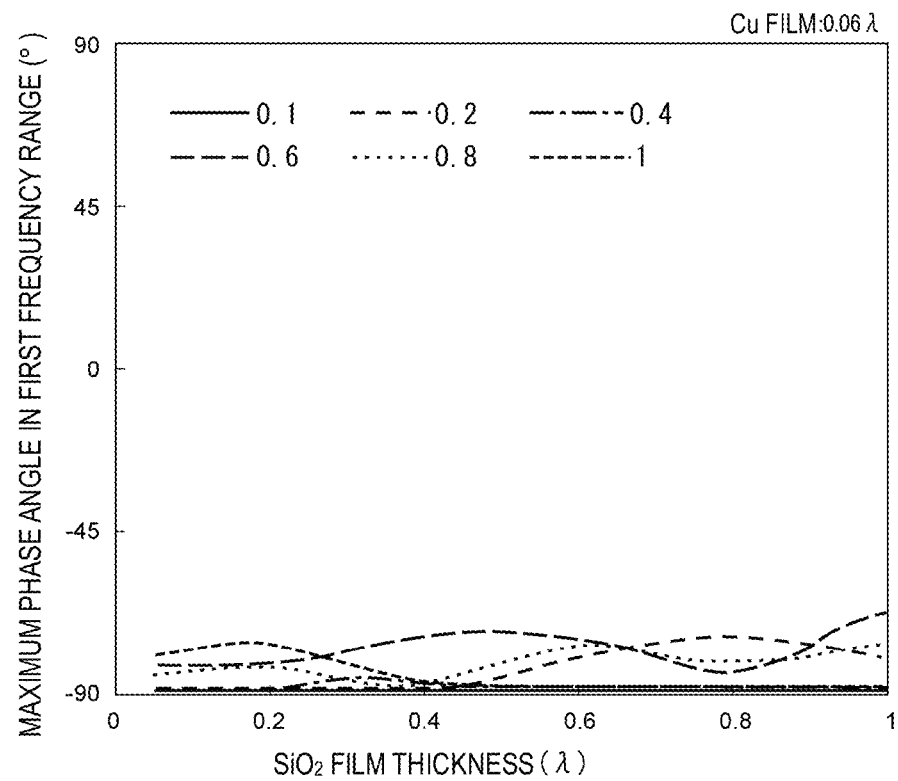
FIG. 31A is a diagram illustrating the phase characteristics in the first frequency range when the IDT electrode is made of a Cu film having a thickness of 0.06λ
Figure 31B:
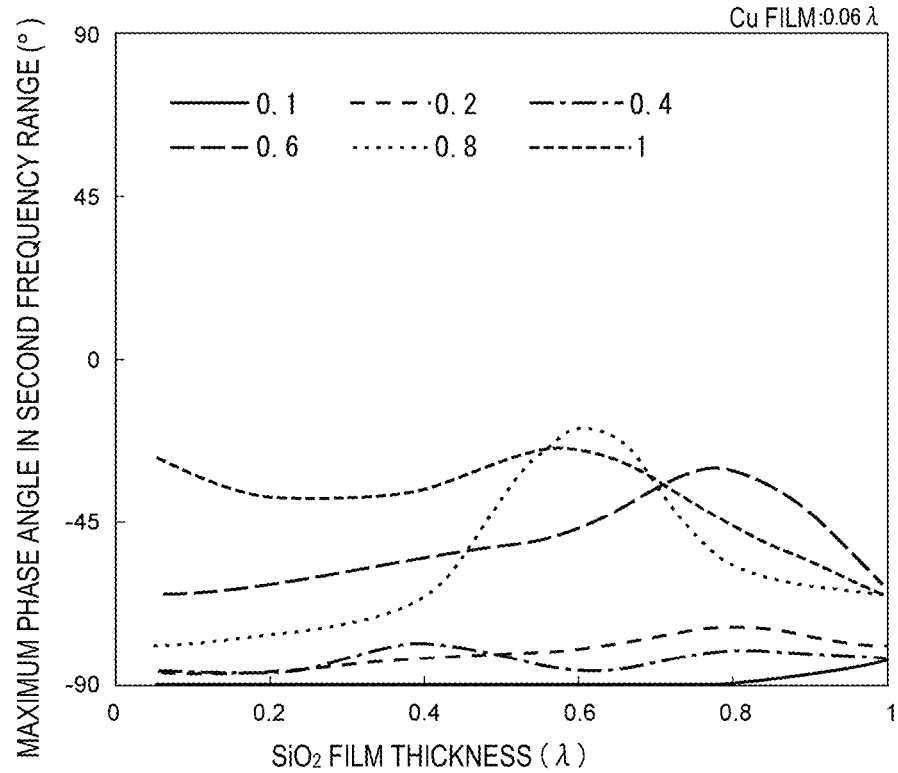
FIG. 31B is a diagram illustrating the phase characteristics in the second frequency range in that case.
Figure 32A:
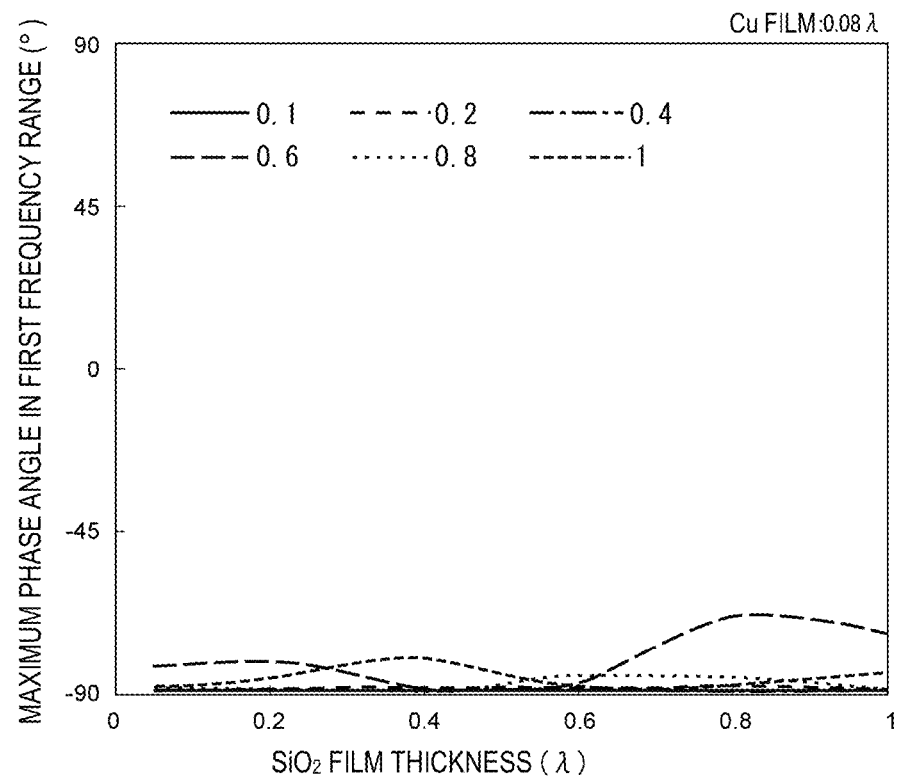
FIG. 32A is a diagram illustrating the phase characteristics in the first frequency range when the IDT electrode is made of a Cu film having a thickness of 0.08λ
Figure 32B:
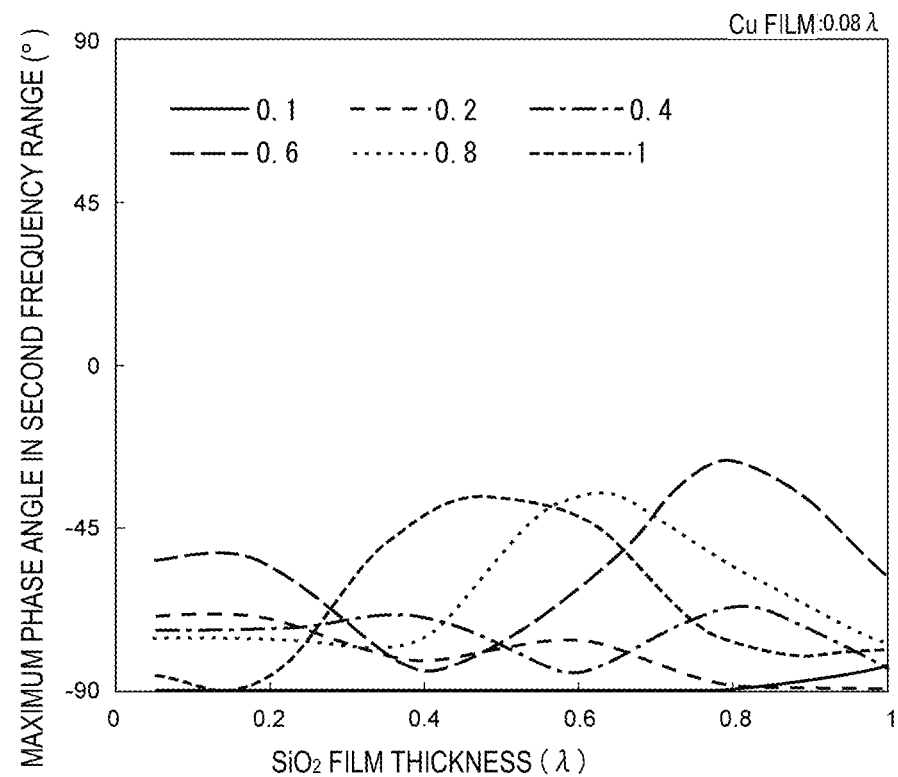
FIG. 32B is a diagram illustrating the phase characteristics in the second frequency range in that case.
Figure 33A:
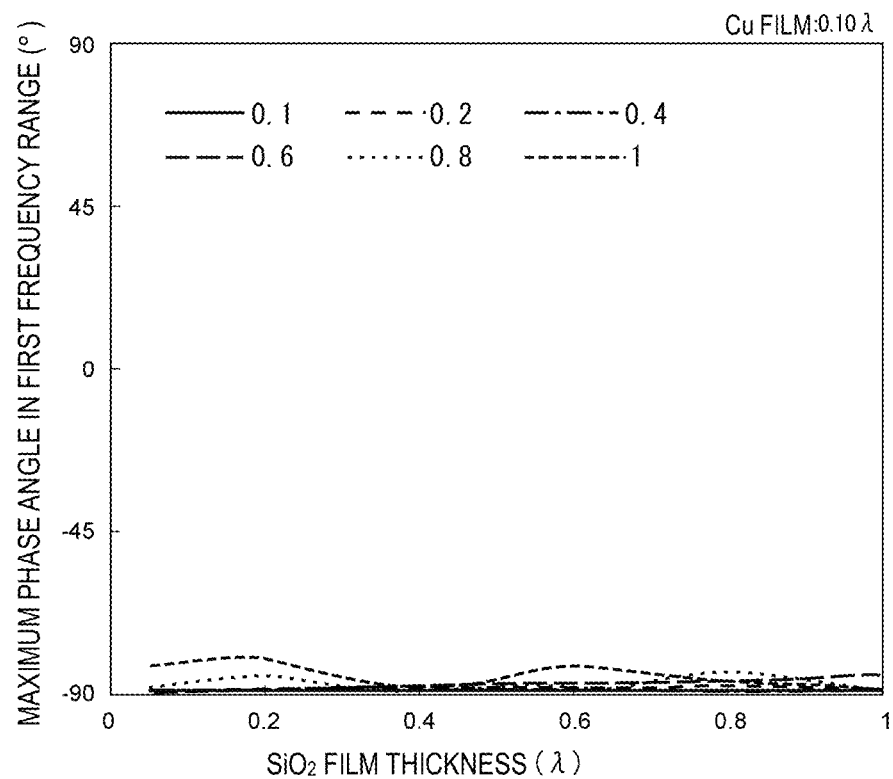
FIG. 33A is a diagram illustrating the phase characteristics in the first frequency range when the IDT electrode is made of a Cu film having a thickness of 0.10λ
Figure 33B:
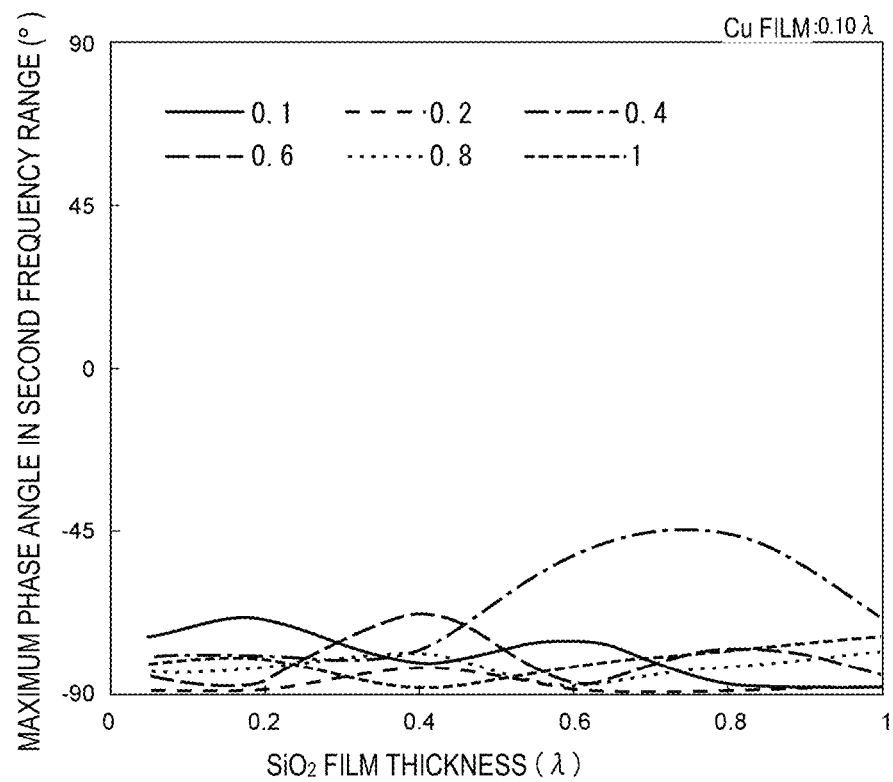
FIG. 33B is a diagram illustrating the phase characteristics in the second frequency range in that case.
Figure 34A:
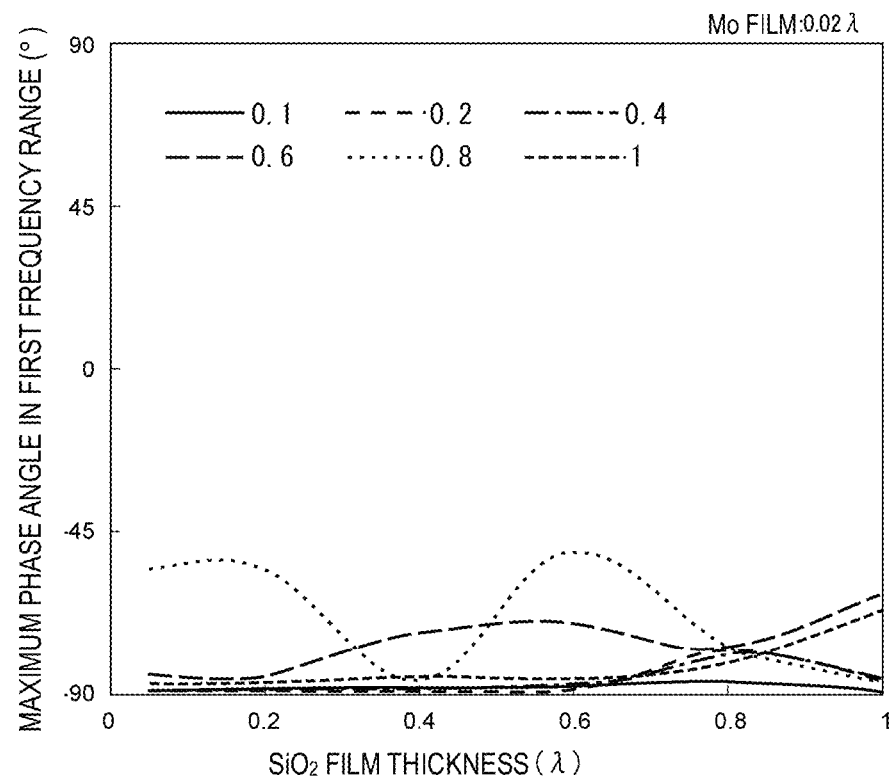
FIG. 34A is a diagram illustrating the phase characteristics in the first frequency range when the IDT electrode is made of a Mo film having a thickness of 0.02λ
Figure 34B:
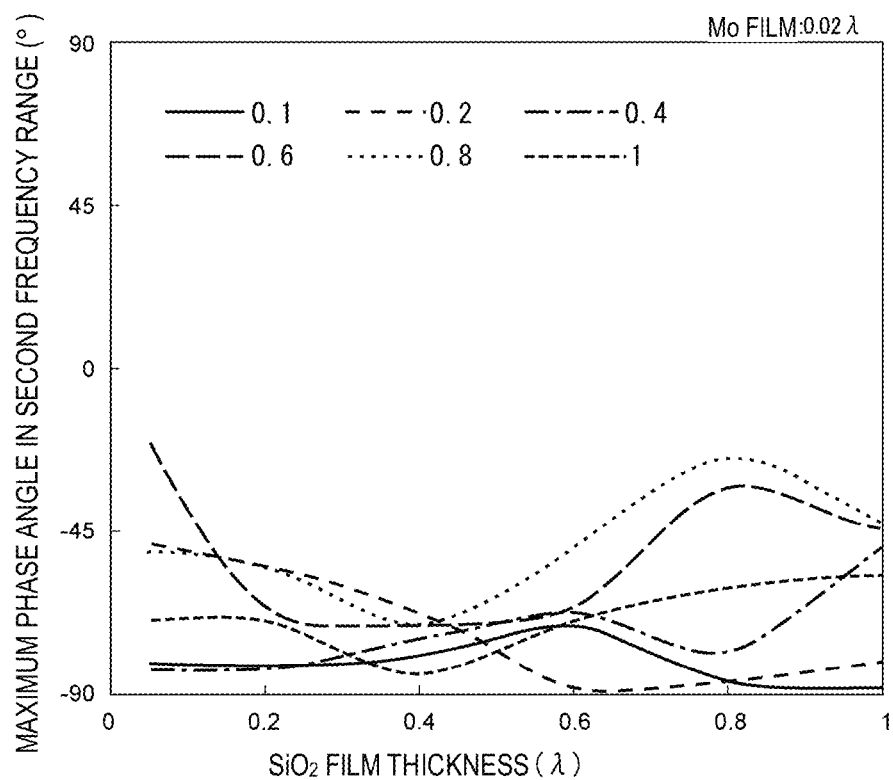
FIG. 34B is a diagram illustrating the phase characteristics in the second frequency range in that case.
Figure 35A:
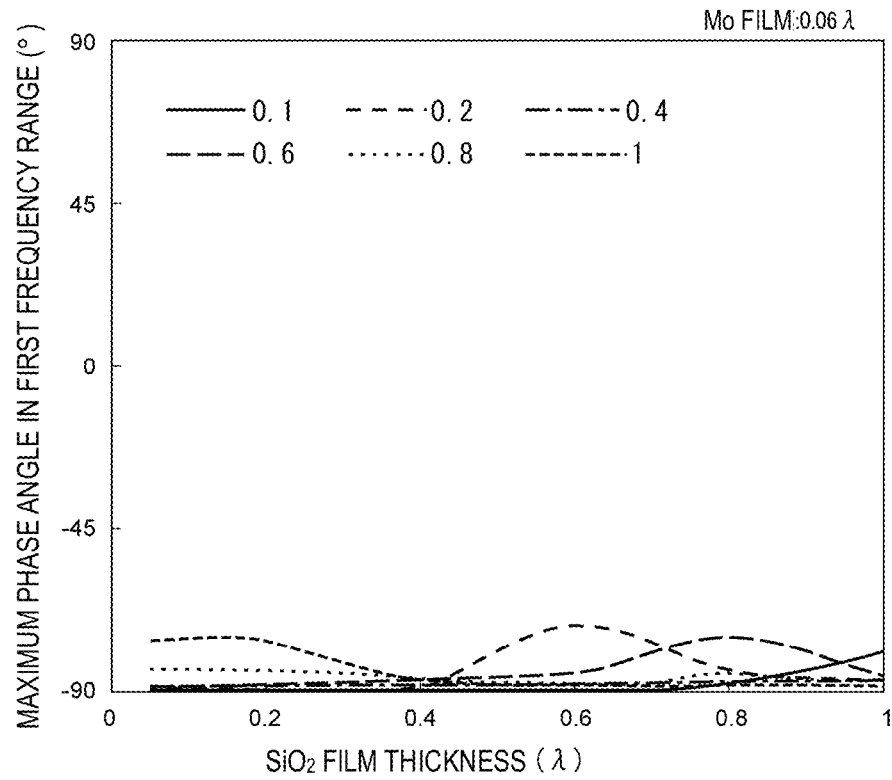
FIG. 35A is a diagram illustrating the phase characteristics in the first frequency range when the IDT electrode is made of a Mo film having a thickness of 0.06λ
Figure 35B:
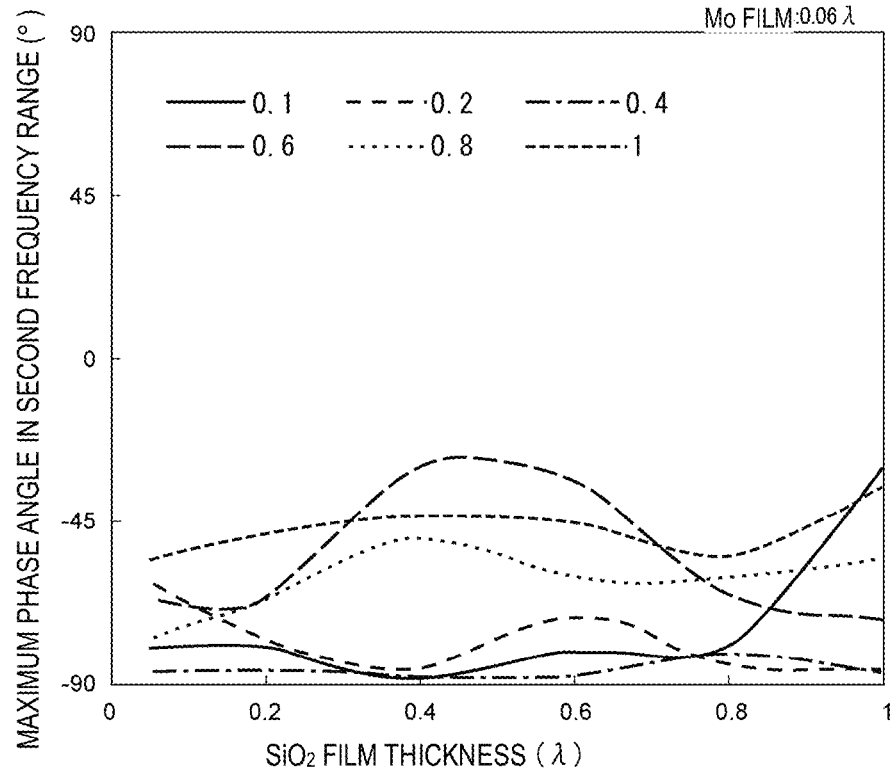
FIG. 35B is a diagram illustrating the phase characteristics in the second frequency range in that case.
Figure 36A:
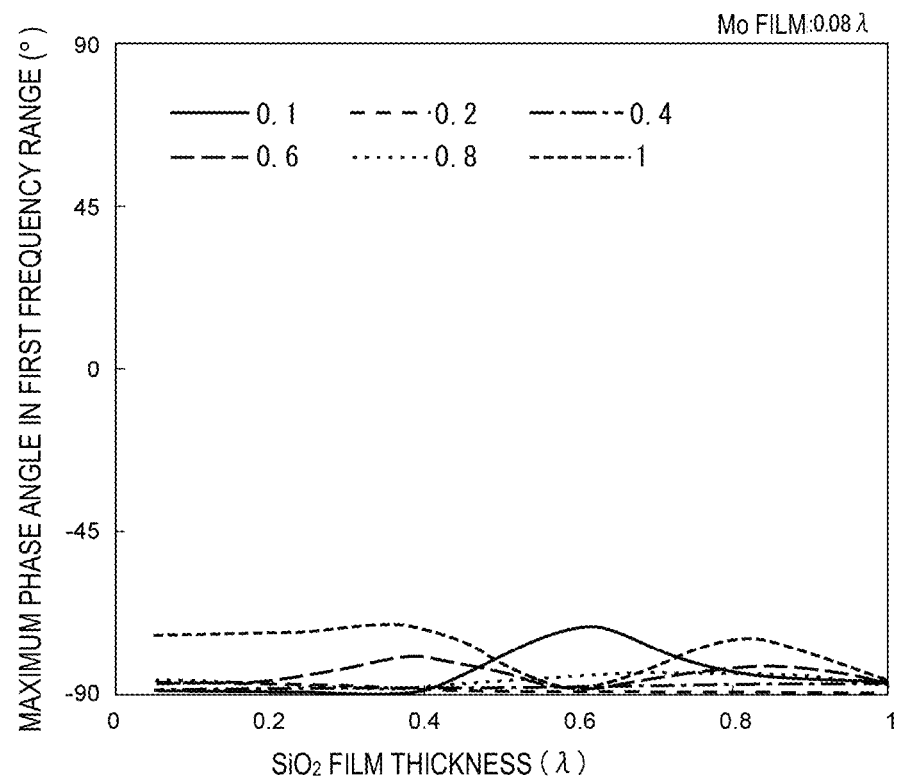
FIG. 36A is a diagram illustrating the phase characteristics in the first frequency range when the IDT electrode is made of a Mo film having a thickness of 0.08λ
Figure 36B:
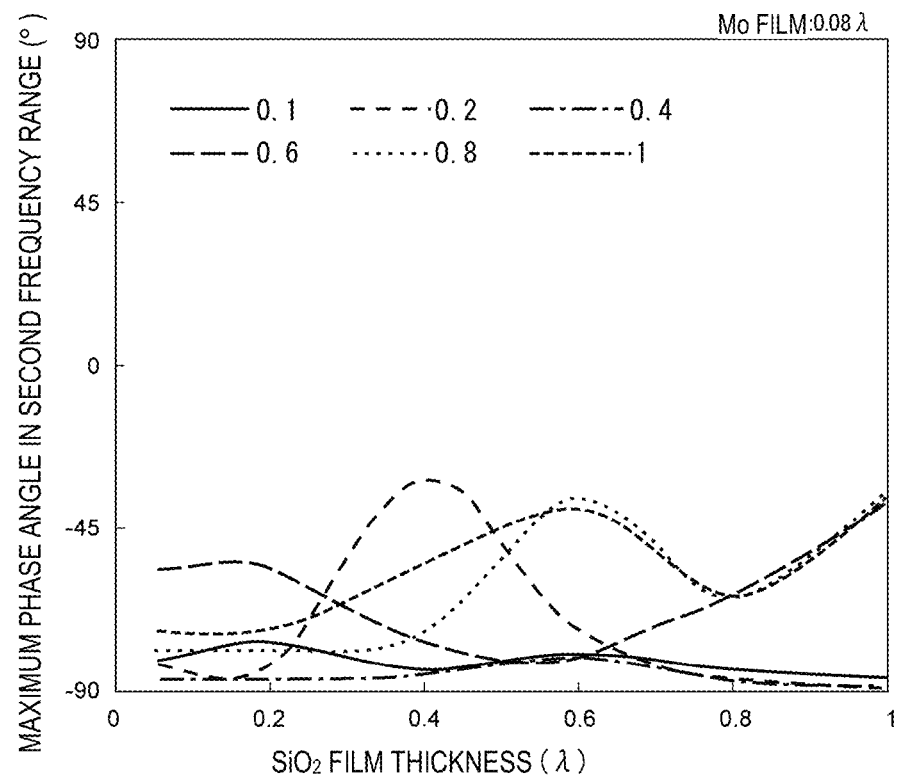
FIG. 36B is a diagram illustrating the phase characteristics in the second frequency range in that case.
Figure 37A:
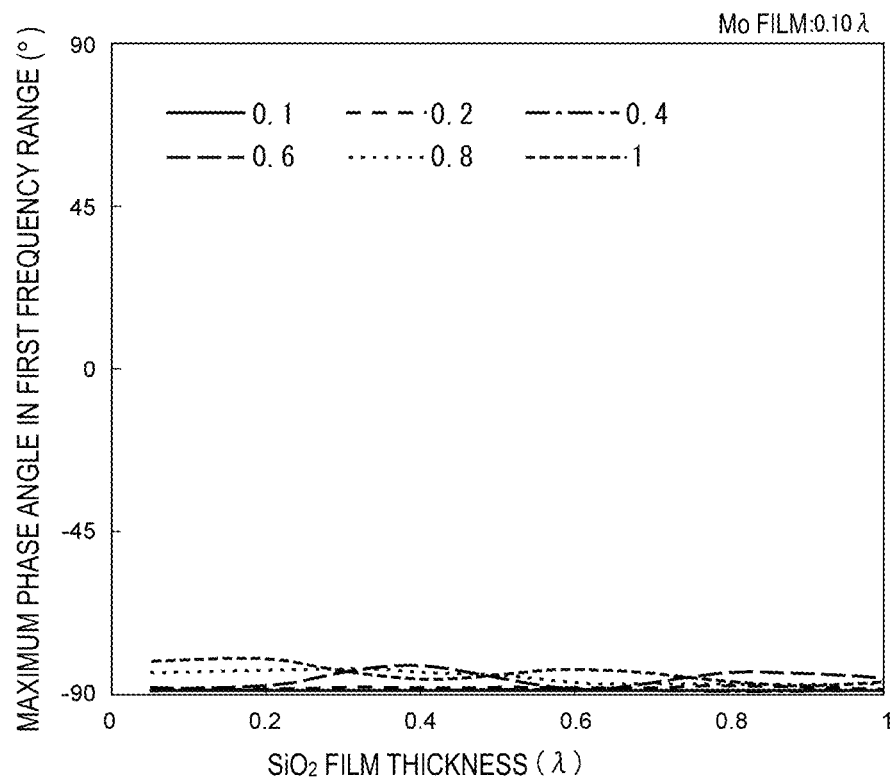
FIG. 37A is a diagram illustrating the phase characteristics in the first frequency range when the IDT electrode is made of a Mo film having a thickness of 0.10λ
Figure 37B:
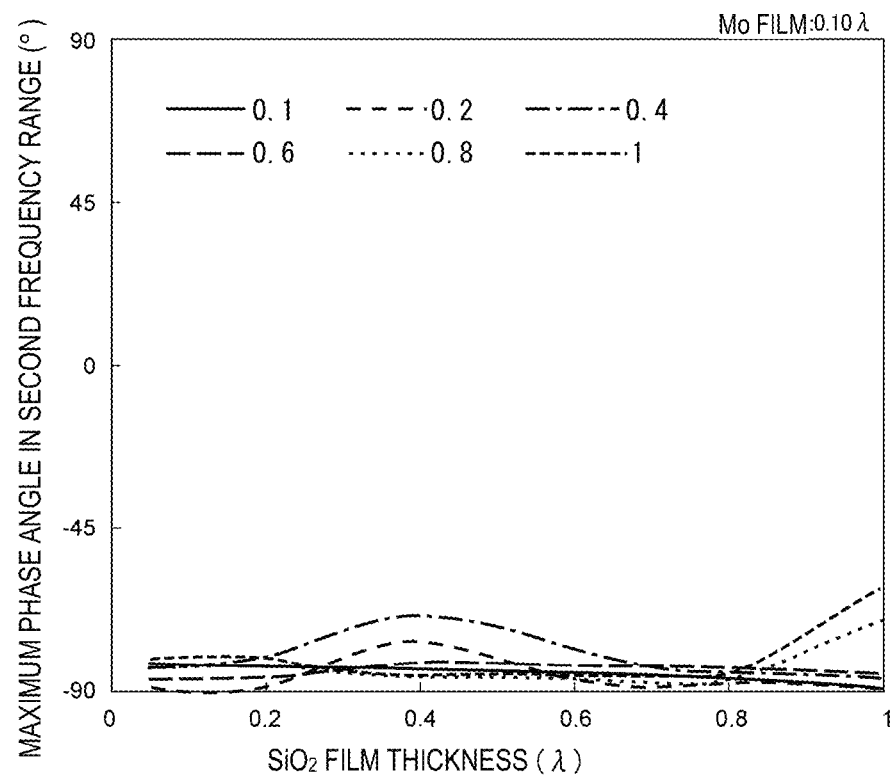
FIG. 37B is a diagram illustrating the phase characteristics in the second frequency range in that case.
Figure 38A:
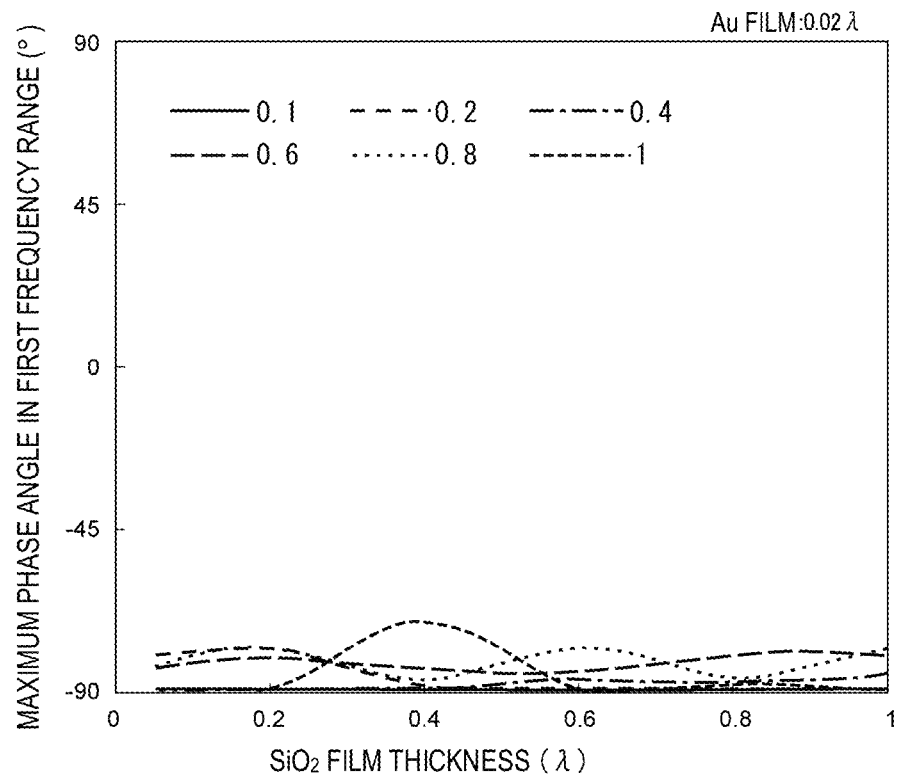
FIG. 38A is a diagram illustrating the phase characteristics in the first frequency range when the IDT electrode is made of an Au film having a thickness of 0.02λ
Figure 38B:
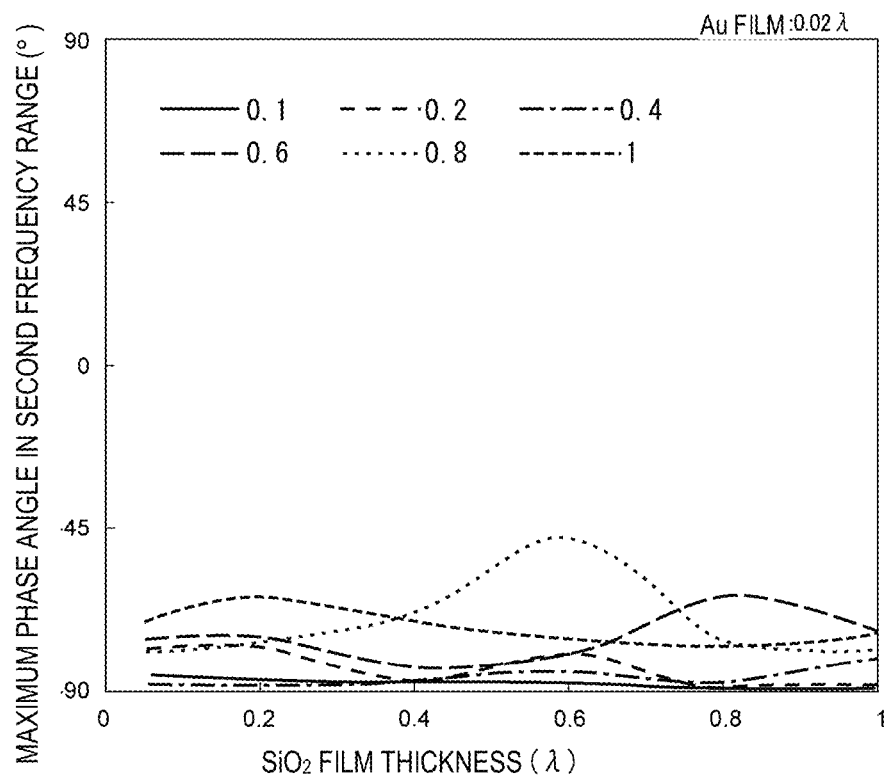
FIG. 38B is a diagram illustrating the phase characteristics in the second frequency range in that case.
Figure 39A:
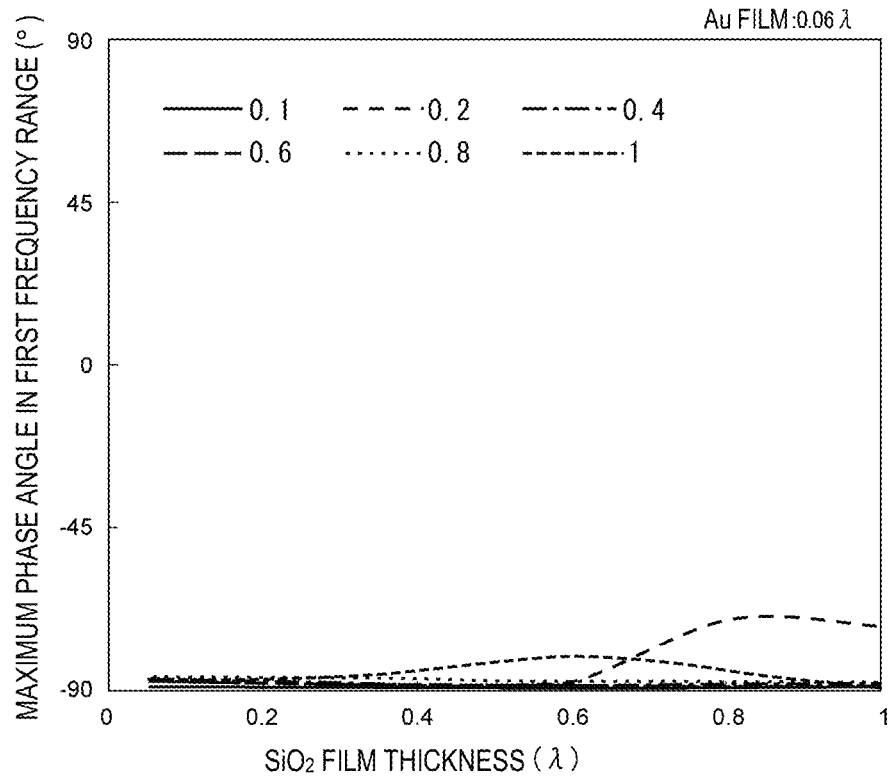
FIG. 39A is a diagram illustrating the phase characteristics in the first frequency range when the IDT electrode is made of an Au film having a thickness of 0.06λ
Figure 39B:
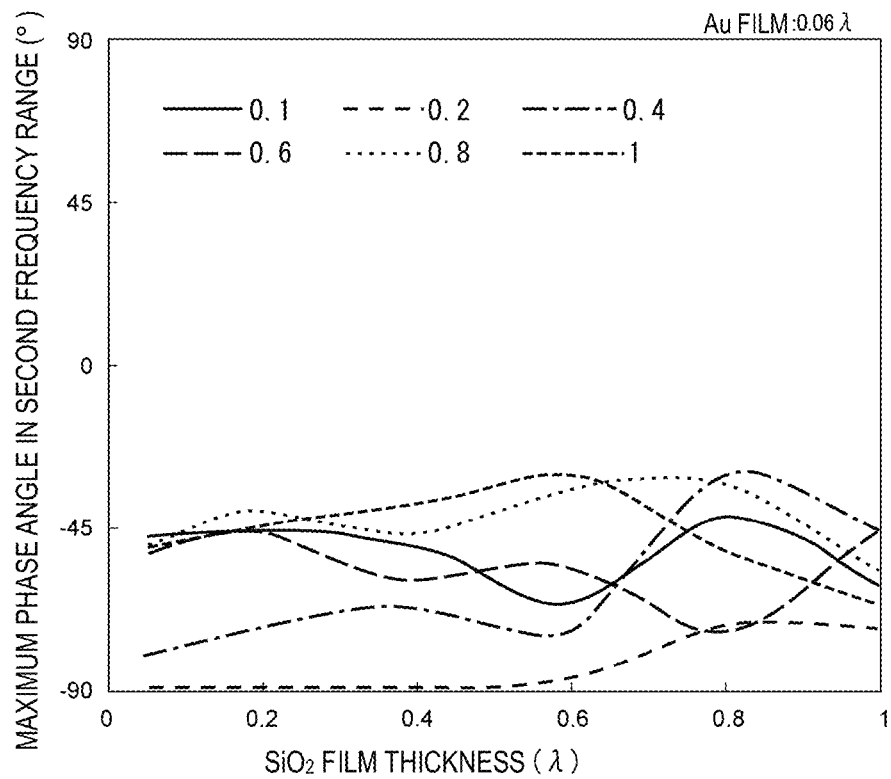
FIG. 39B is a diagram illustrating the phase characteristics in the second frequency range in that case.
Figure 40A:
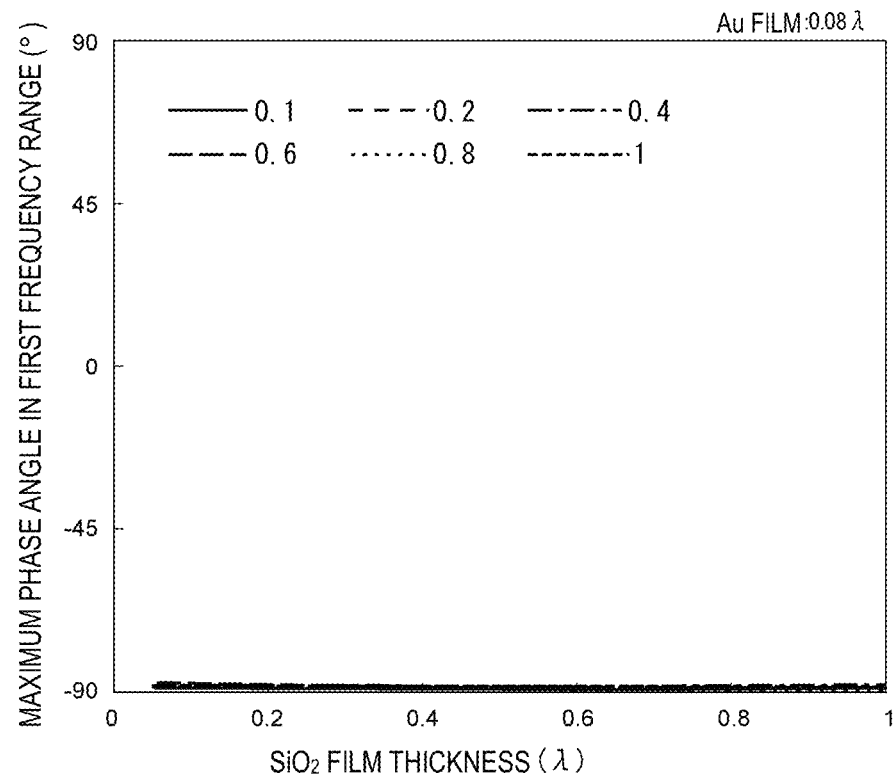
FIG. 40A is a diagram illustrating the phase characteristics in the first frequency range when the IDT electrode is made of an Au film having a thickness of 0.08λ
Figure 40B:
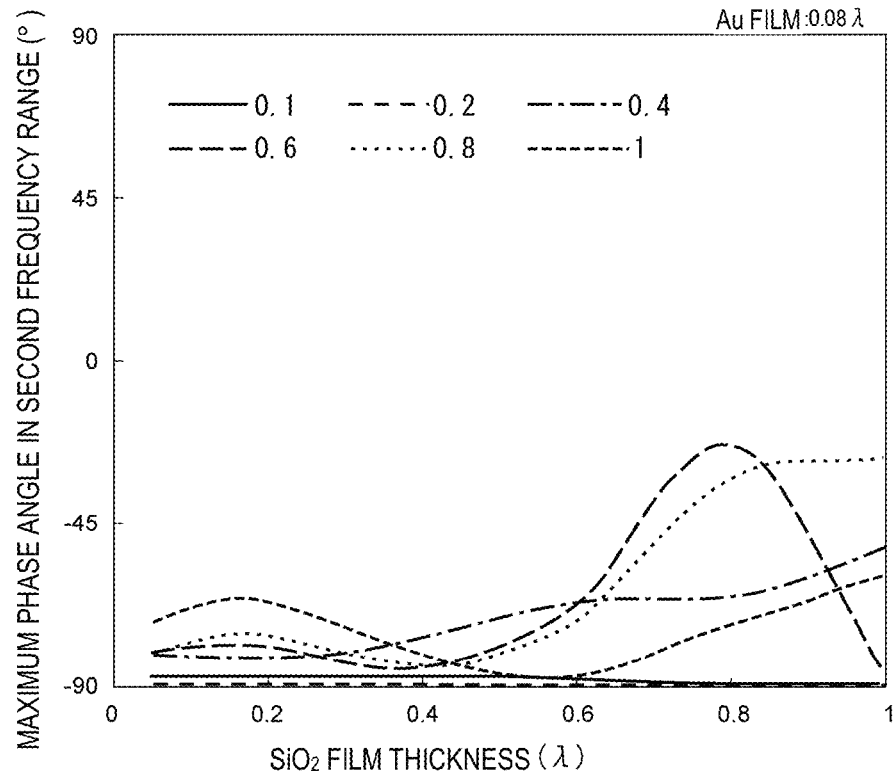
FIG. 40B is a diagram illustrating the phase characteristics in the second frequency range in that case.
Figure 41A:
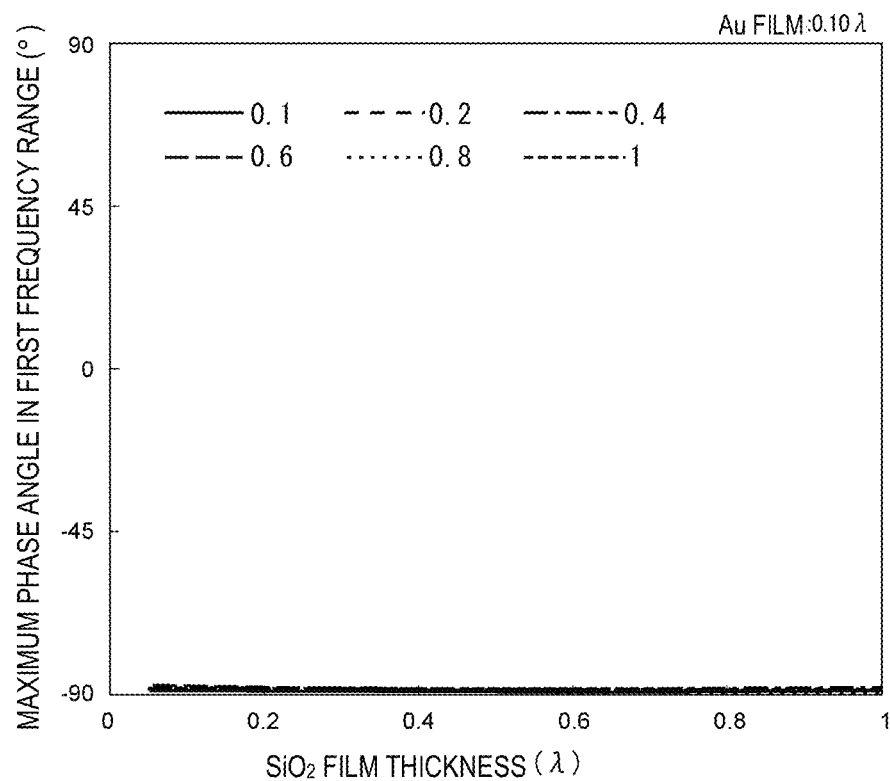
FIG. 41A is a diagram illustrating the phase characteristics in the first frequency range when the IDT electrode is made of an Au film having a thickness of 0.10λ
Figure 41B:
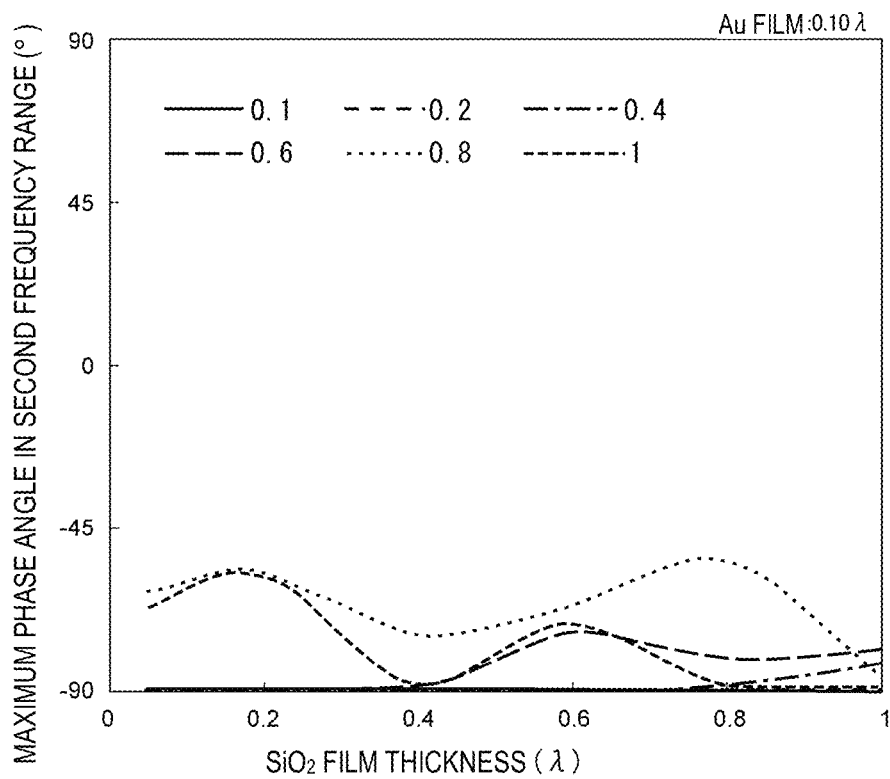
FIG. 41B is a diagram illustrating the phase characteristics in the second frequency range in that case.

As illustrated in FIGS. 17A and 17B, in the case where the IDT electrode 14 is made of a Pt film, there is no significant spurious generated in the range from Fr to 2.0 Fr. On the other hand, a spurious response with a maximum phase angle of about −85° is generated in the vicinity of about 5.5 GHz, but since this spurious response is very small, the resulting effect may be ignored. Furthermore, spurious components with maximum phase angles of about −5° and about −25° are generated in the vicinity of about 6.8 GHz (2.7 Fr) and about 7.7 GHz (3 Fr), but since these spurious components are located at positions sufficiently isolated from the response of the main mode and are small, these spurious components will not affect the other band pass filter.

Furthermore, as illustrated in FIGS. 18A and 18B to 21A and 21B, similarly, spurious responses are sufficiently reduced or prevented or is sufficiently isolated from the response of the main mode in the cases where the IDT electrode 14 is made of other metal films.

As is clear from the results in FIGS. 17A and 17B to 21A and 21B, in the thus-designed acoustic wave resonator, it is clear that a spurious response generated at a higher frequency than the frequency of the main mode is reduced or prevented or is sufficiently isolated from the frequency of the main mode regardless of the material of the IDT electrode 14.

Next, the phase characteristics present when the thicknesses of the IDT electrode 14, the LiNbO₃ film, and the SiO₂ film were changed in the thus-designed acoustic wave resonator were obtained.

FIGS. 22A to 41A are diagrams illustrating the phase characteristics in a first frequency range and FIG. 22B to 41B are diagrams illustrating the phase characteristics in a second frequency range.

FIGS. 22A and 22B to 25A and 25B illustrate results obtained when the IDT electrode 14 is a Pt film and the thickness of the Pt film is about 0.02λ, about 0.06λ, about 0.08λ, and about 0.10λ in this order. FIGS. 26A and 26B to 29A and 29B illustrate results obtained when the IDT electrode 14 is an Al film and the thickness of the Al film is about 0.02λ, about 0.06λ, about 0.08λ, and about 0.10λ in this order. FIGS. 30A and 30B to 33A and 33B illustrate results obtained when the IDT electrode 14 is a Cu film and the thickness of the Cu film is about 0.02λ, about 0.06λ, about 0.08λ, and about 0.10λ in this order. FIGS. 34A and 34B to 37A and 37B illustrate results obtained when the IDT electrode 14 is a Mo film and the thickness of the Mo film is about 0.02λ, about 0.06λ, about 0.08λ, and about 0.10λ in this order. FIGS. 38A and 38B to 41A and 41B illustrate results obtained when the IDT electrode 14 is an Au film and the thickness of the Au film is about 0.02λ, about 0.06λ, about 0.08λ, and about 0.10λ in this order. In FIGS. 22A and 22B to 41A and 41B, the thickness of the SiO₂ film is changed within a range from about 0.05λ to about 1.0λ (1.0 is written as 1 in the figures) for cases where the thickness of the LiNbO₃ film is about 0.1λ, about 0.2λ, about 0.4λ, about 0.6λ, about 0.8λ, and about 1λ. The type of IDT electrode 14 used is indicated at the top right in FIGS. 22A and 22B to 41A and 41B.

Furthermore, the first frequency range is a range from Fr to 1.5 Fr. The second frequency range is a range from Fr to 2.0 Fr.

As illustrated in FIGS. 22A and 22B to 41A and 41B, it is clear that the maximum phase angle is less than or equal to 0° when the thickness of the SiO₂ film lies within a range from about 0.05, to about 1.0λ in the case where the thickness of the IDT electrode 14 lies within a range from about 0.02λ to about 0.10λ and the thickness of the LiNbO₃ film lies within a range from about 0.1λ to about 1.0λ. In addition, as illustrated in FIGS. 22A and 22B to 41A and 41B, this result was independent of the material of the IDT electrode 14.

Next, for the structure illustrated in FIG. 16, the following acoustic wave resonator using a multilayer electrode was designed and the phase characteristics thereof were obtained:

support substrate 12 . . . Si substrate
low-acoustic-velocity material layer 22: SiO₂ film, thickness: about 0.2λ
piezoelectric body 13 . . . LiNbO₃ film, Euler angles (0°, 34°, 0°), thickness: about 0.2λ
IDT electrode 14 . . . duty ratio: about 0.50, number of electrode fingers of IDT electrode 14: 201 (100 pairs), electrode finger crossing width: about 15λ, number of electrode fingers of reflectors 15 and 16: 21 (10 pairs)
materials of IDT electrode 14 . . . multilayer metal film in which Al film (thickness: about 0.1λ) is stacked on Pt film (thickness: about 0.1λ)
utilized acoustic waves . . . Rayleigh waves
λ is a wavelength determined by the electrode finger pitch of the IDT electrode 14 and λ=about 1.7 µm.

Figure 42:
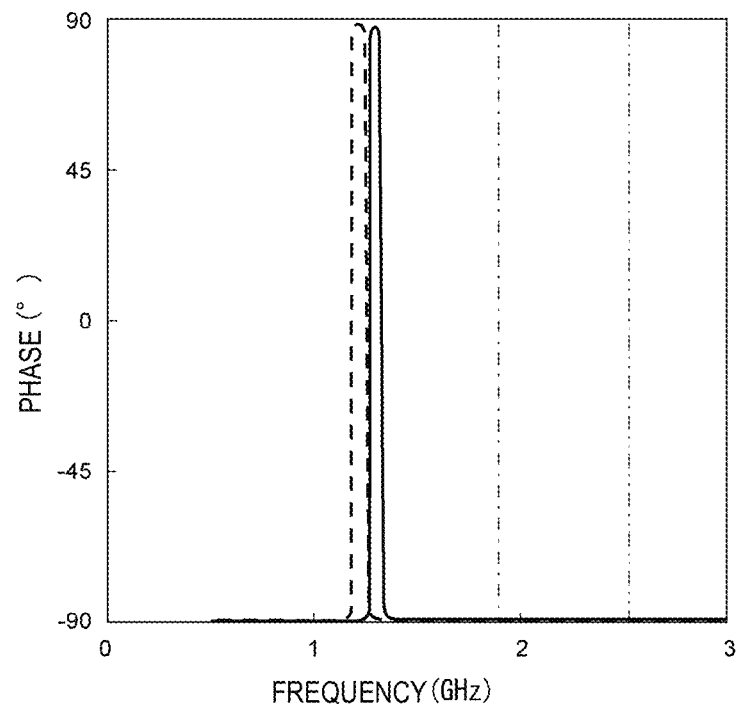
FIG. 42 is a diagram illustrating the phase characteristics in the case where a multilayer metal film is used as the IDT electrode.

FIG. 42 is a diagram illustrating the phase characteristics in a case where the multilayer metal film is used as the IDT electrode. In FIG. 42, the results obtained in the case where a multilayer metal film is used are illustrated using a dashed line and the results obtained when a single layer Pt film is used rather than a multilayer metal film are illustrated using a solid line. Furthermore, in FIG. 42, a one-dot chain line indicates a frequency that is about 1.5 times Fr (1.5 Fr) and the two-dot chain line indicates a frequency that is about 2.0 times Fr (2.0 Fr). Fr is the resonant frequency of the main mode when a single layer Pt film is used.

As illustrated in FIG. 42, in the case where the multilayer metal film is used, the resonant frequency of the main mode is shifted slightly toward the low frequency side due to a mass load effect. However, there is no change in how spurious responses are generated. It is clear from this result that loss due to the resistance of the electrode fingers is able to be improved without causing large spurious responses to be generated by stacking a material having a low resistance such as Al on a Pt film.

Next, the phase characteristics present when the Euler angle θ of the Euler angles (0°, θ, 0°) was changed was obtained. Specifically, for the structure illustrated in FIG. 16, the following acoustic wave resonator was designed and the phase characteristics thereof were obtained:

support substrate 12 . . . Si substrate
low-acoustic-velocity material layer 22: SiO$_2$ film, thickness: about 0.2λ
piezoelectric body 13 . . . LiNbO$_3$ film, Euler angles (0°, θ, 0°), thickness: about 0.2λ
IDT electrode 14 . . . duty ratio: about 0.50, number of electrode fingers of IDT electrode 14: 201 (100 pairs), electrode finger crossing width: about 15λ, number of electrode fingers of reflectors 15 and 16: 21 (10 pairs)
material of IDT electrode 14 . . . Pt film (thickness: about 0.09λ)
utilized acoustic waves . . . Rayleigh waves
λ is a wavelength determined by the electrode finger pitch of the IDT electrode 14 and λ=about 1.0 μm.

The phase characteristics were obtained while changing the Euler angle θ in the thus-designed acoustic wave resonator.

FIGS. 44 to 48 are diagrams illustrating the phase characteristics when the Euler angle is changed in each figure. In FIGS. 44 to 48, the Euler angle θ is θ=about 28°, θ=about 30°, θ=about 34°, θ=about 38°, and θ=about 40°, in this order. The Euler angle θ is indicated at the top right in FIGS. 44 to 48.

As illustrated in FIGS. 44 to 48, it is clear that the maximum phase angle of spurious caused by SH waves (spurious at lower frequency than resonant frequency of main mode) can be reduced so as to be less than or equal to 0° when the Euler angle θ lies within a range from about 30° to about 38°.

Figure 43:
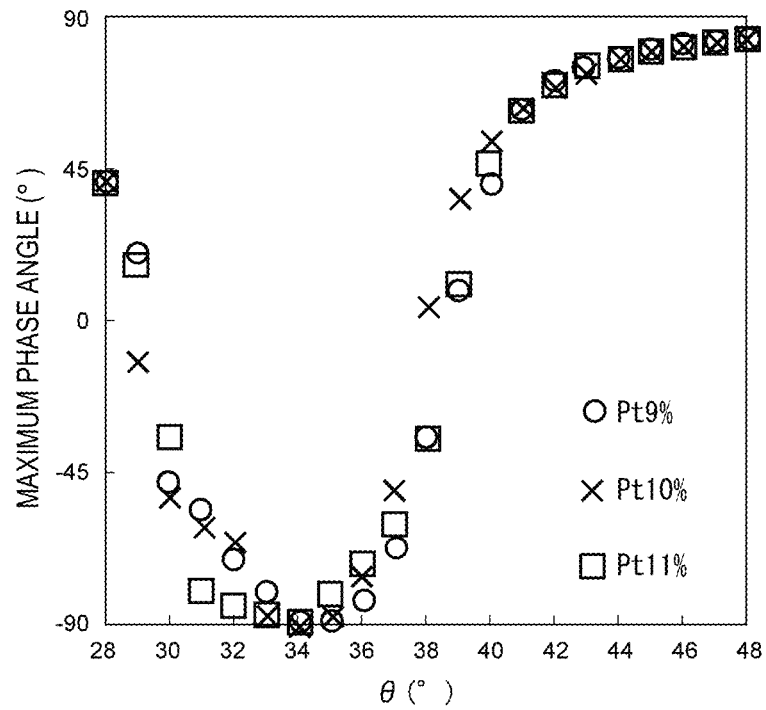
FIG. 43 is a diagram illustrating the maximum phase angle of spurious responses caused by SH waves when the Euler angle $\theta$ is changed in the case where the thickness of the IDT electrode is in a range from about 0.09λ to about 0.11λ.
Figure 44:
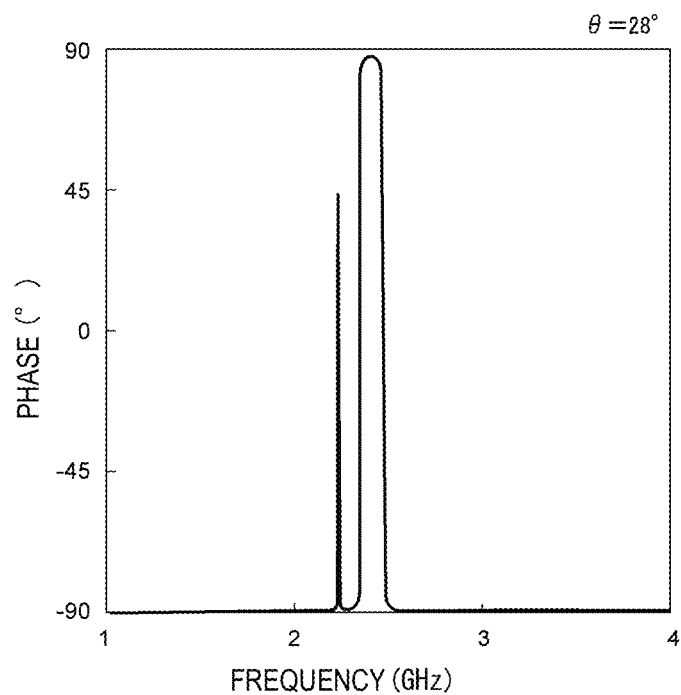
FIG. 44 is a diagram illustrating the phase characteristics when the Euler angle $\theta$ is about 28°.
Figure 45:
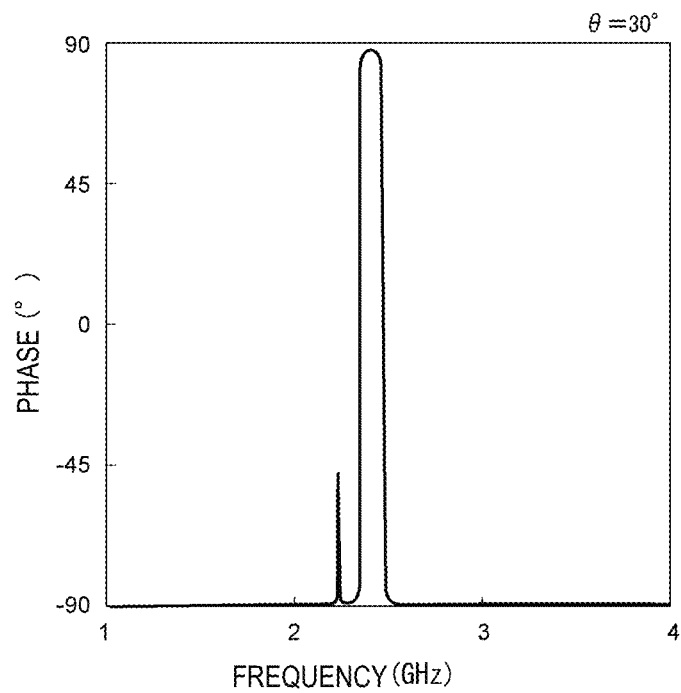
FIG. 45 is a diagram illustrating the phase characteristics when the Euler angle $\theta$ is about 30°.
Figure 46:
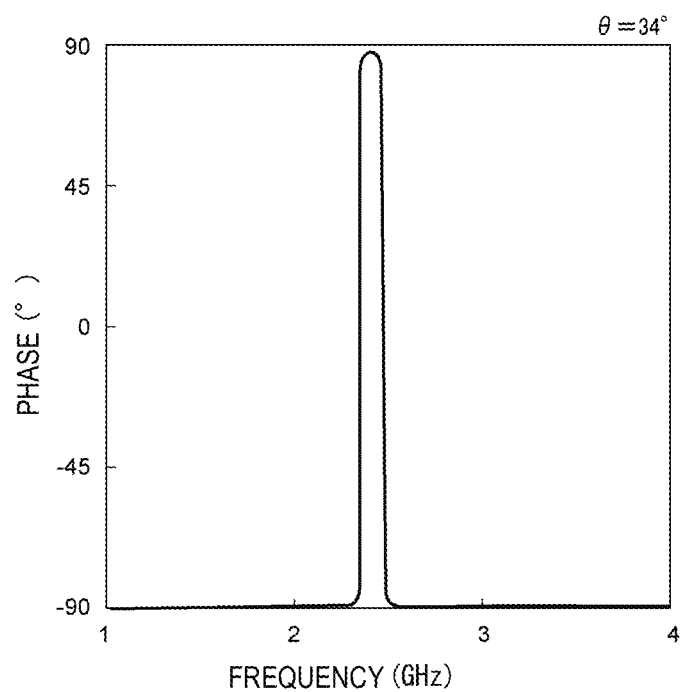
FIG. 46 is a diagram illustrating the phase characteristics when the Euler angle $\theta$ is about 34°.
Figure 47:
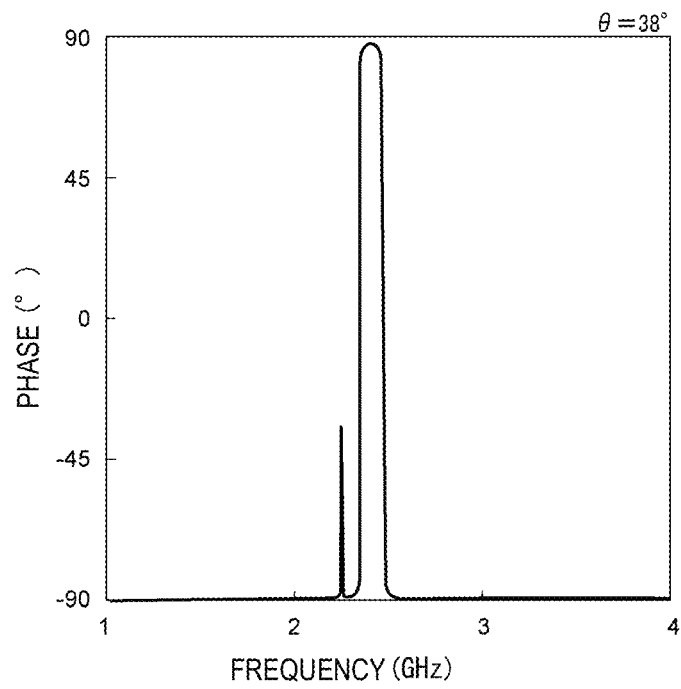
FIG. 47 is a diagram illustrating the phase characteristics when the Euler angle $\theta$ is about 38°.
Figure 48:
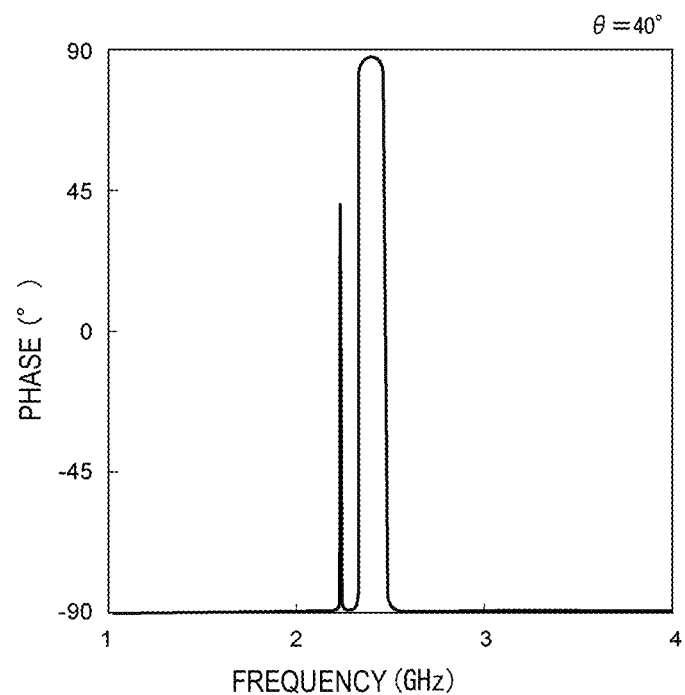
FIG. 48 is a diagram illustrating the phase characteristics when the Euler angle $\theta$ is about 40°.

In addition, FIG. 43 is a diagram illustrating the maximum phase angle of spurious caused by SH waves when the Euler angle θ is changed in the case where the thickness of the IDT electrode 14 lies within a range from about 0.09λ to about 0.11λ (Pt about 9%, Pt about 10%, Pt about 11%). As is clear from FIG. 43, the maximum phase angle of spurious responses caused by SH waves when the Euler angle θ lies within a range from about 30° to about 38° is able to be reduced so as to be less than or equal to 0° regardless of the thickness of the IDT electrode 14.

The maximum phase angle of spurious responses caused by SH waves is able to be reduced to be less than or equal to 0° regardless of the thickness of the LiNbO$_3$ film when the Euler angle θ lies within a range from about 30° to about 38° as will be described hereafter with reference to FIGS. 68 to 85.

Specifically, for the structure illustrated in FIG. 16, the following acoustic wave resonator was designed and the phase characteristics thereof were obtained:

support substrate 12 . . . Si substrate
low-acoustic-velocity material layer 22: SiO$_2$ film, thickness: about 0.2λ
piezoelectric body 13 . . . LiNbO$_3$ film, Euler angles (0°, θ, 0°), thickness: about 0.1λ-1.0λ
IDT electrode 14 . . . duty ratio: about 0.50, number of electrode fingers of IDT electrode 14: 201 (100 pairs), electrode finger crossing width: about 15λ, number of electrode fingers of reflectors 15 and 16: 21 (10 pairs)
material of IDT electrode 14 . . . Pt film (thickness: about 0.1λ)
utilized acoustic waves . . . Rayleigh waves
λ is a wavelength determined by the electrode finger pitch of the IDT electrode 14 and λ=about 1.0 μm.

The phase characteristics were obtained while changing the Euler angle θ in the thus-designed acoustic wave resonator.

FIGS. 68 to 85 are diagrams illustrating the phase characteristics obtained when the Euler angle θ and the thickness of the LiNbO$_3$ film are changed in each figure. In FIGS. 68 to 73, the Euler angle θ is about 30° and the thickness of the LiNbO$_3$ film is about 0.1λ, about 0.2λ, about 0.4λ, about 0.6λ, about 0.8λ, and about 1.0λ in this order. In FIGS. 74 to 79, the Euler angle θ is about 34° and the thickness of the LiNbO$_3$ film is about 0.1λ, about 0.2λ, about 0.4λ, about 0.6λ, about 0.8λ, and about 1.0λ in this order. In FIGS. 80 to 85, the Euler angle θ is about 38° and the thickness of the LiNbO$_3$ film is about 0.1λ, about 0.2λ, about 0.4λ, about 0.6λ, about 0.8λ, and about 1.0λ in this order. The thickness of the LiNbO$_3$ film (LN) is indicated at the top right in FIGS. 68 to 85.

As illustrated in FIGS. 68 to 85, it is clear that the maximum phase angle of spurious responses caused by SH waves (spurious response at lower frequency than resonant frequency of main mode) is able to be reduced so as to be less than or equal to 0° when the Euler angle θ lies within a range from about 30° to about 38° and the thickness of the LiNbO$_3$ film lies within a range from about 0.1λ to about 1.0λ.

In addition, although results for Euler angles (0°, θ, 0°) are illustrated in FIGS. 43 to 48 and 68 to 85, it may be confirmed that similar results are obtained in a range of Euler angles of (0°±5°, θ, 0°±10°).

Third Preferred Embodiment

Figure 49:
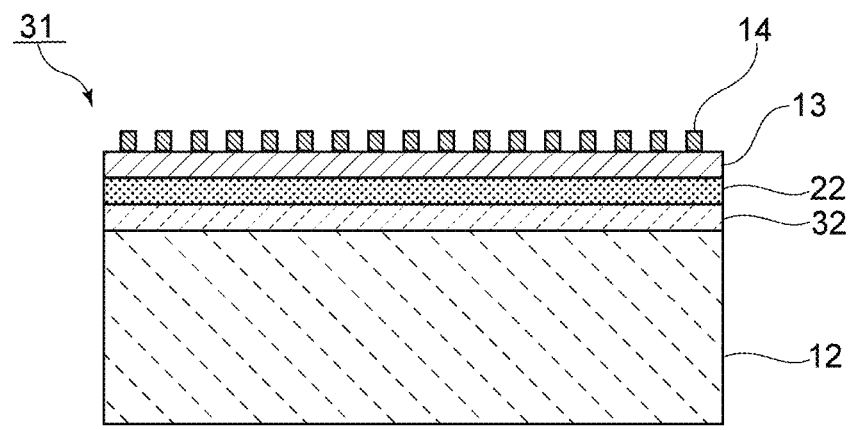
FIG. 49 is a schematic sectional view of an acoustic wave device defining a first band pass filter of a multiplexer according to a third preferred embodiment of the present invention.
Figure 50:
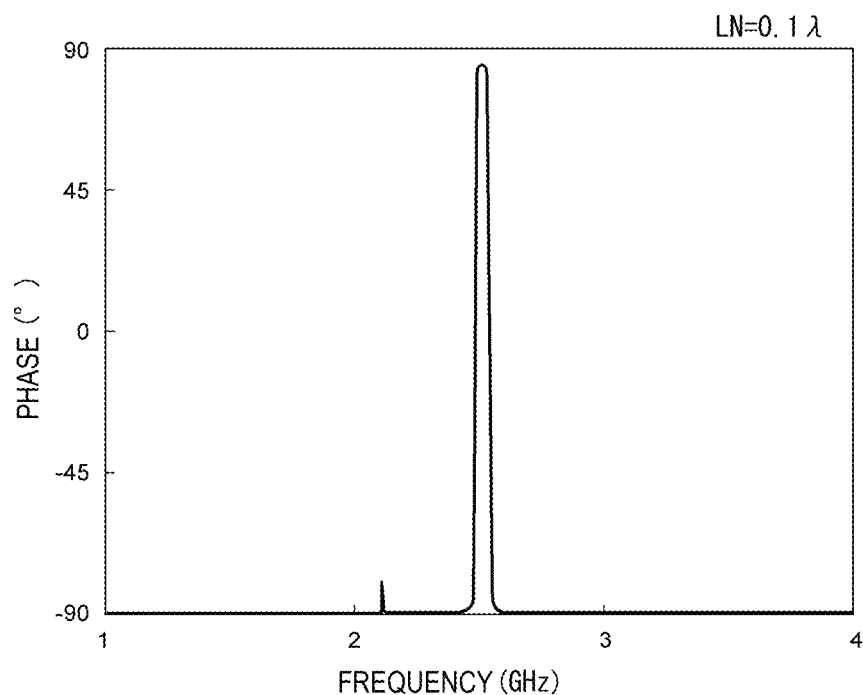
FIG. 50 is a diagram illustrating the phase characteristics when the Euler angle $\theta$ is about 30° and the thickness of the LiNbO$_3$ film is about 0.1λ.
Figure 51:
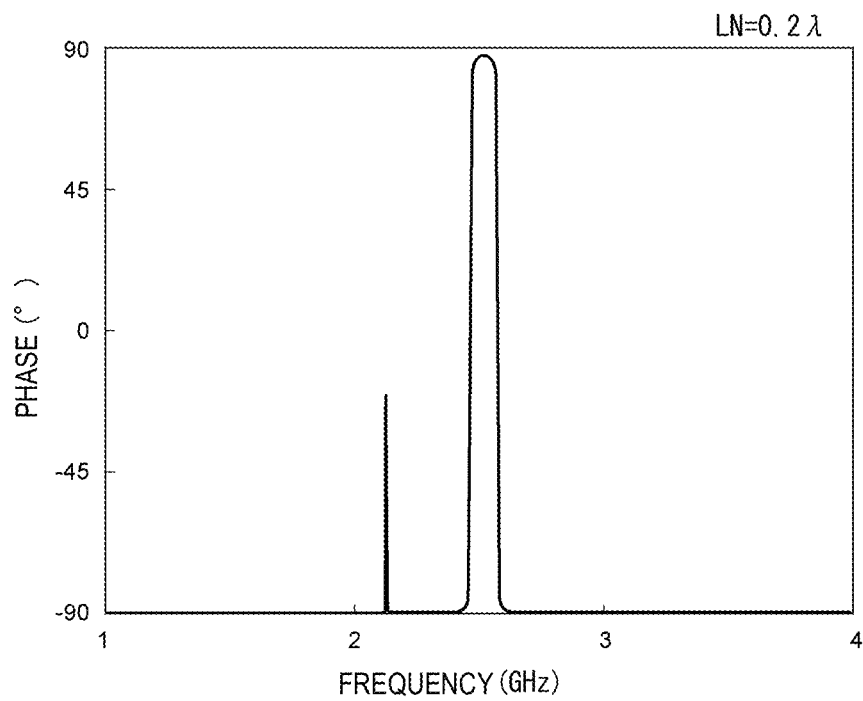
FIG. 51 is a diagram illustrating the phase characteristics when the Euler angle $\theta$ is about 30° and the thickness of the LiNbO$_3$ film is about 0.2λ.
Figure 52:
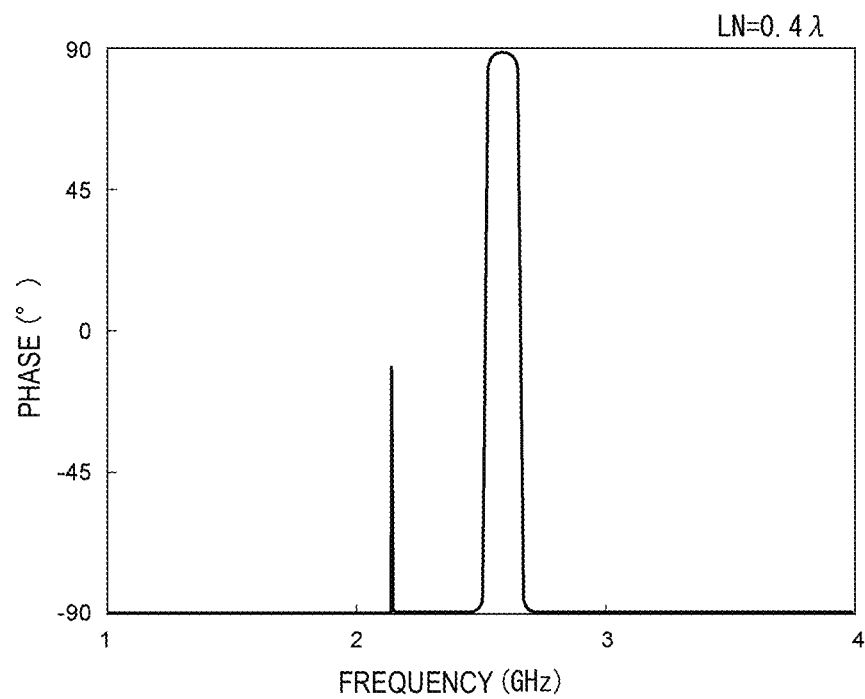
FIG. 52 is a diagram illustrating the phase characteristics when the Euler angle $\theta$ is about 30° and the thickness of the LiNbO$_3$ film is about 0.4λ.
Figure 53:
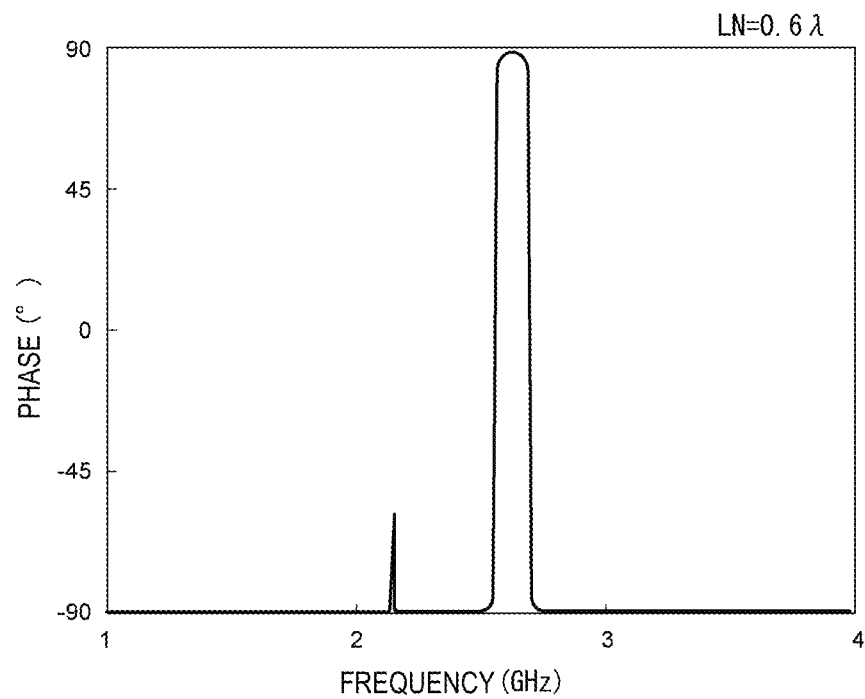
FIG. 53 is a diagram illustrating the phase characteristics when the Euler angle $\theta$ is about 30° and the thickness of the LiNbO$_3$ film is about 0.6λ.
Figure 54:
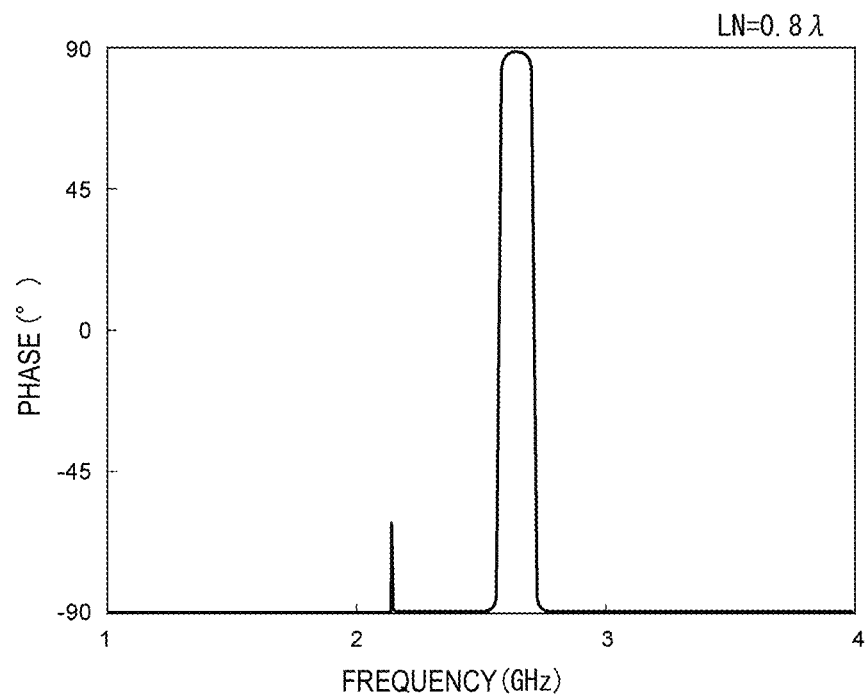
FIG. 54 is a diagram illustrating the phase characteristics when the Euler angle $\theta$ is about 30° and the thickness of the LiNbO$_3$ film is about 0.8λ.
Figure 55:
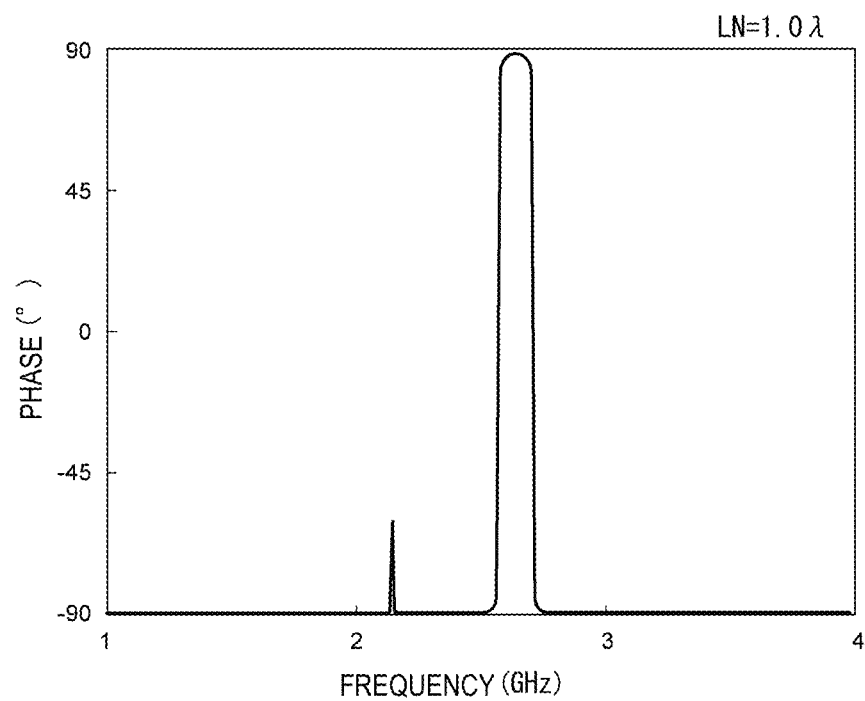
FIG. 55 is a diagram illustrating the phase characteristics when the Euler angle θ is about 30° and the thickness of the LiNbO$_3$ film is about 1.0λ.
Figure 56:
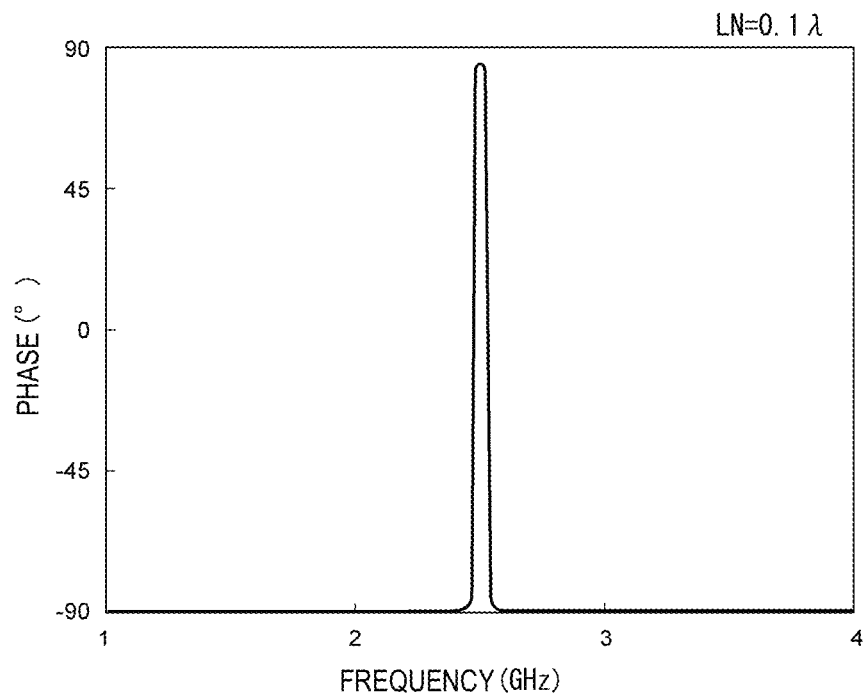
FIG. 56 is a diagram illustrating the phase characteristics when the Euler angle θ is about 34° and the thickness of the LiNbO$_3$ film is about 0.1λ.
Figure 57:
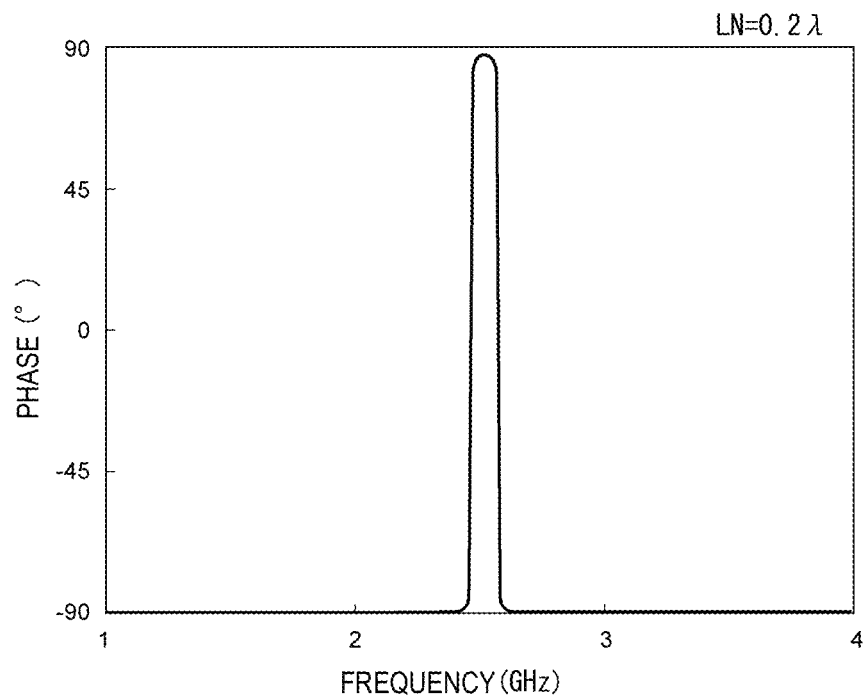
FIG. 57 is a diagram illustrating the phase characteristics when the Euler angle θ is about 34° and the thickness of the LiNbO$_3$ film is about 0.2λ.
Figure 58:
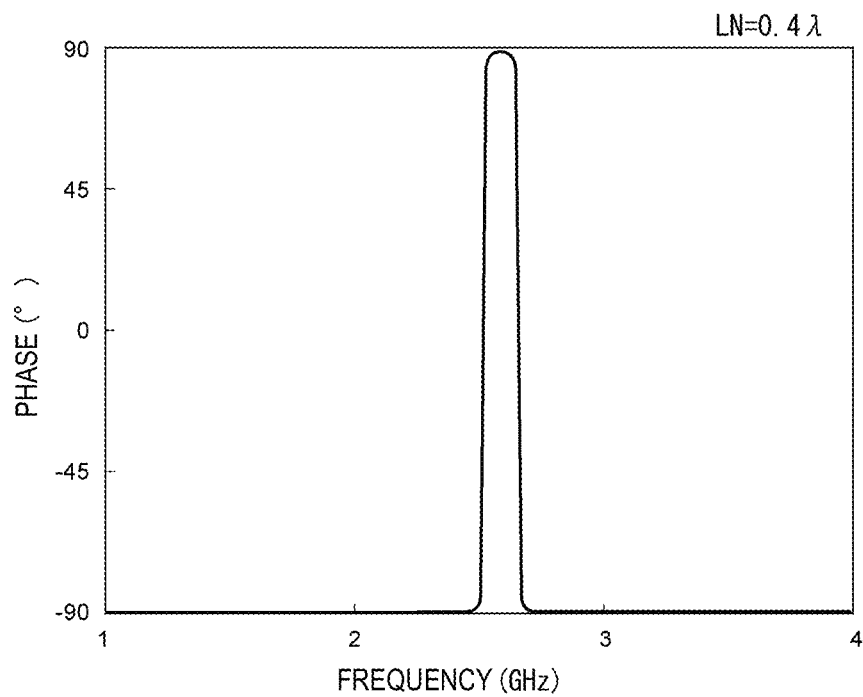
FIG. 58 is a diagram illustrating the phase characteristics when the Euler angle θ is about 34° and the thickness of the LiNbO$_3$ film is about 0.4λ.
Figure 59:
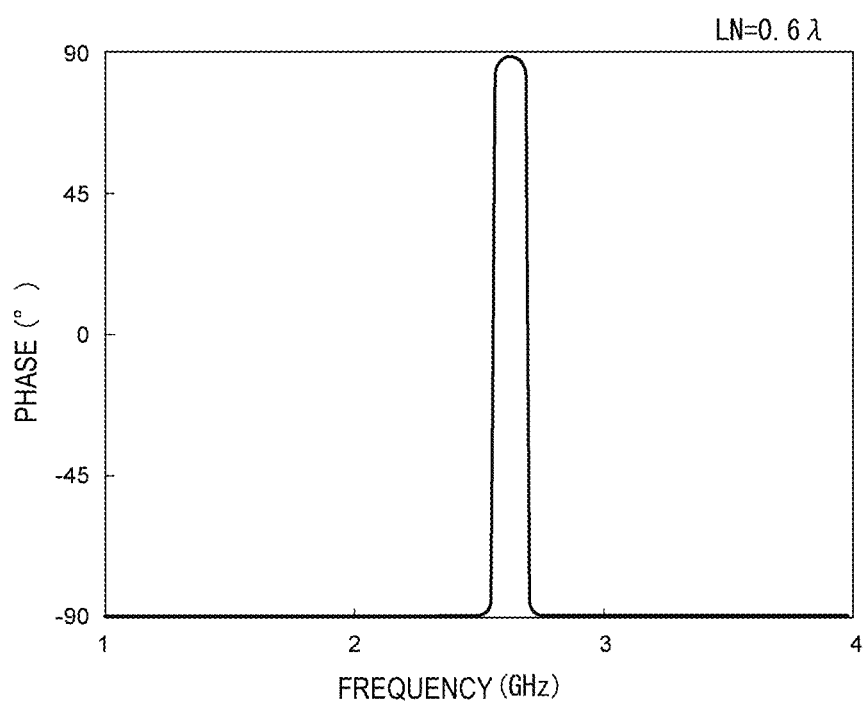
FIG. 59 is a diagram illustrating the phase characteristics when the Euler angle θ is about 34° and the thickness of the LiNbO$_3$ film is about 0.6λ.
Figure 60:
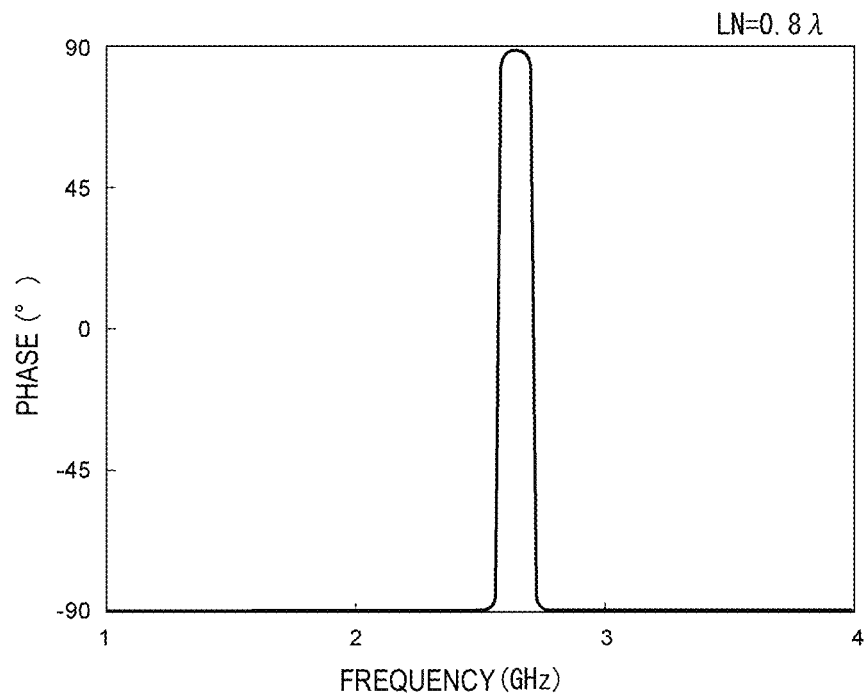
FIG. 60 is a diagram illustrating the phase characteristics when the Euler angle θ is about 34° and the thickness of the LiNbO$_3$ film is about 0.8λ.
Figure 61:
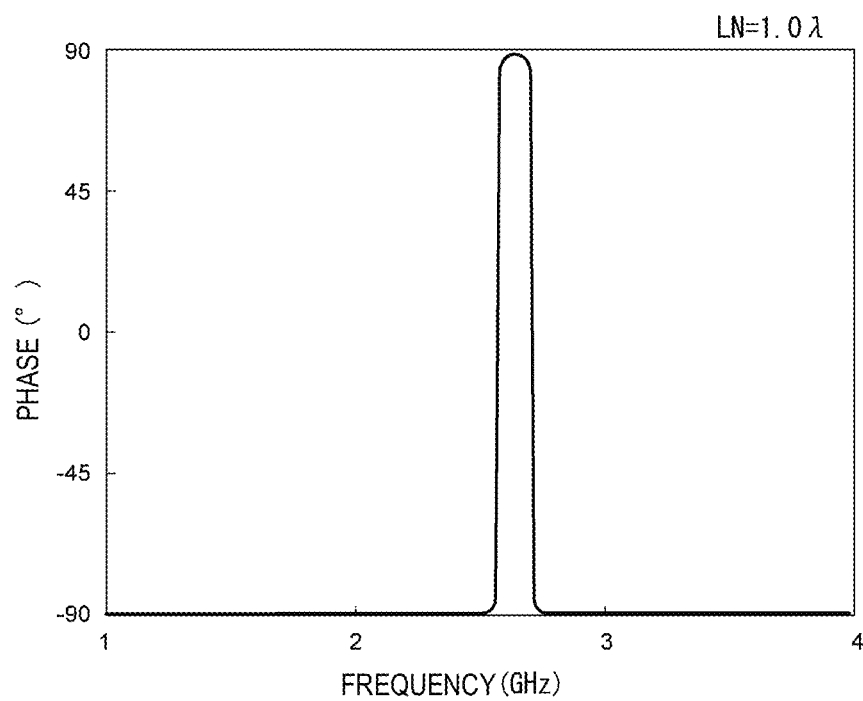
FIG. 61 is a diagram illustrating the phase characteristics when the Euler angle θ is about 34° and the thickness of the LiNbO$_3$ film is about 1.0λ.
Figure 62:
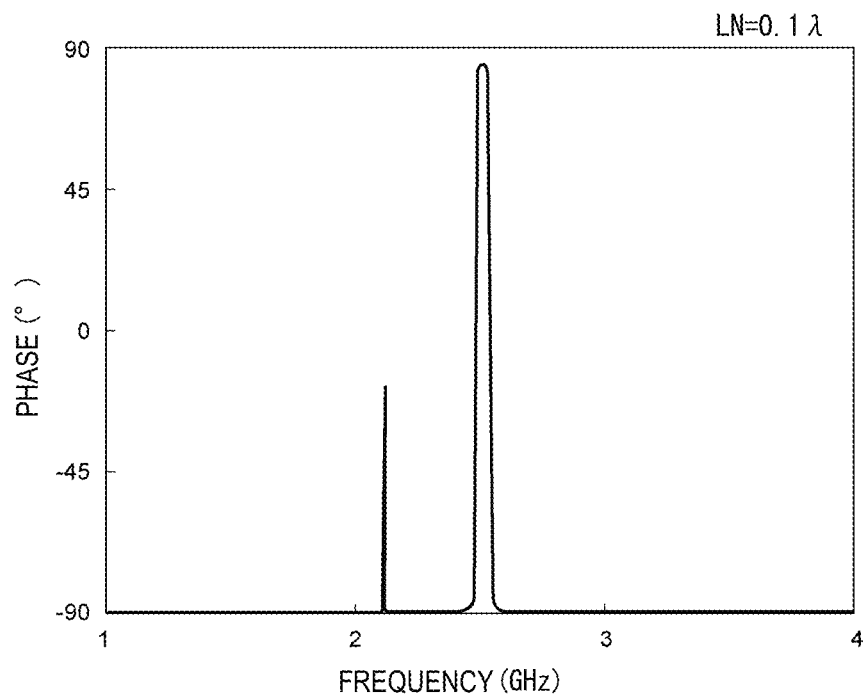
FIG. 62 is a diagram illustrating the phase characteristics when the Euler angle θ is about 38° and the thickness of the LiNbO$_3$ film is about 0.1λ.
Figure 63:
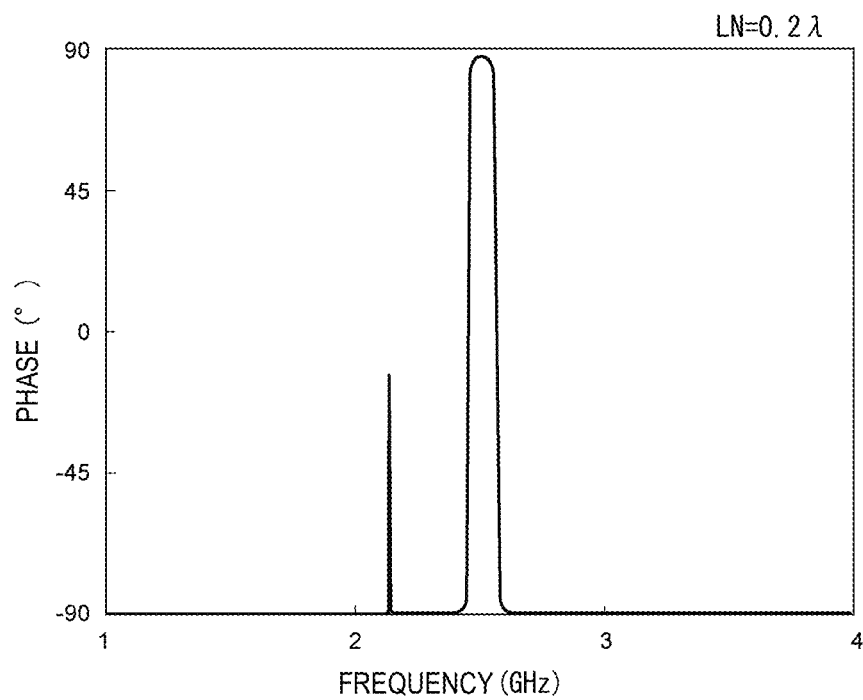
FIG. 63 is a diagram illustrating the phase characteristics when the Euler angle θ is about 38° and the thickness of the LiNbO$_3$ film is about 0.2λ.
Figure 64:
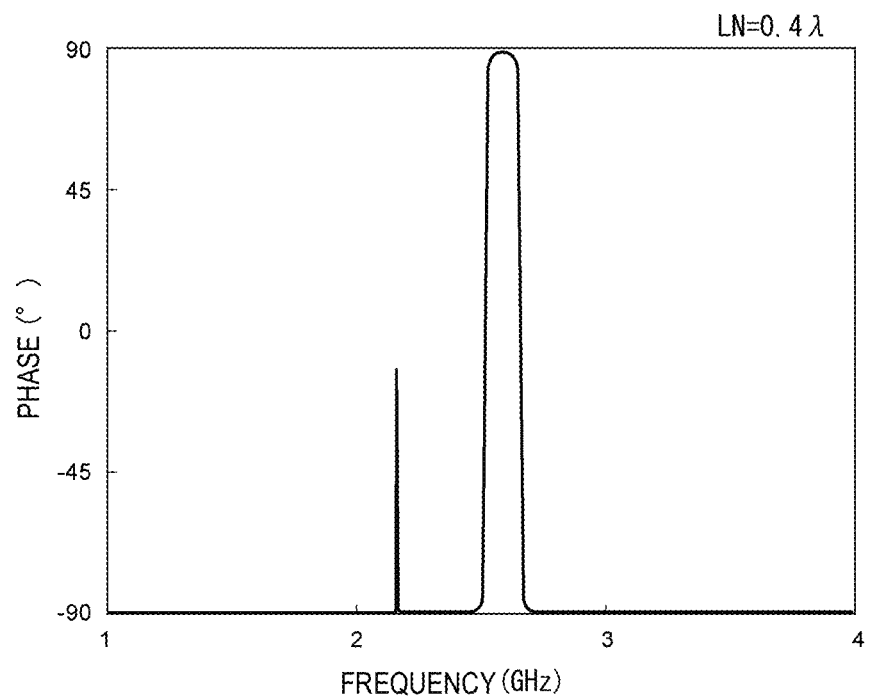
FIG. 64 is a diagram illustrating the phase characteristics when the Euler angle θ is about 38° and the thickness of the LiNbO$_3$ film is about 0.4λ.
Figure 65:
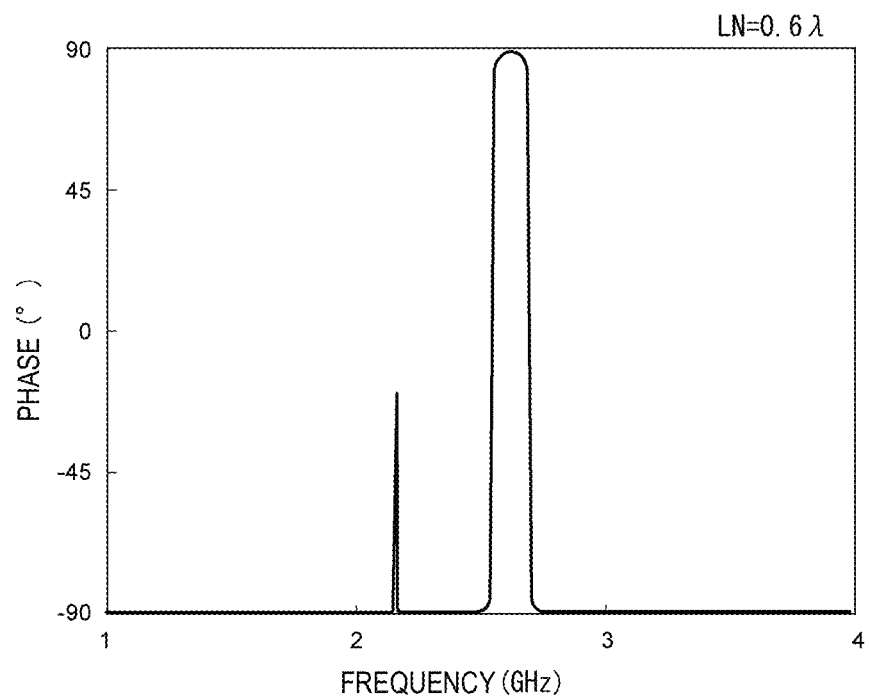
FIG. 65 is a diagram illustrating the phase characteristics when the Euler angle θ is about 38° and the thickness of the LiNbO$_3$ film is about 0.6λ.
Figure 66:
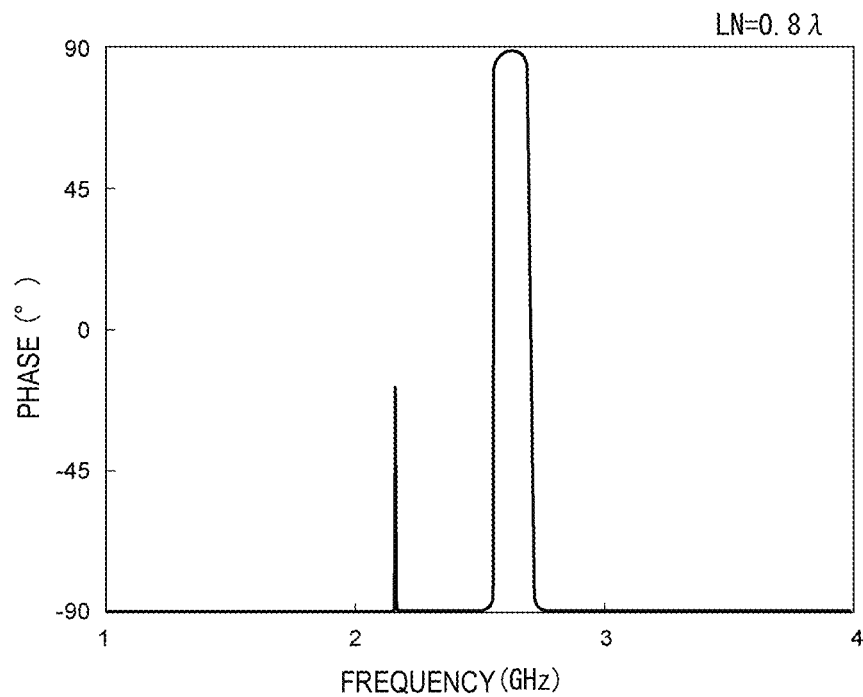
FIG. 66 is a diagram illustrating the phase characteristics when the Euler angle θ is about 38° and the thickness of the LiNbO$_3$ film is about 0.8λ.
Figure 67:
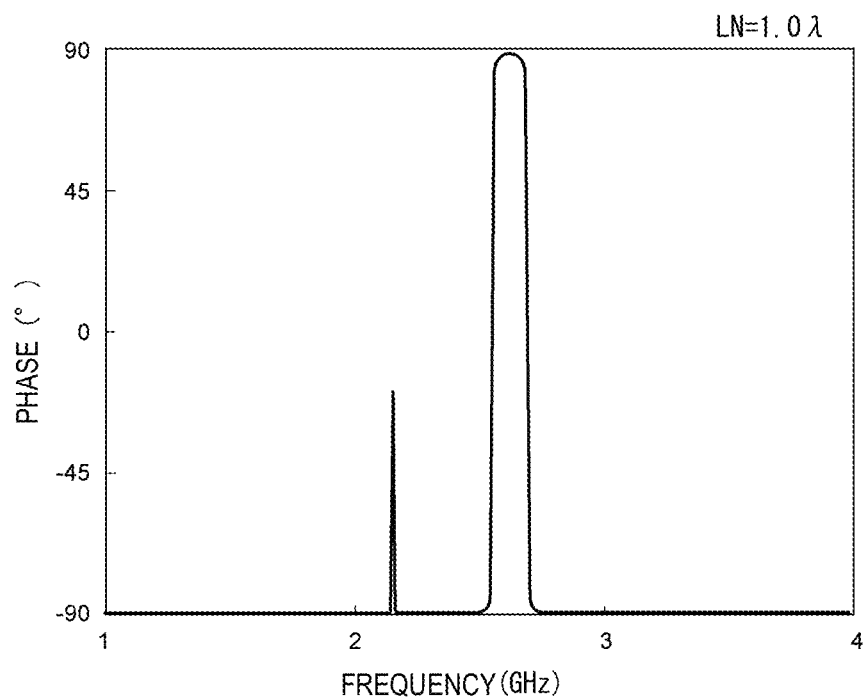
FIG. 67 is a diagram illustrating the phase characteristics when the Euler angle θ is about 38° and the thickness of the LiNbO$_3$ film is about 1.0λ.
Figure 68:
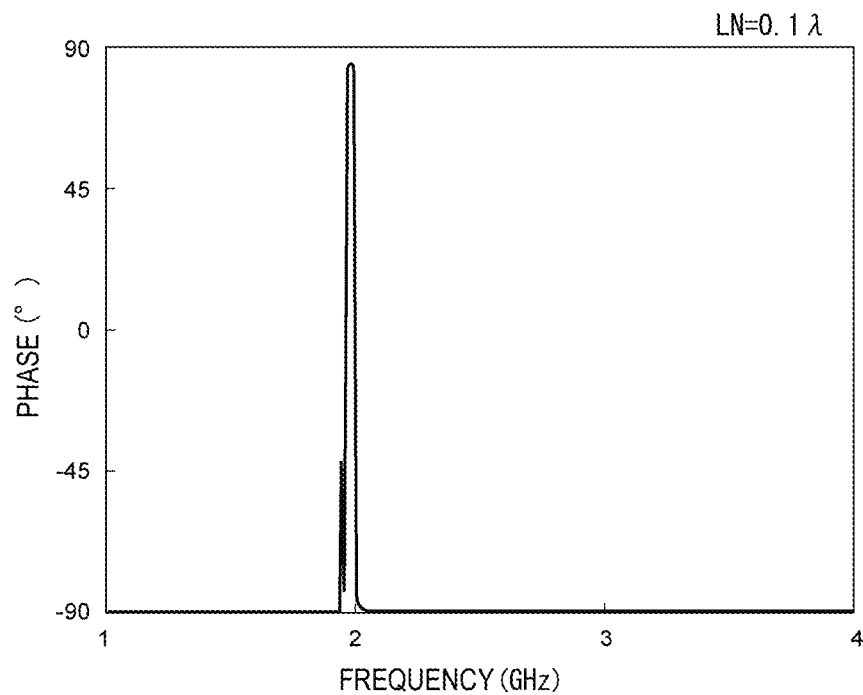
FIG. 68 is a diagram illustrating the phase characteristics when the Euler angle θ is about 30° and the thickness of the LiNbO$_3$ film is about 0.1λ.
Figure 69:
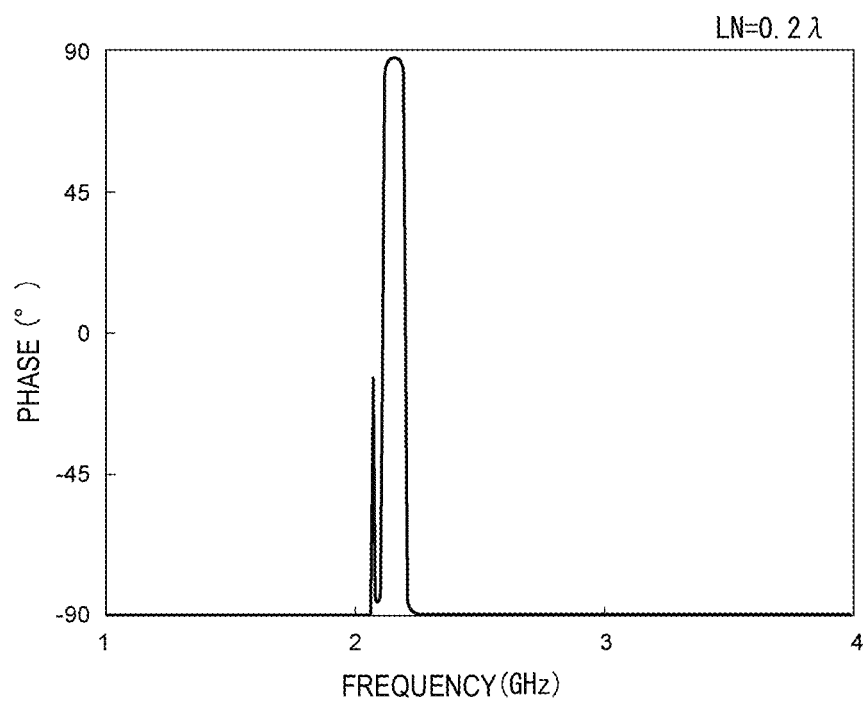
FIG. 69 is a diagram illustrating the phase characteristics when the Euler angle θ is about 30° and the thickness of the LiNbO$_3$ film is about 0.2λ.
Figure 70:
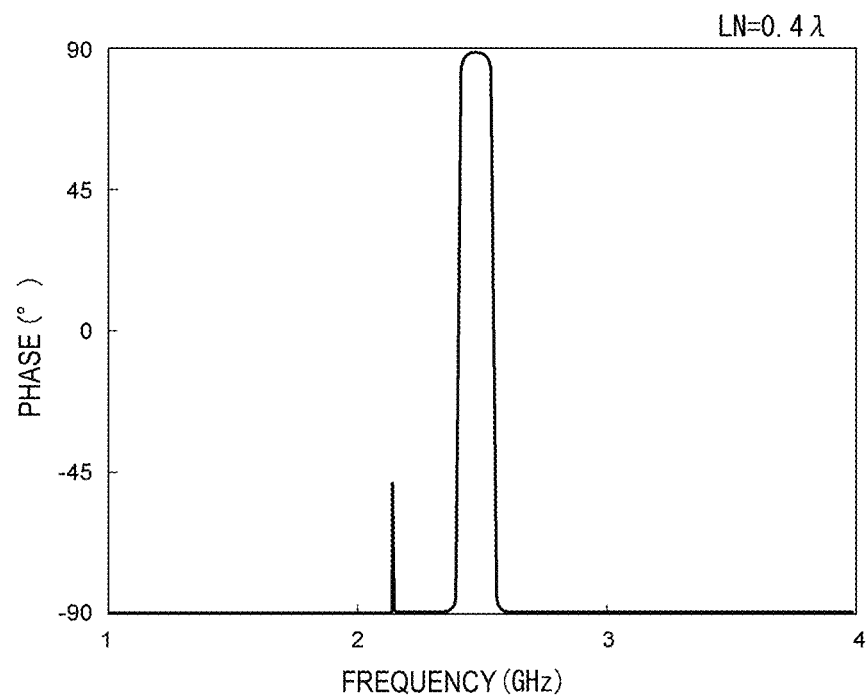
FIG. 70 is a diagram illustrating the phase characteristics when the Euler angle θ is about 30° and the thickness of the LiNbO$_3$ film is about 0.4λ.
Figure 71:
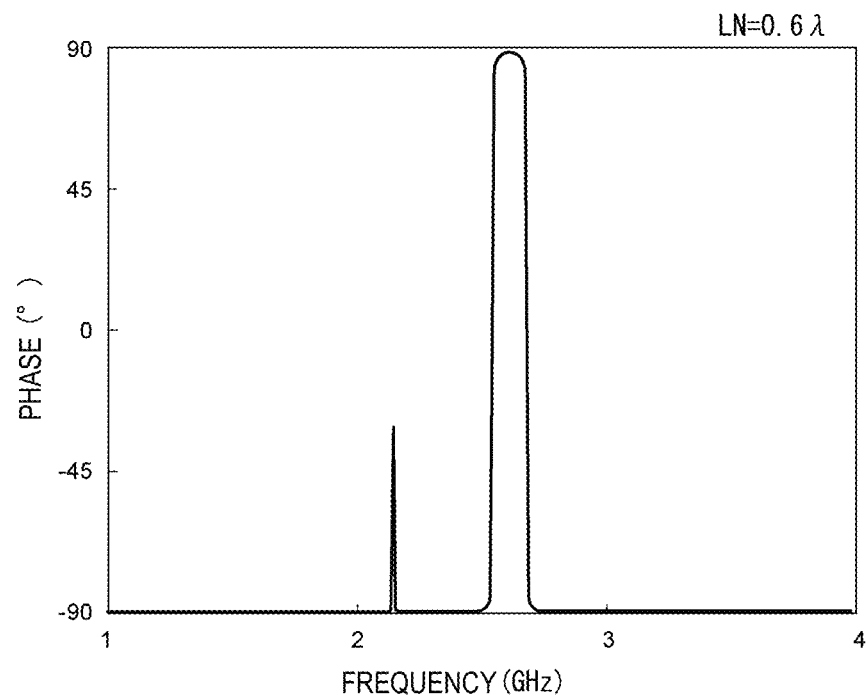
FIG. 71 is a diagram illustrating the phase characteristics when the Euler angle θ is about 30° and the thickness of the LiNbO$_3$ film is about 0.6λ.
Figure 72:
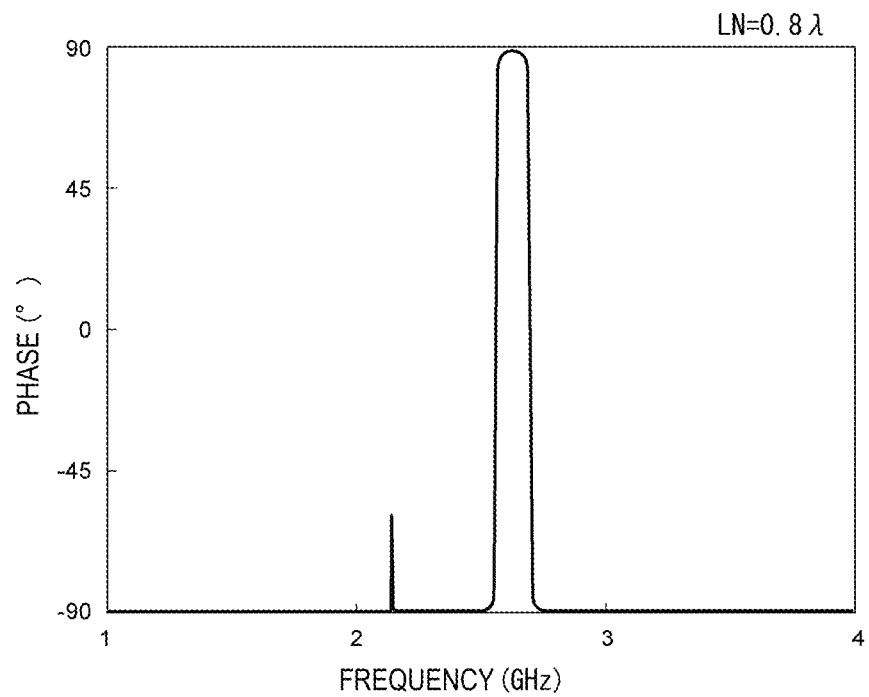
FIG. 72 is a diagram illustrating the phase characteristics when the Euler angle θ is about 30° and the thickness of the LiNbO$_3$ film is about 0.8λ.
Figure 73:
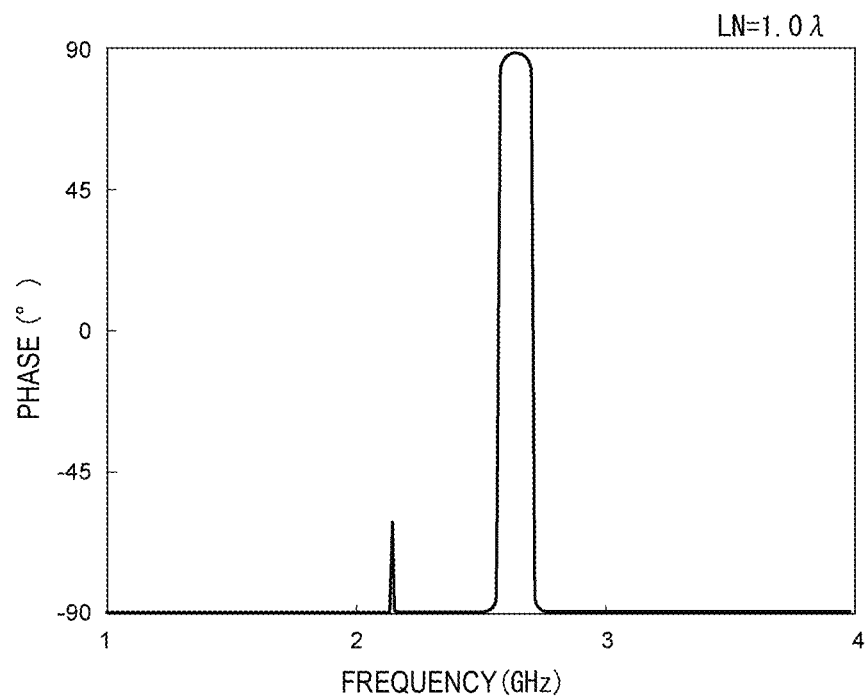
FIG. 73 is a diagram illustrating the phase characteristics when the Euler angle θ is about 30° and the thickness of the LiNbO$_3$ film is about 1.0λ.
Figure 74:
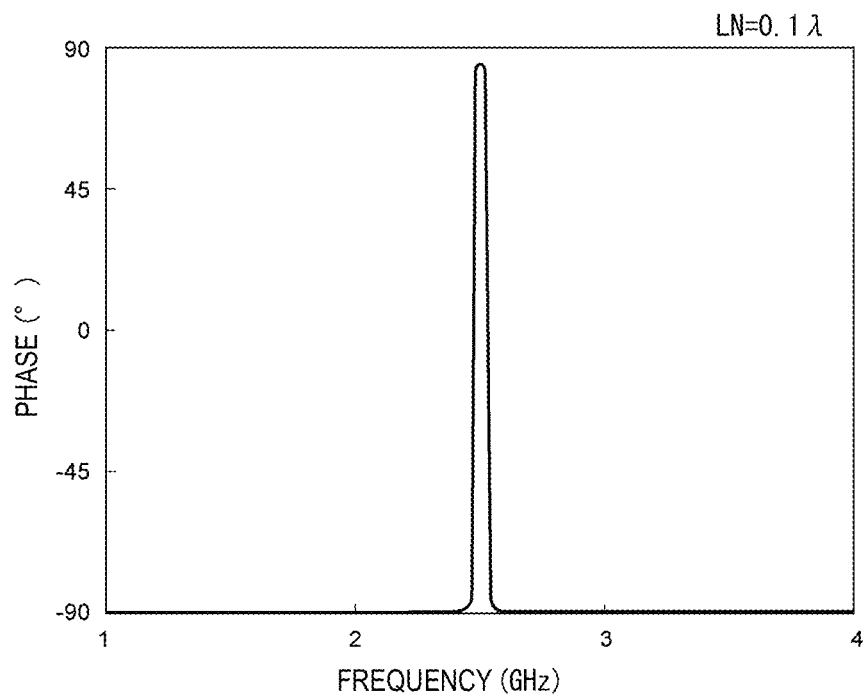
FIG. 74 is a diagram illustrating the phase characteristics when the Euler angle θ is about 34° and the thickness of the LiNbO$_3$ film is about 0.1λ.
Figure 75:
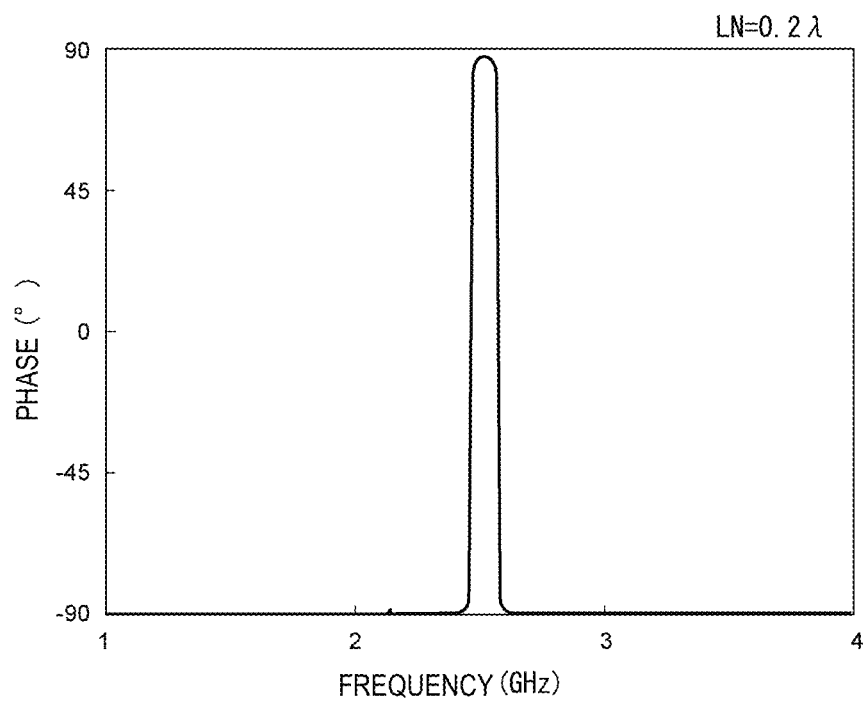
FIG. 75 is a diagram illustrating the phase characteristics when the Euler angle θ is about 34° and the thickness of the LiNbO$_3$ film is about 0.2λ.
Figure 76:
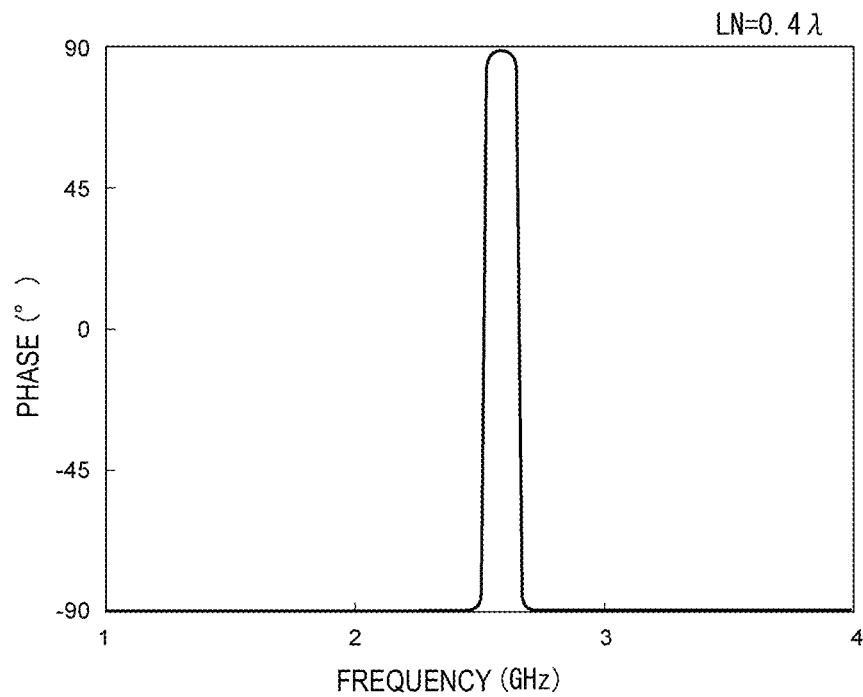
FIG. 76 is a diagram illustrating the phase characteristics when the Euler angle θ is about 34° and the thickness of the LiNbO$_3$ film is about 0.4λ.
Figure 77:
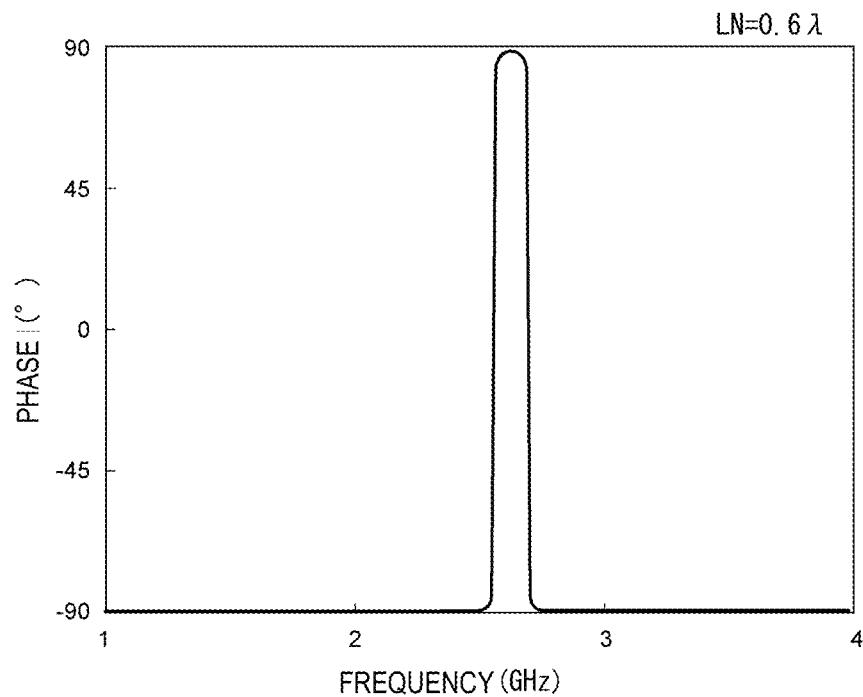
FIG. 77 is a diagram illustrating the phase characteristics when the Euler angle θ is about 34° and the thickness of the LiNbO$_3$ film is about 0.6λ.
Figure 78:
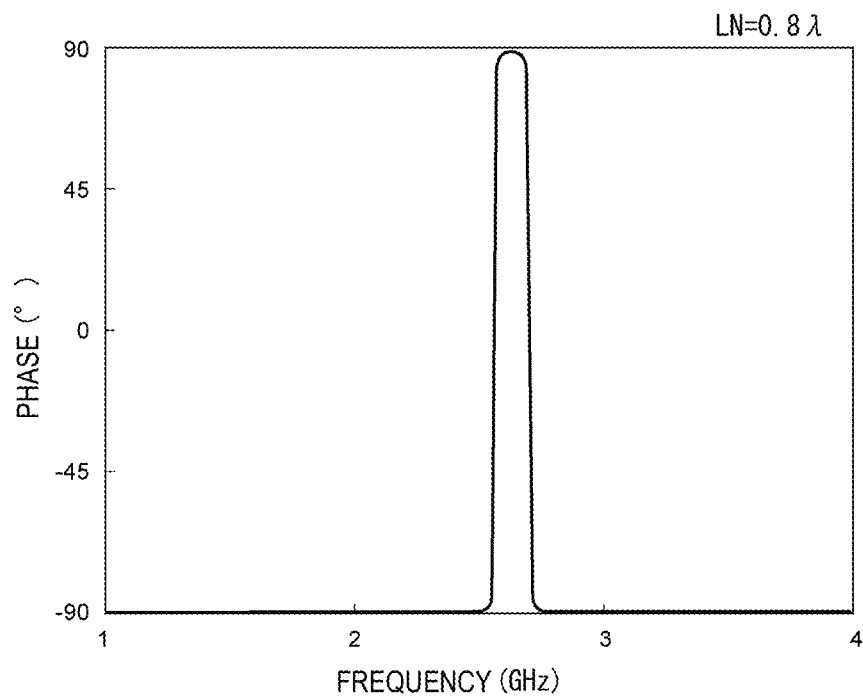
FIG. 78 is a diagram illustrating the phase characteristics when the Euler angle θ is about 34° and the thickness of the LiNbO$_3$ film is about 0.8λ.
Figure 79:
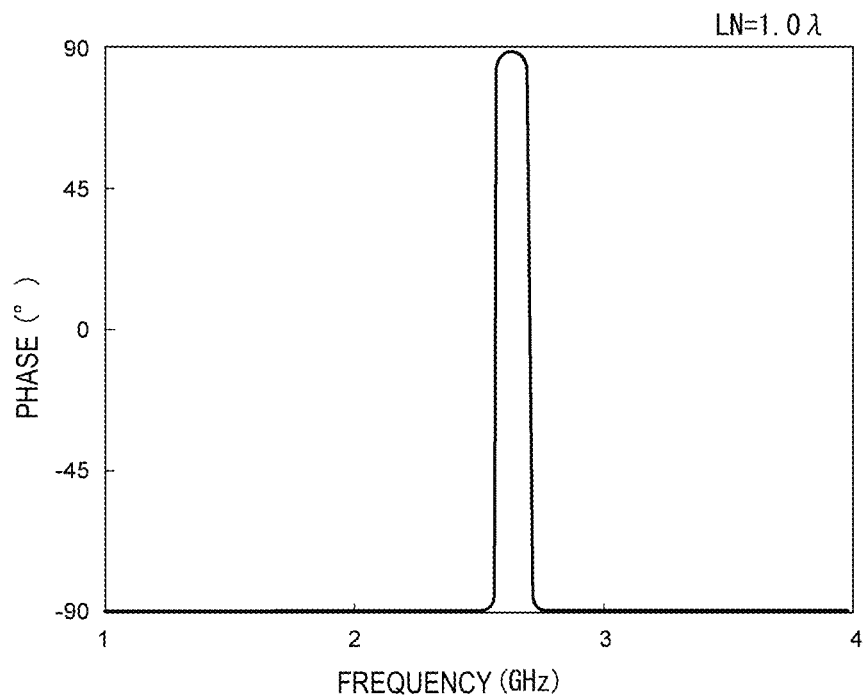
FIG. 79 is a diagram illustrating the phase characteristics when the Euler angle θ is about 34° and the thickness of the LiNbO$_3$ film is about 1.0λ.
Figure 80:
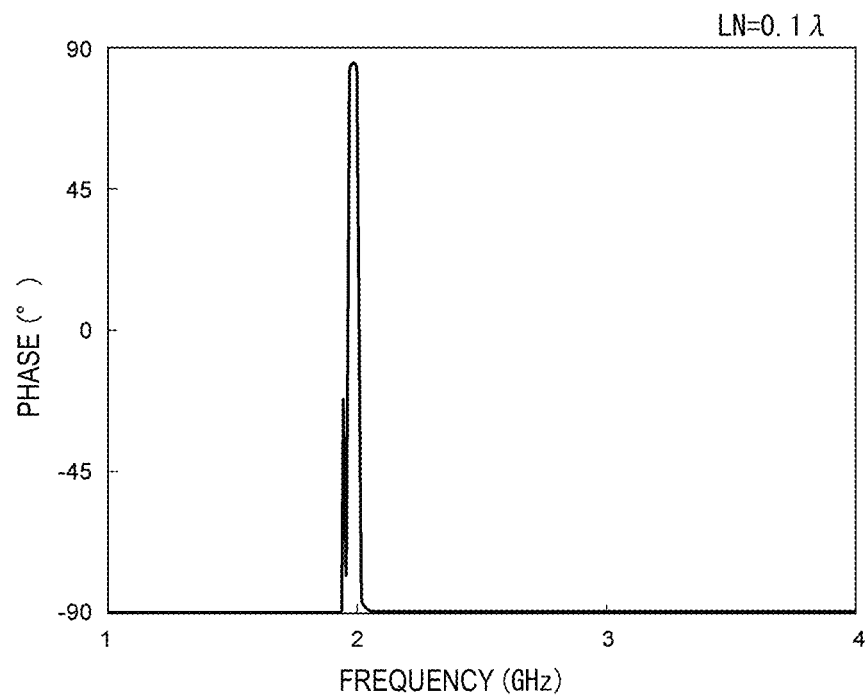
FIG. 80 is a diagram illustrating the phase characteristics when the Euler angle θ is about 38° and the thickness of the LiNbO$_3$ film is about 0.1λ.
Figure 81:
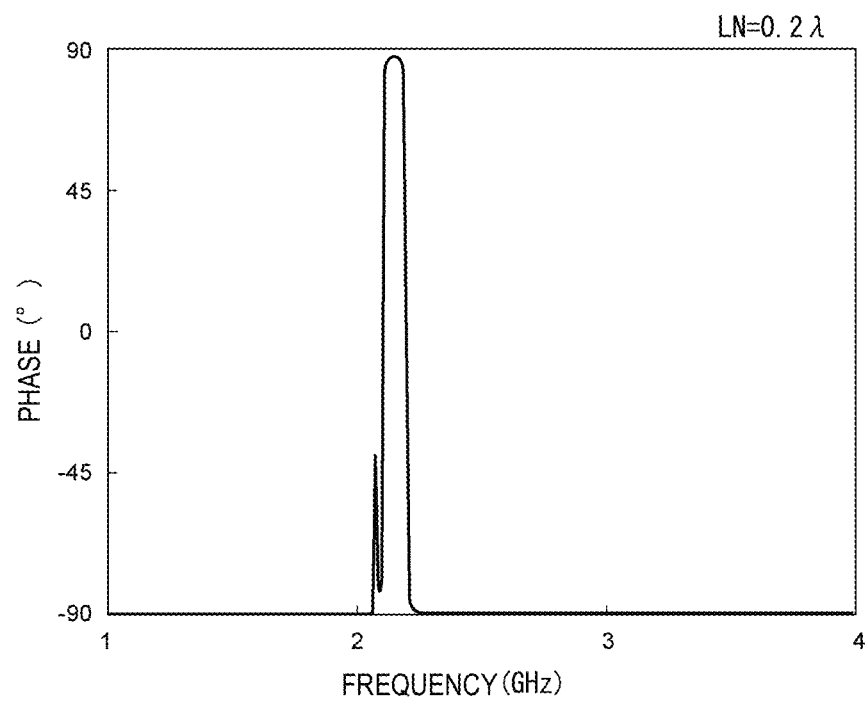
FIG. 81 is a diagram illustrating the phase characteristics when the Euler angle θ is about 38° and the thickness of the LiNbO$_3$ film is about 0.2λ.
Figure 82:
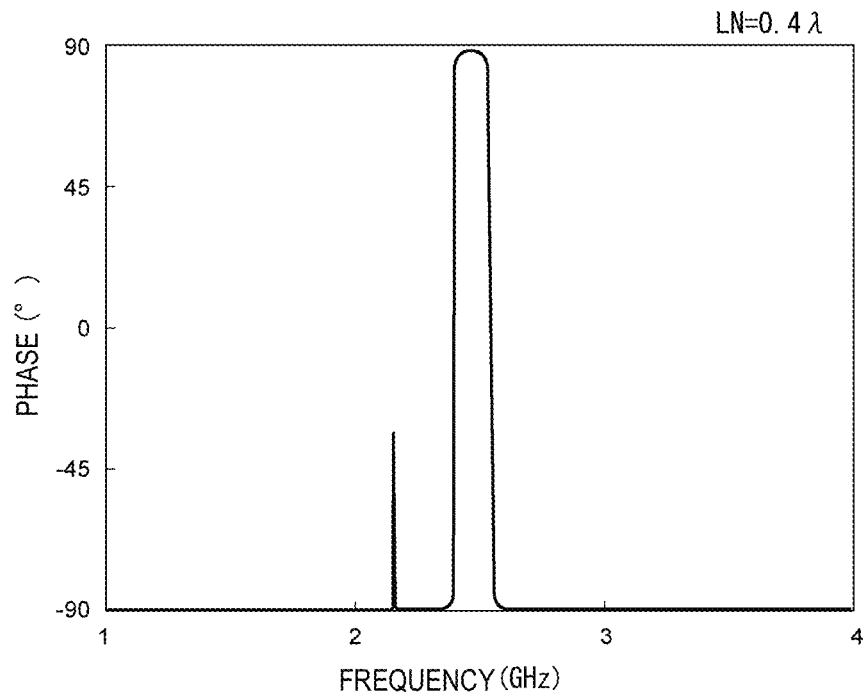
FIG. 82 is a diagram illustrating the phase characteristics when the Euler angle θ is about 38° and the thickness of the LiNbO$_3$ film is about 0.4λ.
Figure 83:
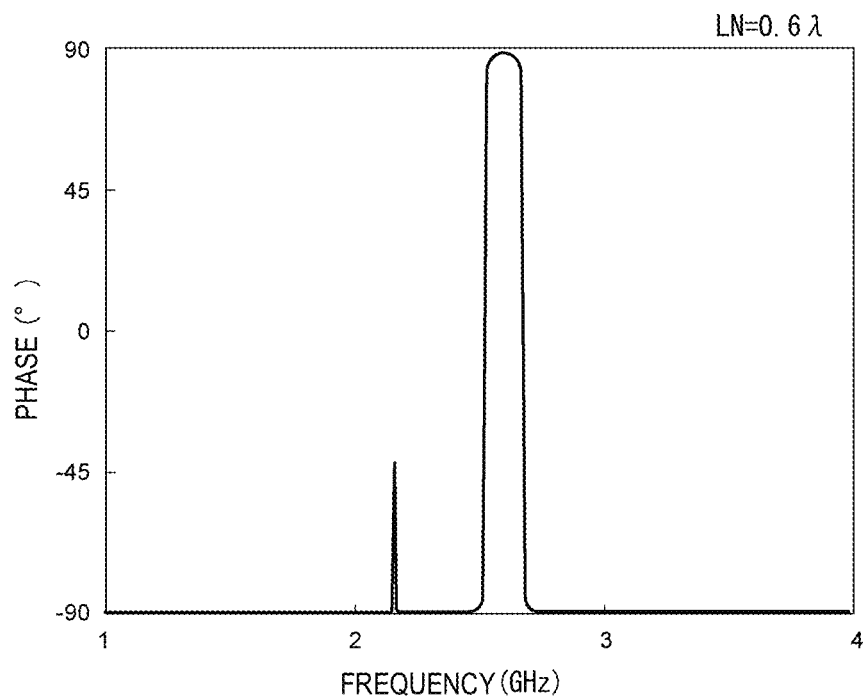
FIG. 83 is a diagram illustrating the phase characteristics when the Euler angle θ is about 38° and the thickness of the LiNbO$_3$ film is about 0.6λ.
Figure 84:
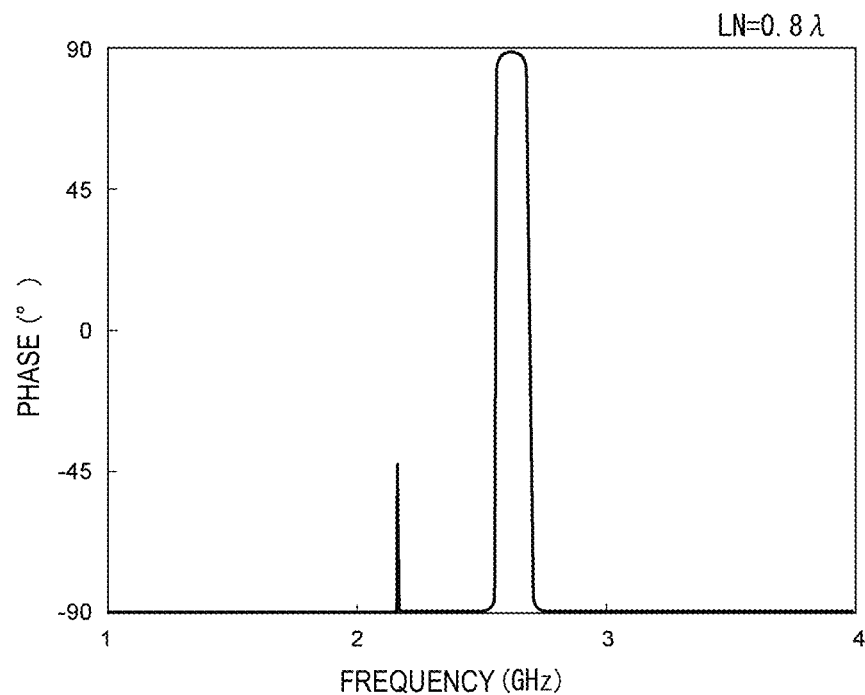
FIG. 84 is a diagram illustrating the phase characteristics when the Euler angle θ is about 38° and the thickness of the LiNbO$_3$ film is about 0.8λ.
Figure 85:
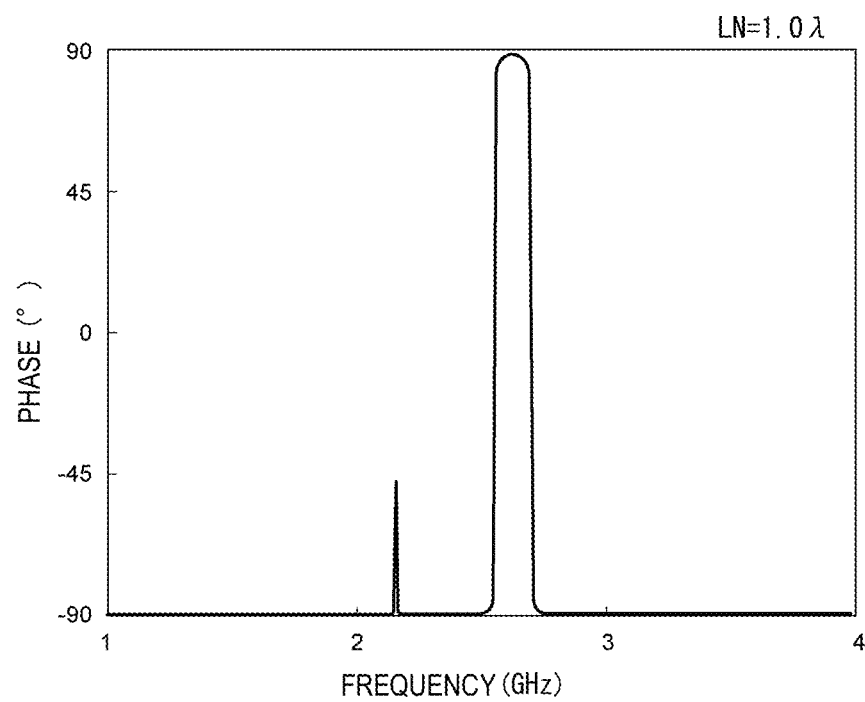
FIG. 85 is a diagram illustrating the phase characteristics when the Euler angle θ is about 38° and the thickness of the LiNbO$_3$ film is about 1.0λ.

FIG. 49 is a schematic sectional view of an acoustic wave device defining a first band pass filter of a multiplexer according to a third preferred embodiment of the present invention. In the multiplexer according to the third preferred embodiment, an acoustic wave device 31 illustrated in FIG. 49 is used as the acoustic wave devices forming the first band pass filter.

As illustrated in FIG. 49, in the acoustic wave device 31, a high-acoustic-velocity material layer 32 is provided between the support substrate 12 and the low-acoustic-velocity material layer 22.

The high-acoustic-velocity material layer 32 is made of a high-acoustic-velocity material in which the acoustic velocity of a bulk wave propagating therein is higher than the acoustic velocity of an acoustic wave propagating along the piezoelectric body 13.

The high-acoustic-velocity material layer 32 confines acoustic waves in the portion where the piezoelectric body 13 and the low-acoustic-velocity material layer 22 are stacked and such that acoustic waves do not leak into the structure that is on the support substrate 12 side of the high-acoustic-velocity material layer 32. In the present preferred embodiment, the high-acoustic-velocity material layer 32 is preferably made of aluminum nitride, for example. As long as acoustic waves are able to be confined, piezoelectric materials such as, for example, DLC films, aluminum nitride, aluminum oxide, silicon carbide, silicon nitride, silicon, sapphire, lithium tantalate, lithium niobate, and quartz, various ceramics such as alumina, zirconia, cordierite, mullite, steatite, and forsterite, magnesia, diamond, a material having any of these materials as a main component, or a material having a mixture of any of these materials as a main component may be used as the material. In addition, a buffer layer may be provided between the support substrate 12 and the high-acoustic-velocity material layer 32. Aluminum nitride, silicon nitride, silicon oxide, titanium oxide, or aluminum oxide, for example, may preferably be used as the buffer layer. The rest of the configuration is preferably the same or substantially the same as in the second preferred embodiment.

In the third preferred embodiment, the acoustic wave device 31 defining the first band pass filter has the above-described configuration, and therefore, spurious responses generated at a higher frequency than the frequency of the main mode are able to be reduced or prevented. Therefore, the characteristics of a second band pass filter having a pass band that is located in a higher frequency band than the first band pass filter are unlikely to be degraded.

In addition, in the third preferred embodiment, the acoustic wave device 31 includes the high-acoustic-velocity material layer 32 and leaking of energy into the support substrate 12 is able to be reduced or prevented, and therefore, acoustic waves are able to be effectively confined to inside piezoelectric body 13.

The multiplexers of the above-described preferred embodiments may be used in a radio-frequency front end circuit or the like. An example of this will be described hereafter.

Figure 86:
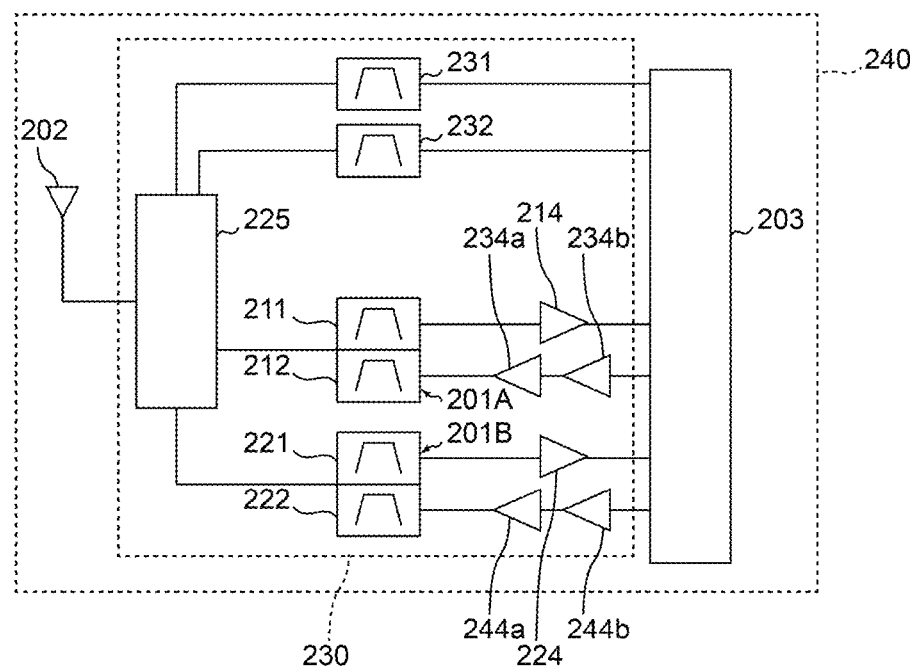
FIG. 86 is a diagram illustrating the configurations of a communication device and a radio-frequency front end circuit according to a preferred embodiment of the present invention.

FIG. 86 is a configuration diagram of a communication device and a radio-frequency front end circuit according to a preferred embodiment of the present invention. In the figure, elements connected to a radio-frequency front end circuit 230, such as an antenna element 202, and an RF signal processing circuit (RFIC) 203, for example, are also illustrated. The radio-frequency front end circuit 230 and the RF signal processing circuit 203 define a communication device 240. The communication device 240 may further include a power source, a CPU, and a display, for example.

The radio-frequency front end circuit 230 preferably includes a switch 225, multiplexers 201A and 201B, filters 231 and 232, low-noise amplifier circuits 214 and 224, and power amplifier circuits 234a, 234b, 244a, and 244b. The radio-frequency front end circuit 230 and the communication device 240 in FIG. 86 are merely examples of a radio-frequency front end circuit and a communication device according to a preferred embodiment of the present invention, and the present invention is not limited to these configurations.

The multiplexer 201A includes filters 211 and 212. The multiplexer 201B includes filters 221 and 222. The multiplexers 201A and 201B are connected to the antenna element 202 via the switch 225. Thus, the multiplexers may be duplexers in which the antenna terminals of two filters are connected so as to form a common connection.

In addition, the above-described multiplexers may also be applied to a multiplexer including three or more filters such as a triplexer in which the antenna terminals of three filters are connected to define a common connection or a hexaplexer in which the antenna terminals of six filters are connected so as to form a common connection.

In other words, the above-described multiplexers may be applied to a duplexer and a multiplexer including three or more filters. In addition, the multiplexers are not limited to having a configuration that includes both a transmission filter and a reception filter, and may instead, have a configuration that includes only a transmission filter or only a reception filter.

The switch 225 connects the antenna element 202 and a signal path corresponding to a prescribed band to each other in accordance with a control signal from a control unit (not illustrated), and is preferably, for example, defined by a single pole double throw (SPDT) switch. In addition, the number of signal paths connected to the antenna element 202 is not limited to one and may be a plurality. In other words, the radio-frequency front end circuit 230 may support carrier aggregation.

The low-noise amplifier circuit 214 is preferably a reception amplification circuit that amplifies a radio-frequency signal (in this case, a radio-frequency reception signal) received via the antenna element 202, the switch 225, and the multiplexer 201A and outputs the amplified signal to the RF signal processing circuit 203. The low-noise amplifier circuit 224 is a reception amplification circuit that amplifies a radio-frequency signal (in this case, a radio-frequency reception signal) received via the antenna element 202, the switch 225, and the multiplexer 201B and outputs the amplified signal to the RF signal processing circuit 203.

The power amplifier circuits 234a and 234b are preferably transmission amplification circuits that amplify a radio-frequency signal (here, radio-frequency transmission signal) output from the RF signal processing circuit 203 and output the amplified radio-frequency signal to the antenna element 202 via the multiplexer 201A and the switch 225. The power amplifier circuits 244a and 244b are transmission amplification circuits that amplify a radio-frequency signal (here, radio-frequency transmission signal) output from the RF signal processing circuit 203 and output the amplified radio-frequency signal to the antenna element 202 via the multiplexer 201B and the switch 225.

The RF signal processing circuit 203 subjects a radio-frequency reception signal input thereto from the antenna element 202 via a reception signal path to signal processing using down conversion, for example, and outputs a reception signal generated through this signal processing. In addition, the RF signal processing circuit 203 subjects an input transmission signal to signal processing using up conversion, for example, and outputs a radio-frequency transmission signal generated through this signal processing to the low-noise amplifier circuit 224. The RF signal processing circuit 203 is preferably an RFIC, for example. The communication device may include a baseband (BB) IC. In this case, the BBIC performs signal processing on a reception signal processed by the RFIC. In addition, the BBIC performs signal processing on a transmission signal and output the resulting signal to the RFIC. A reception signal processed by the BBIC and a transmission signal prior to being processed by the BBIC are image signals or audio signals, for example. The radio-frequency front end circuit 230 may include other circuit elements between the above-described constituent elements.

Furthermore, the radio-frequency front end circuit 230 may include multiplexers according to modifications of the multiplexers 201A and 201B, instead of the multiplexers 201A and 201B.

On the other hand, the filters 231 and 232 of the communication device 240 are connected between the RF signal processing circuit 203 and the switch 225 without the low-noise amplifier circuits 214 and 224 or power amplifier circuits 234a, 234b, 244a, and 244b interposed therebetween. The filters 231 and 232 are also connected to the antenna element 202 via the switch 225 similarly to the multiplexers 201A and 201B.

The radio-frequency front end circuit 230 and communication device 240 are equipped with the multiplexers according to preferred embodiments of the present invention, and consequently the filter characteristics of a band pass filter having a higher frequency band are unlikely to be degraded by the effect of a band pass filter having a lower frequency band.

Multiplexers, radio-frequency front end circuits, and communication devices according to preferred embodiments of the present invention have been described above in the form of preferred embodiments, but other preferred embodiments obtained by combining any of the elements of the above-described preferred embodiments with one another, modifications obtained by modifying the above-described preferred embodiments in various ways, as thought of by a person skilled in the art, without departing from the gist of the present invention, and various devices including a radio-frequency front end circuit and a communication device according to the present invention built thereinto are also included in the present invention.

The present invention may be widely used in communication devices, such as mobile phone devices, for example, in the form of multiplexers, front end circuits, and communication devices that may be applied to multi-band systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal;
a first band pass filter connected to the common terminal and having a first pass band; and
a second band pass filter connected to the common terminal and having a second pass band located at higher frequencies than the first pass band; wherein
the first band pass filter includes an acoustic wave device that includes a support substrate, a piezoelectric body stacked on the support substrate, and an interdigital transducer (IDT) electrode provided on the piezoelectric body;
the piezoelectric body is made of lithium niobate;
the acoustic wave device utilizes Rayleigh waves; and
an acoustic velocity of a bulk wave propagating in the support substrate is higher than an acoustic velocity of an acoustic wave propagating along the piezoelectric body.

2. The multiplexer according to claim 1,
wherein Euler angles ($\varphi$, $\theta$, $\psi$) of the piezoelectric body lie within a range of (0°±5°, $\theta$, 0°±10°), and
the Euler angle $\theta$ lies within a range from about 30° to about 38°.

3. The multiplexer according to claim 1, wherein a film thickness of the piezoelectric body lies within a range from about 0.1$\lambda$ to about 1.0$\lambda$, where $\lambda$ is a wavelength determined by an electrode finger pitch of the IDT electrode.

4. The multiplexer according to claim 1, wherein the IDT electrode is made of at least one selected from a group consisting of Pt, Al, Cu, Mo, and Au and alloys containing any of Pt, Al, Cu, Mo, and Au.

5. The multiplexer according to claim 1, wherein the support substrate is made of aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, diamond, or a material including any one of aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond as a main component.

6. The multiplexer according to claim 1, wherein a thickness of the IDT electrode is greater than or equal to about 0.02$\lambda$, where $\lambda$ is a wavelength determined by an electrode finger pitch of the IDT electrode.

7. The multiplexer according to claim 6, wherein the thickness of the IDT electrode is less than or equal to about 0.1$\lambda$.

8. The multiplexer according to claim 1, where the multiplexer is used in carrier aggregation.

9. A radio-frequency front end circuit comprising:
the multiplexer according to claim 1; and
a power amplifier.

10. A communication device comprising:
the radio-frequency front end circuit according to claim 9; and
an RF signal processing circuit.

11. A multiplexer comprising:
a common terminal;
a first band pass filter connected to the common terminal and having a first pass band; and
a second band pass filter connected to the common terminal and having a second pass band located at higher frequencies than the first pass band; wherein
the first band pass filter includes an acoustic wave device that includes a support substrate, a piezoelectric body stacked on the support substrate, an interdigital transducer (IDT) electrode provided on the piezoelectric body, and a low-acoustic-velocity material layer provided between the support substrate and the piezoelectric body;
the piezoelectric body is made of lithium niobate;
the acoustic wave device utilizes Rayleigh waves; and
the low-acoustic-velocity material layer is made of a low-acoustic-velocity material in which an acoustic velocity of a bulk wave propagating therein is lower than an acoustic velocity of an acoustic wave propagating along the piezoelectric body.

12. The multiplexer according to claim 11, further comprising:
a high-acoustic-velocity material layer provided between the support substrate and the low-acoustic-velocity material and in which an acoustic velocity of a bulk wave propagating therein is higher than an acoustic velocity of an acoustic wave propagating along the piezoelectric body.

13. The multiplexer according to claim 11,
wherein Euler angles ($\varphi$, $\theta$, $\psi$) of the piezoelectric body lie within a range of (0°±5°, $\theta$, 0°±10°), and
the Euler angle $\theta$ lies within a range from about 30° to about 38°.

14. The multiplexer according to claim 11, wherein a film thickness of the piezoelectric body lies within a range from about 0.1$\lambda$ to about 1.0$\lambda$, where $\lambda$ is a wavelength determined by an electrode finger pitch of the IDT electrode.

15. The multiplexer according to claim 11, wherein the IDT electrode is made of at least one selected from a group consisting of Pt, Al, Cu, Mo, and Au and alloys containing any of Pt, Al, Cu, Mo, and Au.

16. The multiplexer according to claim 11, wherein the support substrate is made of aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, diamond, or a material including any one of aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond as a main component.

17. The multiplexer according to claim 11, wherein a thickness of the IDT electrode is greater than or equal to about $0.02\lambda$, where $\lambda$ is a wavelength determined by an electrode finger pitch of the IDT electrode.

18. The multiplexer according to claim 17, wherein the thickness of the IDT electrode is less than or equal to about $0.1\lambda$.

19. The multiplexer according to claim 11, where the multiplexer is used in carrier aggregation.

20. A radio-frequency front end circuit comprising:
   the multiplexer according to claim 11; and
   a power amplifier.

21. A communication device comprising:
   the radio-frequency front end circuit according to claim 20; and
   an RF signal processing circuit.

* * * * *